US010171090B2

(12) United States Patent
Okubo

(10) Patent No.: US 10,171,090 B2
(45) Date of Patent: Jan. 1, 2019

(54) OSCILLATOR, ELECTRONIC APPARATUS, AND MOVING OBJECT

(71) Applicant: SEIKO EPSON CORPORATION, Tokyo (JP)

(72) Inventor: Masaaki Okubo, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 2 days.

(21) Appl. No.: 15/071,543

(22) Filed: Mar. 16, 2016

(65) Prior Publication Data

US 2016/0285461 A1 Sep. 29, 2016

(30) Foreign Application Priority Data

Mar. 27, 2015 (JP) ................................ 2015-066968
Mar. 27, 2015 (JP) ................................ 2015-067451
Mar. 27, 2015 (JP) ................................ 2015-067452

(51) Int. Cl.
*H03L 1/00* (2006.01)
*H03L 1/02* (2006.01)
*H03B 5/04* (2006.01)
*H03L 1/04* (2006.01)

(52) U.S. Cl.
CPC ............... *H03L 1/028* (2013.01); *H03B 5/04* (2013.01); *H03L 1/00* (2013.01); *H03L 1/023* (2013.01); *H03L 1/025* (2013.01); *H03L 1/04* (2013.01)

(58) Field of Classification Search
CPC .. H03B 5/04; H03L 1/025; H03L 1/04; H03L 1/028; H03L 1/00; H03L 1/023
USPC ................ 331/176, 158, 116 FE, 177 V, 183
See application file for complete search history.

(56) References Cited

U.S. PATENT DOCUMENTS 4,893,097 A * 1/1990 Zwack .................... H03L 1/025 331/176
6,229,404 B1 * 5/2001 Hatanaka ................. H03B 5/04 257/698
7,782,147 B2 * 8/2010 Anderson ................. H03L 1/04 331/158
7,821,346 B2 * 10/2010 McCracken ............ H03L 1/028 310/315
8,754,718 B2 * 6/2014 Horie ..................... H02N 2/001 331/158
2006/0192626 A1 * 8/2006 Milliren .................. H03B 5/04 331/158

FOREIGN PATENT DOCUMENTS

JP 2011-101212 A 5/2011

* cited by examiner

*Primary Examiner* — Arnold Kinkead
(74) *Attorney, Agent, or Firm* — Oliff PLC

(57) ABSTRACT

An oscillator includes a vibrator element, a container in which the vibrator element is housed, at least one of a heating element and a cooling body configured to control the temperature on the inside of the container, an oscillation circuit electrically connected to the vibrator element, a D/A conversion circuit configured to control a frequency output by the oscillation circuit, and a reference-voltage generation circuit configured to supply a voltage to the D/A conversion circuit. The reference-voltage generation circuit is mounted on the inside of the container or on a substrate on which the container is mounted.

20 Claims, 56 Drawing Sheets

5 D/A CONVERSION IC
101 OSCILLATOR
6 IC FOR OSCILLATION
SERIAL I/F CIRCUIT 90
SERIAL I/F CIRCUIT 92
100
STORING UNIT
80 D/A CONVERSION CIRCUIT
70 REFERENCE-VOLTAGE GENERATION CIRCUIT
VDH VDL VCC
10 TEMPERATURE COMPENSATION CIRCUIT
13 THERMOSENSITIVE ELEMENT
VREF1
72 REFERENCE-VOLTAGE GENERATION CIRCUIT
VCC
VA 32 VO VREF2
TC VARIABLE CAPACITANCE ELEMENT 7
VC VARIABLE CAPACITANCE ELEMENT 8
CIRCUIT FOR OSCILLATION
HEAT-GENERATION CONTROL CIRCUIT 60
50
30 OSCILLATION CIRCUIT
20
40 HEAT GENERATING BODY
THERMOSENSITIVE ELEMENT

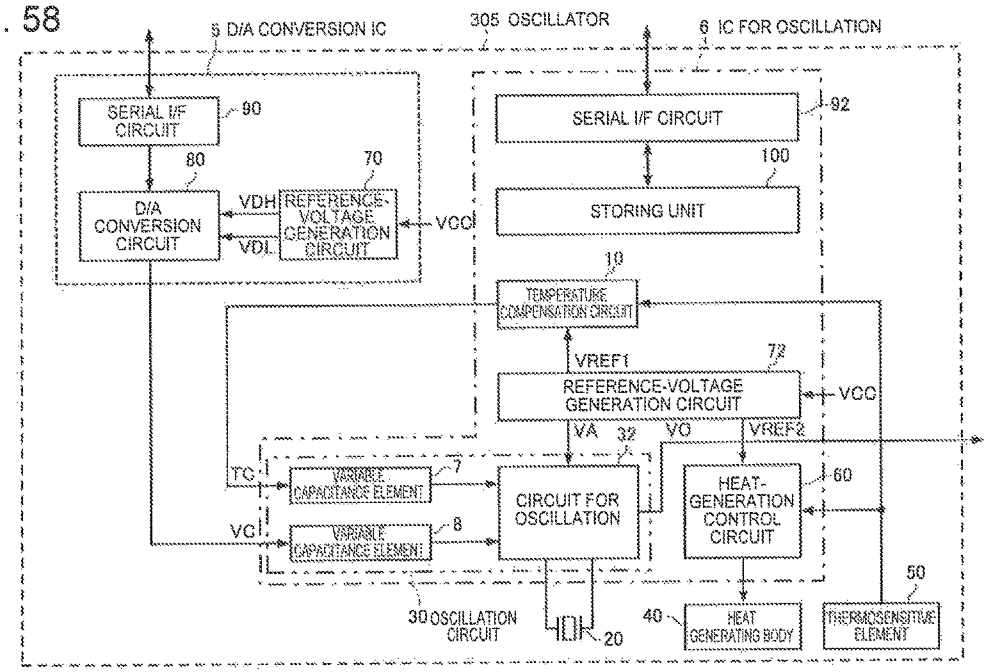
FIG. 58
5 D/A CONVERSION IC
305 OSCILLATOR
6 IC FOR OSCILLATION
SERIAL I/F CIRCUIT
90
80
70
D/A CONVERSION CIRCUIT
VDH
VDL
REFERENCE-VOLTAGE GENERATION CIRCUIT
VCC
SERIAL I/F CIRCUIT
92
100
STORING UNIT
10
TEMPERATURE COMPENSATION CIRCUIT
VREF1
72
REFERENCE-VOLTAGE GENERATION CIRCUIT
VCC
VA
32
VO
VREF2
TC
VARIABLE CAPACITANCE ELEMENT
7
VC
VARIABLE CAPACITANCE ELEMENT
8
CIRCUIT FOR OSCILLATION
HEAT-GENERATION CONTROL CIRCUIT
60
50
30 OSCILLATION CIRCUIT
20
40
HEAT GENERATING BODY
THERMOSENSITIVE ELEMENT

OSCILLATOR, ELECTRONIC APPARATUS, AND MOVING OBJECT

BACKGROUND

1. Technical Field

The present invention relates to an oscillator, an electronic apparatus, and a moving object.

2. Related Art

A crystal oscillator used in a reference frequency signal source of a communication apparatus, a measuring instrument, and the like is requested to have a stable output frequency at high accuracy with respect to a temperature change. In general, as a crystal oscillator that can obtain extremely high frequency stability among crystal oscillators, an oven controlled crystal oscillator (OCXO) is known. Further, in recent years, improvement of characteristics of a temperature compensated crystal oscillator is remarkable. A temperature compensated crystal oscillator (TCXO) having frequency accuracy and frequency stability close to those of the OCXO is being developed.

Such an oscillator having high accuracy is used in, for example, a cellular phone base station. The oscillator is sometimes requested to be capable of controlling a frequency according to digital control. JP-A-2011-101212 (Patent Literature 1) discloses a piezoelectric oscillator including a D/A converter, a vibrator, and an oscillation loop circuit. The piezoelectric oscillator changes an input signal to the D/A converter to thereby change a frequency output from the piezoelectric oscillator.

However, in the oscillator described in Patent Literature 1, an output voltage of a reference-voltage generation circuit, which supplies a voltage to the D/A converter, fluctuates because of a change in an ambient temperature (an outside temperature) of the oscillator. FIG. 77 is a graph showing an example of a temperature characteristic (a relation between an output voltage and temperature) of a regulator configuring the reference-voltage generation circuit. As shown in FIG. 77, the output voltage of the regulator greatly fluctuates because of the temperature thereof. In the oscillator explained above, if the temperature of the reference-voltage generation circuit fluctuates due to the change in the ambient temperature of the oscillator and the output voltage of the reference-voltage generation circuit greatly fluctuates, even if a DAC control code (digital data) input to the D/A converter is the same, an output voltage of the D/A converter fluctuates. As a result, the frequency output by the oscillator fluctuates.

SUMMARY

An advantage of some aspects of the invention is to provide an oscillator that can reduce fluctuation in an output voltage of a reference-voltage generation circuit due to a change in an ambient temperature. Another advantage of some aspects of the invention is to provide an electronic apparatus and a moving object including the oscillator.

The invention can be implemented as the following forms or application examples.

Application Example 1

An oscillator according to this application example includes: a vibrator element; a container in which the vibrator element is housed; at least one of a heating element and a cooling body configured to control the temperature on the inside of the container; an oscillation circuit electrically connected to the vibrator element; a D/A conversion circuit configured to control a frequency output by the oscillation circuit; and a reference-voltage generation circuit configured to supply a voltage to the D/A conversion circuit. The reference-voltage generation circuit is housed on the inside of the container.

The oscillation circuit may be a part or all of various oscillation circuits such as a Pierce oscillation circuit, an inverter-type oscillation circuit, a Colpitts oscillation circuit, and a Hartley oscillation circuit.

In such an oscillator, since the reference-voltage generation circuit is housed on the inside of the container, for example, compared with when the reference-voltage generation circuit is disposed on the outside of the container, a temperature change of the reference-voltage generation circuit due to a change in an ambient temperature of the oscillator is small. Therefore, with the oscillator, it is possible to reduce fluctuation in an output voltage of the reference-voltage generation circuit due to the change in the ambient temperature. Consequently, it is possible to reduce fluctuation in an output voltage of the D/A conversion circuit due to the fluctuation in the output voltage of the reference-voltage generation circuit. It is possible to improve stability of the frequency (an output frequency) of the oscillator.

Application Example 2

An oscillator according to this application example includes: a vibrator element; a container in which the vibrator element is housed; at least one of a heating element and a cooling body configured to control the temperature on the inside of the container; a first substrate on which the container is mounted via a first supporting body; a second substrate on which the first substrate is mounted via a second supporting body; an oscillation circuit electrically connected to the vibrator element; a D/A conversion circuit configured to control a frequency output by the oscillation circuit; and a reference-voltage generation circuit configured to supply a voltage to the D/A conversion circuit. The reference-voltage generation circuit is mounted on the first substrate.

The oscillation circuit may be a part or all of various oscillation circuits such as a Pierce oscillation circuit, an inverter-type oscillation circuit, a Colpitts oscillation circuit, and a Hartley oscillation circuit.

In such an oscillator, since the reference-voltage generation circuit is mounted on the first substrate, for example, compared with when the reference-voltage generation circuit is mounted on the second substrate, a temperature change of the reference-voltage generation circuit due to a change in an ambient temperature of the oscillator is small. Therefore, with the oscillator, it is possible to reduce fluctuation in an output voltage of the reference-voltage generation circuit due to the change in the ambient temperature. Consequently, it is possible to reduce fluctuation in an output voltage of the D/A conversion circuit due to the fluctuation in the output voltage of the reference-voltage generation circuit. It is possible to improve stability of the frequency (an output frequency) of the oscillator.

Application Example 3

An oscillator according to this application example includes: a vibrator element; a container in which the vibrator element is housed; a first substrate on which the container is mounted; at least one of a heating element and a cooling body disposed on the first substrate and configured to control the temperature on the inside of the container; a second substrate on which the first substrate is mounted via a supporting body; an oscillation circuit electrically connected to the vibrator element; a D/A conversion circuit configured to control a frequency output by the oscillation circuit; and a reference-voltage generation circuit configured to supply a voltage to the D/A conversion circuit. The reference-voltage generation circuit is mounted on the first substrate.

The oscillation circuit may be a part or all of various oscillation circuits such as a Pierce oscillation circuit, an inverter-type oscillation circuit, a Colpitts oscillation circuit, and a Hartley oscillation circuit.

In such an oscillator, since the reference-voltage generation circuit is mounted on the first substrate on which at least one of the heating element and the cooling body is disposed, for example, compared with when the reference-voltage generation circuit is mounted on the second substrate, a temperature change of the reference-voltage generation circuit due to a change in an ambient temperature of the oscillator is small. Therefore, with the oscillator, it is possible to reduce fluctuation in an output voltage of the reference-voltage generation circuit due to the change in the ambient temperature. Consequently, it is possible to reduce fluctuation in an output voltage of the D/A conversion circuit due to the fluctuation in the output voltage of the reference-voltage generation circuit. It is possible to improve stability of the frequency (an output frequency) of the oscillator.

Further, in such an oscillator, since the container is mounted on the first substrate, for example, compared with when the container is mounted on the first substrate via a supporting body, it is possible to efficiently heat or cool the container with at least one of the heating element and the cooling body. Therefore, in the oscillator, it is possible to achieve a reduction in power consumption.

Application Example 4

In the oscillator according to the application example 2, at least one of the heating element and the cooling body may be disposed on the outer surface of the container opposed to the first substrate.

In such an oscillator, it is possible to set at least one of the heating element and the cooling body and the reference-voltage generation circuit close to each other. Further, when the heating element is disposed on the outer surface of the container, it is possible to heat the reference-voltage generation circuit with radiant heat radiated from the heating element. Consequently, it is possible to further reduce the temperature change of the reference-voltage generation circuit due to the change in the ambient temperature of the oscillator. It is possible to reduce the fluctuation in the output voltage of the reference-voltage generation circuit due to the change in the ambient temperature.

Application Example 5

In the oscillator according to the application example 1, the heating element may be a heater.

In such an oscillator, it is possible to reduce the fluctuation in the output voltage of the reference-voltage generation circuit due to the change in the ambient temperature.

Application Example 6

In the oscillator according to the application example 1, the cooling body may be a Peltier element.

In such an oscillator, it is possible to reduce the fluctuation in the output voltage of the reference-voltage generation circuit due to the change in the ambient temperature.

Application Example 7

In the oscillator according to the application example 1, the oscillation circuit may include: a circuit for oscillation configured by a semiconductor element; and an electronic component, and the semiconductor element may be housed on the inside of the container.

In such an oscillator, since the reference-voltage generation circuit and the circuit for oscillation are housed on the inside of the container, for example, compared with when the reference-voltage generation circuit and the circuit for oscillation are disposed on the outside of the container, the temperature change of the reference-voltage generation circuit and a temperature change of the circuit for oscillation due to the change in the ambient temperature of the oscillator are small. Therefore, with the oscillator, it is possible to reduce the fluctuation in the output voltage of the reference-voltage generation circuit and fluctuation in an output voltage of the circuit for oscillation due to the change in the ambient temperature. Consequently, it is possible to further improve the stability of the frequency of the oscillator.

Application Example 8

In the oscillator according to the application example 2, the oscillation circuit may include: a circuit for oscillation configured by a semiconductor element; and an electronic component, and the semiconductor element may be mounted on the first substrate.

In such an oscillator, since the reference-voltage generation circuit and the circuit for oscillation are mounted on the first substrate, for example, compared with when the reference-voltage generation circuit and the circuit for oscillation are mounted on the second substrate, the temperature change of the reference-voltage generation circuit and a temperature change of the circuit for oscillation due to the change in the ambient temperature of the oscillator are small. Therefore, with the oscillator, it is possible to reduce the fluctuation in the output voltage of the reference-voltage generation circuit and fluctuation in an output voltage of the circuit for oscillation due to the change in the ambient temperature. Consequently, it is possible to further improve the stability of the frequency of the oscillator.

Application Example 9

In the oscillator according to the application example 3, the oscillation circuit may include: a circuit for oscillation configured by a semiconductor element; and an electronic component, and the semiconductor element may be mounted on the first substrate.

In such an oscillator, since the reference-voltage generation circuit and the circuit for oscillation are mounted on the first substrate, for example, compared with when the reference-voltage generation circuit and the circuit for oscillation are mounted on the second substrate, the temperature change of the reference-voltage generation circuit and a temperature change of the circuit for oscillation due to the change in the ambient temperature of the oscillator are small. Therefore, with the oscillator, it is possible to reduce the fluctuation in the output voltage of the reference-voltage generation circuit and fluctuation in an output voltage of the circuit for oscillation due to the change in the ambient temperature.

Consequently, it is possible to further improve the stability of the frequency of the oscillator.

Application Example 10

In the oscillator according to the application example 1, the oscillation circuit may be configured by a semiconductor element, and the semiconductor element may be housed on the inside of the container.

In such an oscillator, since the reference-voltage generation circuit and the oscillation circuit are housed on the inside of the container, for example, compared with when the reference-voltage generation circuit and the oscillation circuit are disposed on the outside of the container, the temperature change of the reference-voltage generation circuit and a temperature change of the oscillation circuit due to the change in the ambient temperature of the oscillator are small. Therefore, with such an oscillator, it is possible to reduce the fluctuation in the output voltage of the reference-voltage generation circuit and fluctuation in an output voltage of the oscillation circuit due to the change in the ambient temperature. Consequently, it is possible to further improve the stability of the frequency of the oscillator.

Application Example 11

In the oscillator according to the application example 1, the oscillator may further include a thermosensitive element configured to detect the temperature on the inside of the container.

In such an oscillator, it is possible to reduce the fluctuation in the output voltage of the reference-voltage generation circuit due to the change in the ambient temperature.

Application Example 12

In the oscillator according to the application example 2, the oscillator may further include a thermosensitive element disposed on the outer surface of the container.

In such an oscillator, it is possible to reduce the fluctuation in the output voltage of the reference-voltage generation circuit due to the change in the ambient temperature.

Application Example 13

In the oscillator according to the application example 3, the oscillator may further include a thermosensitive element disposed on the first substrate.

In such an oscillator, it is possible to reduce the fluctuation in the output voltage of the reference-voltage generation circuit due to the change in the ambient temperature.

Application Example 14

In the oscillator according to the application example 1, the D/A conversion circuit may be housed on the inside of the container.

In such an oscillator, since the reference-voltage generation circuit and the D/A conversion circuit are housed on the inside of the container, for example, compared with when the reference-voltage generation circuit and the D/A conversion circuit are disposed on the outside of the container, the temperature change of the reference-voltage generation circuit and a temperature change of the D/A conversion circuit due to the change in the ambient temperature of the oscillator are small. Therefore, with the oscillator, it is possible to reduce the fluctuation in the output voltage of the reference-voltage generation circuit and the fluctuation in the output voltage of the D/A conversion circuit due to the change in the ambient temperature. Consequently, it is possible to further improve the stability of the frequency of the oscillator.

Application Example 15

In the oscillator according to the application example 2, the D/A conversion circuit may be mounted on the first substrate.

In such an oscillator, since the reference-voltage generation circuit and the D/A conversion circuit are mounted on the first substrate, for example, compared with when the reference-voltage generation circuit and the D/A conversion circuit are mounted on the second substrate, the temperature change of the reference-voltage generation circuit and a temperature change of the D/A conversion circuit due to the change in the ambient temperature of the oscillator are small. Therefore, with the oscillator, it is possible to reduce the fluctuation in the output voltage of the reference-voltage generation circuit and the fluctuation in the output voltage of the D/A conversion circuit due to the change in the ambient temperature. Consequently, it is possible to further improve the stability of the frequency of the oscillator.

Application Example 16

In the oscillator according to the application example 3, the D/A conversion circuit may be mounted on the first substrate.

In such an oscillator, since the reference-voltage generation circuit and the oscillator are mounted on the first substrate, for example, compared with when the reference-voltage generation circuit and the oscillation circuit are mounted on the second substrate, the temperature change of the reference-voltage generation circuit and a temperature change of the oscillation circuit due to the change in the ambient temperature of the oscillator are small. Therefore, with the oscillator, it is possible to reduce the fluctuation in the output voltage of the reference-voltage generation circuit and fluctuation in an output voltage of the oscillation circuit due to the change in the ambient temperature. Consequently, it is possible to further improve the stability of the frequency of the oscillator.

Application Example 17

In the oscillator according to this application example 16, the reference-voltage generation circuit and the D/A conversion circuit may be configured by one semiconductor element.

In such an oscillator, for example, it is possible to achieve a reduction in manufacturing costs and a reduction in size.

Application Example 18

An electronic apparatus according to this application example includes the oscillator according to any of the application example described above.

The electronic apparatus according to this application example includes the oscillator capable of reducing the fluctuation in the output voltage of the reference-voltage generation circuit due to the change in the ambient temperature and improving frequency stability. Therefore, for example, it is possible to realize the electronic apparatus having high reliability.

Application Example 19

A moving object according to this application example includes the oscillator according to any of the application examples described above.

The moving object according to this application example includes the oscillator capable of reducing the fluctuation in the output voltage of the reference-voltage generation circuit due to the change in the ambient temperature and improving frequency stability. Therefore, for example, it is possible to realize the moving object having high reliability.

BRIEF DESCRIPTION OF THE DRAWINGS

The invention will be described with reference to the accompanying drawings, wherein like numbers reference like elements.

FIG. 58 is a functional block diagram of an oscillator according to an eighteenth embodiment.

DESCRIPTION OF EXEMPLARY EMBODIMENTS

Preferred embodiments of the invention are explained in detail below with reference to the drawings. Note that the embodiments explained below do not unduly limit the contents of the invention described in the appended claims. Not all of components explained below are always essential constituent elements of the invention.

1. Oscillator

1-1. First Embodiment

Figure 1:
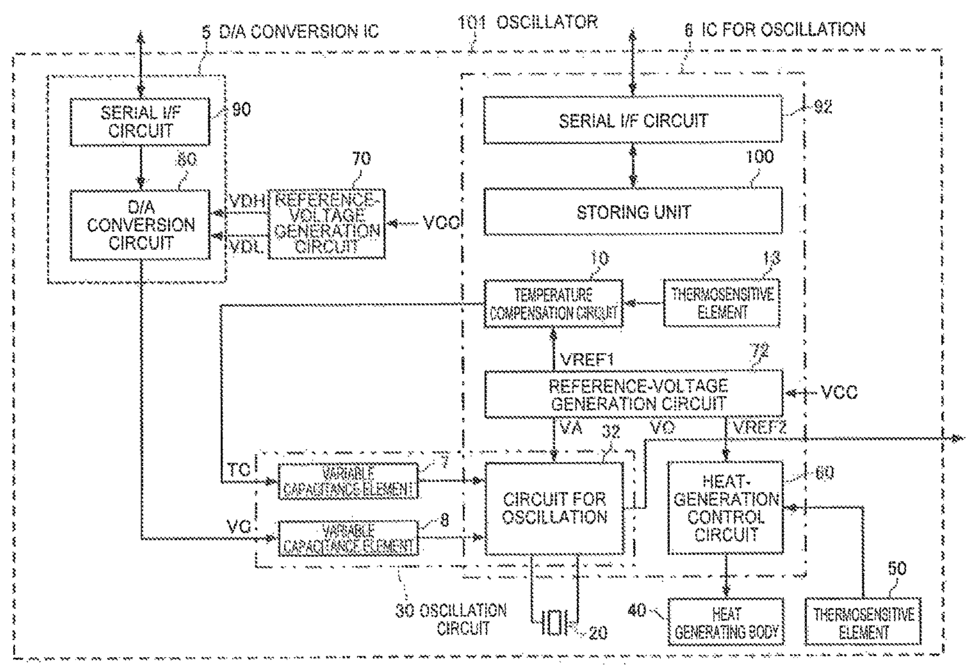
FIG. 1 is a functional block diagram of an oscillator according to a first embodiment.
Figure 2:
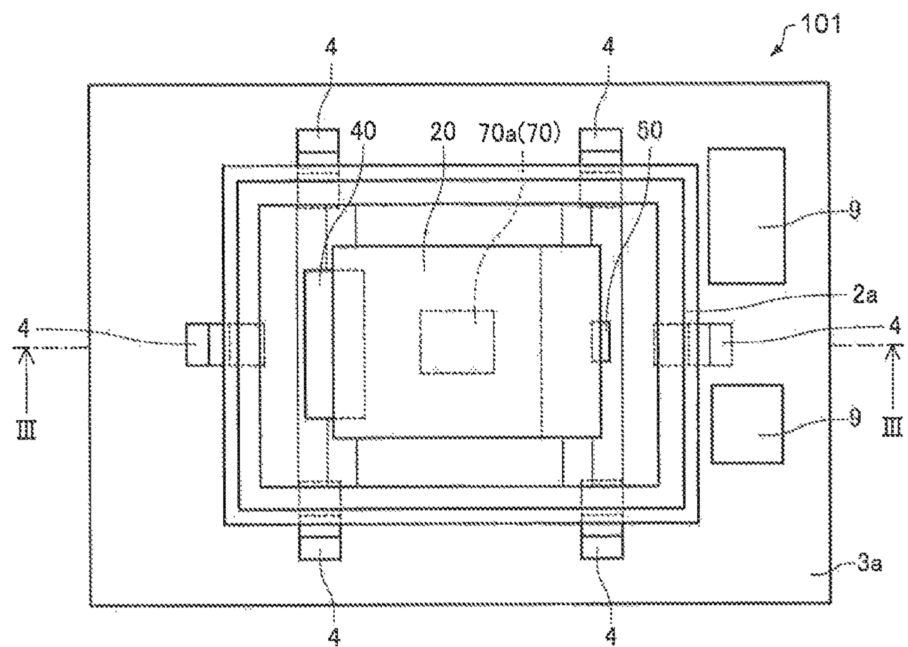
FIG. 2 is a plan view schematically showing the oscillator according to the first embodiment.
Figure 3:
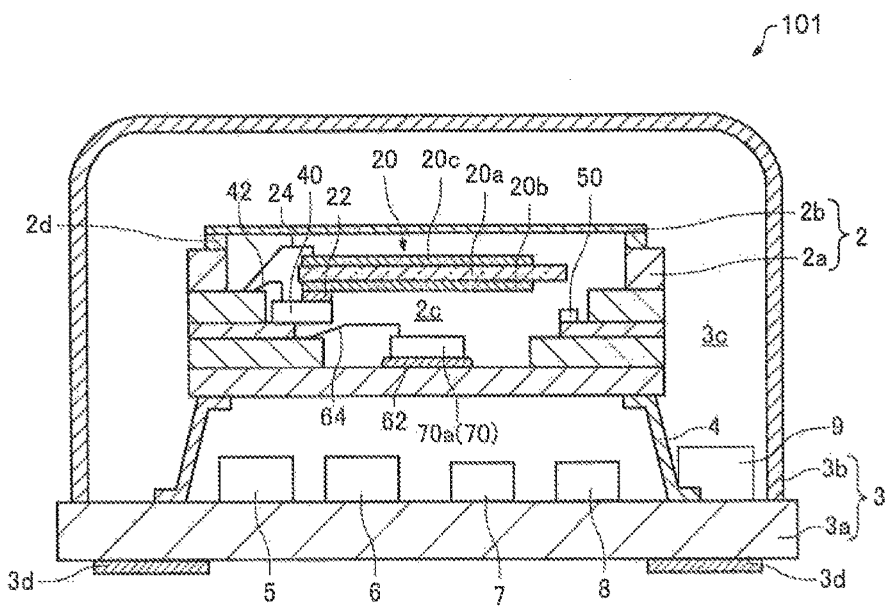
FIG. 3 is a sectional view schematically showing the oscillator according to the first embodiment.

FIG. 1 is an example of a functional block diagram of an oscillator according to a first embodiment. FIG. 2 is a plan view schematically showing the oscillator according to the first embodiment. FIG. 3 is a sectional view schematically showing the oscillator according to the first embodiment and is a III-III line sectional view of FIG. 2.

As shown in FIG. 1, an oscillator 101 according to the first embodiment includes a vibrator element (a resonator) 20, a D/A conversion integrated circuit (IC) 5, an integrated circuit (IC) for oscillation 6, a variable capacitance element 7, a variable capacitance element 8, a heating element 40, a thermosensitive element 50, and a reference-voltage generation circuit 70. However, in the oscillator 101 according to this embodiment, a part of the components shown in FIG. 1 may be omitted or changed or other components may be added.

As shown in FIGS. 2 and 3, the oscillator 101 according to the first embodiment further includes a first container 2 (an example of the container), a second container 3, and a plurality of supporting bodies 4.

As shown in FIGS. 2 and 3, the first container 2 houses the vibrator element 20, the heating element 40, the thermosensitive element 50, and the reference-voltage generation circuit 70. Note that the first container 2 may house other members configuring the oscillator 101. The first container 2 includes a package **2*a* and a lid 2*b*. Note that, for convenience, the lid 2*b* is not shown in FIG. 2**.

The package **2*a* is, for example, a ceramic package. In an example shown in the figures, the package 2*a* is a ceramic stacked package formed by molding and stacking a ceramic green sheet and then baking the ceramic green sheet. The package 2*a* includes a recess. The vibrator element 20, the heating element 40, the thermosensitive element 50, and the reference-voltage generation circuit 70 are housed in a space (a housing chamber) 2*c* in the recess. In the example shown in the figures, an opening is provided in an upper part of the package 2*a*. The housing chamber 2*c* is formed by covering the opening with the lid 2*b*. The housing chamber 2*c* is, for example, a decompressed atmosphere (a vacuum state). Note that the housing chamber 2*c*** may be an inert gas atmosphere of nitrogen, argon, helium, or the like.

Note that, although not shown in the figures, in the package **2*a*, electrodes electrically connected to first and second excitation electrodes 20*b* and 20*c* of the vibrator element 20, an electrode electrically connected to the heating element 40, an electrode electrically connected to the thermosensitive element 50, an electrode electrically connected to the reference-voltage generation circuit 70, and the like are provided. Although not shown in the figures, a power supply terminal, a ground terminal, and other external terminals are provided on the lower surface of the package 2*a*. On the inside or the surface of the package 2*a*, wires for electrically connecting the power supply terminal and the ground terminal and the heating element 40, wires for electrically connecting the other external terminals and the vibrator element 20 and the reference-voltage generation circuit 70**, and the like are also provided.

The lid **2*b* covers the opening of the package 2*a*. The shape of the lid 2*b* is, for example, a plate shape. As the lid 2*b*, for example, a plate member (e.g., a ceramics plate) made of a material same as the material of the package 2*a* and metal plates of Kovar, a 42 alloy, stainless steel, and the like can be used. The lid 2*b* is connected to the package 2*a* via a joining member 2*d*** such as a seal ring, low-melting point glass, or an adhesive.

In the oscillator 101, the inside of the first container 2 (the space (the housing chamber **2*c*) formed by the first container 2) is used as a thermostatic bath to perform control to keep, with the heating element 40, the temperature of the inside of the first container 2** (the inside of the thermostatic bath) constant.

The vibrator element 20 is housed on the inside of the first container 2. The vibrator element 20 is mounted (disposed)

on the package 2_a_. In the example shown in the figures, the vibrator element 20 is disposed on the package 2_a_ via the heating element 40. The vibrator element 20 is mechanically and thermally connected to the heating element 40 via a joining member 22. As explained below, the vibrator element 20 (the first excitation electrode 20_b_) is electrically connected to, via the joining member 22, a wire (not shown in the figures) provided on the heating element 40. Examples of the joining member 22 include silver paste, solder, a conductive adhesive (an adhesive obtained by dispersing a conductive filler such as metal particles in a resin material).

The vibrator element 20 is, for example, a quartz crystal vibrator of SC cut. The vibrator element 20 includes a crystal substrate 20_a_ and the excitation electrodes 20_b_ and 20_c_. Note that, for convenience, in FIG. 2, the vibrator element 20 is simplified and shown.

As the crystal substrate 20_a_, an SC cut crystal substrate (piezoelectric substrate) is used. A plane shape of the crystal substrate 20_a_ (a shape viewed from the thickness direction of the crystal substrate 20_a_) is, for example, a circle, an ellipse, a square, or other polygons.

The first excitation electrode 20_b_ and the second excitation electrode 20_c_ are provided to sandwich the crystal substrate 20_a_. The excitation electrodes 20_b_ and 20_c_ apply a voltage to the crystal substrate 20_a_ to vibrate the crystal substrate 20_a_.

The first excitation electrode 20_b_ is provided on the lower surface of the crystal substrate 20_a_. The first excitation electrode 20_b_ is electrically connected to the joining member 22 via an extraction electrode provided on the lower surface of the crystal substrate 20_a_. Although not shown in the figures, the joining member 22 is electrically connected to, via a wire provided on the heating element 40 and a bonding wire, an electrode provided on the package 2_a_. That is, the first excitation electrode 20_b_ is electrically connected to, via the joining member 22 or the like, the electrode provided on the package 2_a_.

Note that the first excitation electrode 20_b_ and the electrode provided on the package 2_a_ may be directly electrically connected by a bonding wire or the like to make the joining member 22 nonconductive. That is, the joining member 22 may thermally connect but not electrically connect the vibrator element 20 and the heating element 40.

The second excitation electrode 20_c_ is provided on the upper surface of the crystal substrate 20_a_. The second excitation electrode 20_c_ is electrically connected to, via an extraction electrode provided on the upper surface of the crystal substrate 20_a_ and a bonding wire 24, the electrode (not shown in the figures) provided on the package 2_a_. Note that, in FIG. 2, for convenience, the bonding wire 24 and a bonding wire 42 explained below are not shown. As the excitation electrodes 20_b_ and 20_c_, for example, electrodes obtained by stacking chrome and metal in this order from the crystal substrate 20_a_ side are used.

Note that the vibrator element 20 is not limited to the quartz crystal vibrator of the SC cut. For example, quartz crystal vibrators of AT cut and BT cut and an SAW (Surface Acoustic Wave) resonator can be used. As the vibrator element 20, a piezoelectric vibrator, an MEMS (Micro Electro Mechanical Systems) vibrator, and the like other than the quartz crystal vibrator can also be used. As a substrate material of the vibrator element 20, piezoelectric material such as piezoelectric single crystal such as quartz crystal, lithium tantalate, and lithium niobate and piezoelectric ceramics such as lead zirconate titanate, a silicon semiconductor material, and the like can be used. As an exciting unit for the vibrator element 20, exciting means by a piezoelectric effect may be used or electrostatic driving by a Coulomb's force may be used.

The heating element 40 is housed on the inside of the first container 2. The heating element 40 is disposed (mounted) on the package 2_a_. The heating element 40 is electrically connected to, via the bonding wire 42, the electrode (not shown in the figures) provided on the package 2_a_. The vibrator element 20 is disposed on the heating element 40 via the joining member 22. By disposing the vibrator element 20 on the heating element 40 via the joining member 22, it is possible to efficiently transfer heat generated by the heating element 40 to the vibrator element 20. It is possible to further stabilize temperature control of the vibrator element 20 while achieving a reduction on power consumption. The heating element 40 is, for example, a heater. Elements (a power transistor, a resistor, etc.) that generate heat when an electric current is fed thereto can be used. The heating element 40 controls the temperature on the inside (the housing chamber 2_c_) of the first container 2. The heating element 40 is controlled by a heat-generation control circuit 60 to keep the temperature on the inside of the first container 2 constant (or substantially constant).

Note that a place where the heating element 40 is disposed is not particularly limited as long as the temperature on the inside of the first container 2 can be controlled. However, the place is desirably in the vicinity of the vibrator element 20. The heating element 40 may be disposed on the outside of the first container 2 (e.g., on the outer surface of the first container 2).

The thermosensitive element 50 is housed on the inside of the first container 2. The thermosensitive element 50 is disposed (mounted) on the package 2_a_. The thermosensitive element 50 is desirably disposed in the vicinity of the vibrator element 20. The thermosensitive element 50 detects the temperature on the inside of the first container 2. As the thermosensitive element 50, for example, thermistors (an NTC (Negative Temperature Coefficient) thermistor, a PTC (Positive Temperature Coefficient) thermistor, etc.) and a platinum resistor can be used.

Note that, in the example shown in the figures, the heating element 40 and the thermosensitive element 50 are respectively housed on the inside of the first container 2 as separate elements. However, the heating element 40 (e.g., a power transistor) and the thermosensitive element 50 may configure one semiconductor element and the semiconductor element may be housed on the inside of the first container 2.

The reference-voltage generation circuit 70 is housed on the inside of the first container 2. The reference-voltage generation circuit 70 is configured by, for example, one semiconductor element 70_a_. The semiconductor element 70_a_ is housed on the inside of the first container 2. The semiconductor element 70_a_ is disposed on the inner bottom surface of the recess. The semiconductor element 70_a_ is joined to the package 2_a_ by a joining member 62 such as an adhesive. The semiconductor element 70_a_ is electrically connected to, via a bonding wire 64, the electrode (not shown in the figures) disposed on the package 2_a_.

The second container 3 includes a base substrate 3_a_ and a cover 3_b_. Note that, for convenience, in FIG. 2, the cover 3_b_ is not shown. The base substrate 3_a_ is formed of a material such as glass epoxy resin having insulation or ceramic. On the lower surface of the base substrate 3_a_, an external terminal 3_d_ for electrically connecting an element housed on the inside of the second container 3 and an external apparatus or the like is provided. The cover 3_b_ is put over the base substrate 3_a_ to form a space 3_c_ in conjunction with the base substrate 3_a_. The material of the cover 3_b_ is, for example, metal or resin. As the cover 3*b*, for example, a cover obtained by applying nickel plating to an iron-based alloy having low thermal conductivity such as a 42 alloy (an iron nickel alloy) may be used. The cover 3*b* is fixed on the base substrate 3*a* using solder or the like. The space 3*c* is, for example, a decompressed atmosphere (a vacuum state). Note that the space 3*c* may be an inert gas atmosphere of nitrogen, argon, helium, or the like. In the space 3*c* (on the inside of the second container 3), the first container 2, the supporting bodies 4, the D/A conversion IC 5, the IC for oscillation 6, the variable capacitance element 7, the variable capacitance element 8, and electronic components 9 are housed.

The supporting bodies 4 are provided on the base substrate 3*a* to support the first container 2. The first container 2 is supported by the supporting bodies 4. The first container 2 is separated from the base substrate 3*a* by being supported by the supporting bodies 4. Therefore, for example, compared with when the first container 2 is in contact with the base substrate 3*a*, the first container 2 is less easily affected by an ambient temperature of the oscillator 101 (the temperature outside the second container 3). The supporting bodies 4 are desirably formed of a material having small thermal conductivity. Specifically, as the material of the supporting bodies 4, any one kind of iron, titanium, and platinum or an alloy containing one or more kinds of the materials is used. In particular, as the material of the supporting bodies 4, it is desirable to use Kovar or a 42 alloy, which is an iron-based alloy. By forming the supporting bodies 4 with the material having small thermal conductivity in this way, it is possible to reduce an amount of heat escaping to the outside from the first container 2 via the supporting bodies 4. It is possible to achieve reduction in power consumption. The supporting bodies 4 may function as a part of wires for electrically connecting the members housed on the inside of the first container 2 and the members disposed on the outside of the first container 2.

On the base substrate 3*a*, the D/A conversion IC 5, the IC for oscillation 6, the variable capacitance element 7, the variable capacitance element 8, and other one or more electronic components 9 (a resistor, a capacitor, a coil, etc.) are disposed (mounted). Terminals of the variable capacitance element 7, the variable capacitance element 8, the electronic components 9, the vibrator element 20, the heating element 40, the thermosensitive element 50, and the reference-voltage generation circuit 70 are respectively electrically connected to desired terminals of the D/A conversion IC 5 or the IC for oscillation 6 by not-shown wiring patterns.

Note that, although not shown in the figures, at least a part of the D/A conversion IC 5, the IC for oscillation 6, the variable capacitance element 7, the variable capacitance element 8, and the electronic components 9 may be disposed on the lower surface of the first container 2 (the package 2*a*). Consequently, it is possible to dispose these members to be separated from the base substrate 3*a*. It is possible to prevent the members from being easily affected by the ambient temperature of the oscillator 101.

As shown in FIG. 1, the reference-voltage generation circuit 70 generates a high-potential side reference voltage VDH and a low-potential side reference voltage VDL of a D/A conversion circuit 80 on the basis of a power supply voltage VCC supplied from the outside of the oscillator 101 and supplies the high-potential side reference voltage VDH and the low-potential side reference voltage VDL to the D/A conversion circuit 80. The reference-voltage generation circuit 70 includes, for example, a regulator.

The D/A conversion IC 5 includes the D/A conversion circuit 80 (a D/A converter) and a serial interface circuit 90. However, in the D/A conversion IC 5, a part of the components may be omitted or changed or other components may be added.

The serial interface circuit 90 acquires a serial data signal (digital data for controlling the frequency of the oscillation circuit 30) input from the outside of the D/A conversion IC 5 (the outside of the oscillator 101), converts the serial data signal into an N-bit data signal, and outputs the N-bit data signal to the D/A conversion circuit 80.

The N-bit data signal (the digital data for controlling the frequency of the oscillation circuit 30) output by the serial interface circuit 90 is input to the D/A conversion circuit 80. The D/A conversion circuit 80 converts the N-bit data signal into an analog signal of a voltage between the high-potential side reference voltage VDH and the low-potential side reference voltage VDL and outputs the analog signal. As the D/A conversion circuit 80, D/A conversion circuits of well-known various types such as a resistance voltage dividing type (also called voltage distribution type, resistance string type, or voltage potentiometer type), a resistance ladder type (an R-2R ladder type, etc.), a capacitive array type, and a delta/sigma type can be used.

A voltage (a control voltage) VC of the analog signal output by the D/A conversion circuit 80 is applied to the variable capacitance element 8 on the outside of the D/A conversion IC 5. A capacitance value of the variable capacitance element 8 changes according to the control voltage VC. The variable capacitance element 8 may be, for example, a varicap diode (a varactor), a capacitance value of which changes according to the control voltage VC applied to one end thereof.

The IC for oscillation 6 includes a temperature compensation circuit 10, a thermosensitive element 13, a circuit for oscillation 32, the heat-generation control circuit 60, a reference-voltage generation circuit 72, a serial interface circuit 92, and a storing unit 100. However, in the IC for oscillation 6, a part of the components may be omitted or changed or other components may be added.

The temperature compensation circuit 10 is connected to the thermosensitive element 13. The temperature compensation circuit 10 generates, according to an output signal of the thermosensitive element 13, a temperature compensation voltage TC for correcting a frequency temperature characteristic of an output signal of the oscillation circuit 30. For example, the temperature compensation circuit 10 may be capable of performing only correction of a primary component of the frequency temperature characteristic of the output signal of the oscillation circuit 30 (hereinafter referred to as "primary correction"), may be capable of performing only correction of a secondary component (hereinafter referred to as "secondary correction"), or may be capable of performing both of the primary correction and the secondary correction. When the temperature compensation circuit 10 is capable of performing both of the primary correction and the secondary correction, the temperature compensation circuit 10 may be capable of independently setting whether the primary correction and the secondary correction are respectively enabled or disabled or may be capable of setting a correction parameter of the primary correction and a correction parameter of the secondary correction independently from each other. Further, the temperature compensation circuit 10 may be capable of performing the secondary correction in a plurality of temperature regions (e.g., a low temperature side and a high temperature side) independently from one another.

The thermosensitive element 13 may output, for example, a voltage corresponding to the temperature around the thermosensitive element 13. The thermosensitive element 13 may be a thermosensitive element of a positive polarity having a higher output voltage as temperature is higher or may be a thermosensitive element of a negative polarity having a lower output voltage as temperature is higher.

The temperature compensation voltage TC output by the temperature compensation circuit 10 is applied to the variable capacitance element 7 on the outside of the IC for oscillation 6. A capacitance value of the variable capacitance element 7 changes according to the temperature compensation voltage TC. The variable capacitance element 7 may be a varicap diode (a varactor), a capacitance value of which changes according to the temperature compensation voltage TC applied to one end thereof.

The circuit for oscillation 32 configures the oscillation circuit 30, which causes the vibrator element 20 to oscillate, in conjunction with the variable capacitance element 7, the variable capacitance element 8, and the other electronic components 9 (not shown in FIG. 1) externally attached to terminals of the IC for oscillation 6.

The oscillation circuit 30 is electrically connected to the vibrator element 20. The oscillation circuit 30 causes the vibrator element 20 to oscillate at a frequency corresponding to a capacitance value of the variable capacitance element 7 and a capacitance value of the variable capacitance element 8 and outputs an oscillation signal VO. The oscillation signal VO output by the oscillation circuit 30 is output to the outside of the IC for oscillation 6 (the outside of the oscillator 101).

The heat-generation control circuit 60 controls, on the basis of an output voltage of the thermosensitive element 50, the heating element 40 for heating the vibrator element 20. Specifically, the heat-generation control circuit 60 controls, according to the output voltage of the thermosensitive element 50, heat generation of the heating element 40 to keep temperature constant.

For example, the thermosensitive element 50 having a temperature characteristic of a positive gradient may be disposed on the inside of the first container 2. The heat-generation control circuit 60 may perform control to feed an electric current to the heating element 40 to cause the heating element 40 to generate heat when the output voltage of the thermosensitive element 50 is smaller than a reference value and not to feed an electric current to the heating element 40 when the output voltage of the thermosensitive element 50 is larger than the reference value.

The reference-voltage generation circuit 72 generates, on the basis of the power supply voltage VCC supplied from the outside of the IC for oscillation 6 (the outside of the oscillator 101), a power supply voltage VA of the oscillation circuit 30, a reference voltage VREF1 of the temperature compensation circuit 10, a reference voltage VREF2 of the heat-generation control circuit 60, and the like.

The storing unit 100 includes a nonvolatile memory and a register not shown in the figures. In the nonvolatile memory, setting information of the temperature compensation circuit 10 (information concerning whether the primary correction and the secondary correction are respectively performed, a correction parameter of the primary correction, a correction parameter of the secondary correction, etc.) and the like are stored. The nonvolatile memory can be realized by, for example, a flash memory such as an MONOS (Metal-Oxide-Nitride-Oxide-Silicon) memory and an EEPROM (Electrically Erasable Programmable Read-Only Memory).

The setting information stored in the nonvolatile memory is transferred from the nonvolatile memory to the register when a power supply of the IC for oscillation 6 is turned on (when the power supply voltage VCC rises from 0 V to a desired voltage) and retained in the register. The setting information retained in the register is supplied to the temperature compensation circuit 10 and the like.

The serial interface circuit 92 is a circuit for performing read/write on the storing unit 100 (the nonvolatile memory and the register) from the outside of the IC for oscillation 6 (the outside of the oscillator 101). The serial interface circuit 92 may be, for example, an interface circuit corresponding to an $I^2C$ (Inter-integrated Circuit) bus or may be, for example, an interface circuit corresponding to a SPI (Serial Peripheral Interface) bus.

Figure 4:
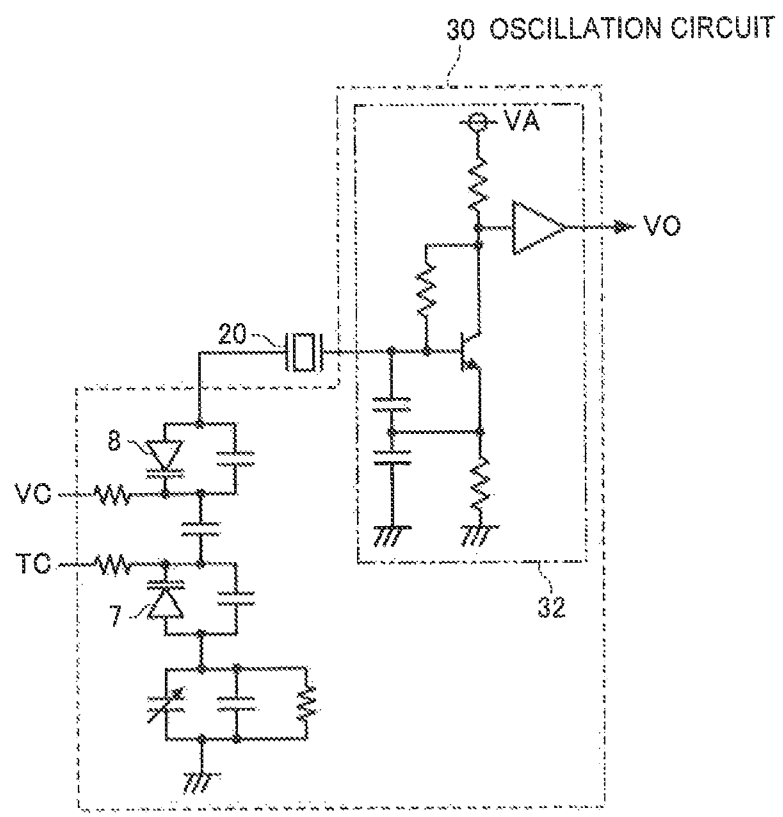
FIG. 4 is a diagram showing a configuration example of an oscillation circuit.

FIG. 4 is a diagram showing a configuration example of the oscillation circuit 30. In the oscillation circuit 30 shown in FIG. 4, the control voltage VC is applied to one end of the variable capacitance element 8 (the varicap diode), the capacitance value of the variable capacitance element 8 changes according to a voltage value of the control voltage VC, and an oscillation frequency changes according to the change in the capacitance value. The temperature compensation voltage TC is applied to one end of the variable capacitance element 7 (the varicap diode), the capacitance value of the variable capacitance element 7 changes according to a voltage value of the temperature compensation voltage TC, and the oscillation frequency is kept substantially constant according to the change in the capacitance value irrespective of temperature.

Figure 5:
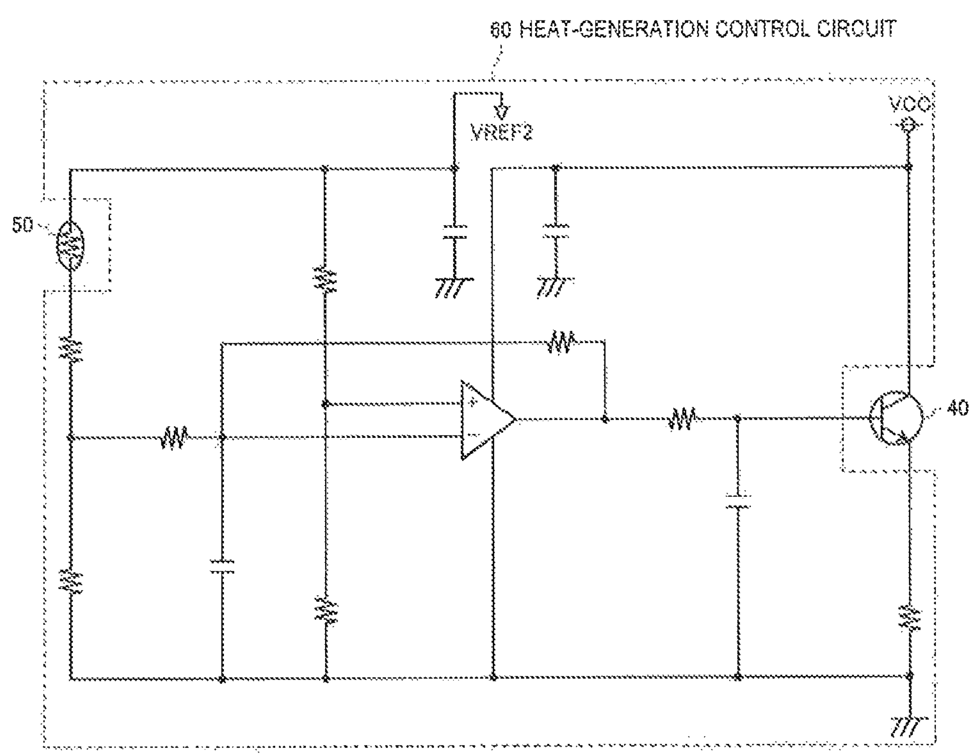
FIG. 5 is a diagram showing a configuration example of a heat-generation control circuit.

FIG. 5 is a diagram showing a configuration example of the heat-generation control circuit 60. In FIG. 5, an NPN-type power transistor is used as the heating element 40. An NTC thermistor is used as the thermosensitive element 50. In the heat-generation control circuit 60 shown in FIG. 5, when temperature drops, a resistance value of the thermosensitive element 50 (the NTC thermistor) increases and an input potential difference of an operational amplifier increases. Conversely, when temperature rises, the resistance value of the thermosensitive element 50 (the NTC thermistor) decreases and the input potential difference of the operational amplifier decreases. An output voltage of the operational amplifier is proportional to the input potential difference. When the output voltage of the operational amplifier is larger than a predetermined voltage value, a more electric current flows to the heating element 40 (the NPN-type power transistor) and a heat generation amount of the heating element 40 increases as the voltage value is larger. When the output voltage of the operational amplifier is smaller than the predetermined voltage value, an electric current does not flow to the heating element 40 and the heat generation amount gradually decreases. Therefore, the operation of the heating element 40 is controlled to set the resistance value of the thermosensitive element 50 (the NTC thermistor) to a desired value, that is, keep the temperature at a desired temperature.

In the oscillator 101 according to this embodiment having such a configuration, the heat-generation control circuit 60 performs, on the basis of the frequency temperature characteristic of the output signal of the oscillation circuit 30 determined according to temperature characteristics of the vibrator element 20, the ICs (the D/A conversion IC 5 and the IC for oscillation 6), and the like, control to keep the internal temperature of the first container 2 (the internal temperature of the thermostatic bath) at a desired temperature (e.g., if the vibrator element 20 is an SC cut quartz crystal vibrator, temperature at which a frequency is maximized).

Figure 6:
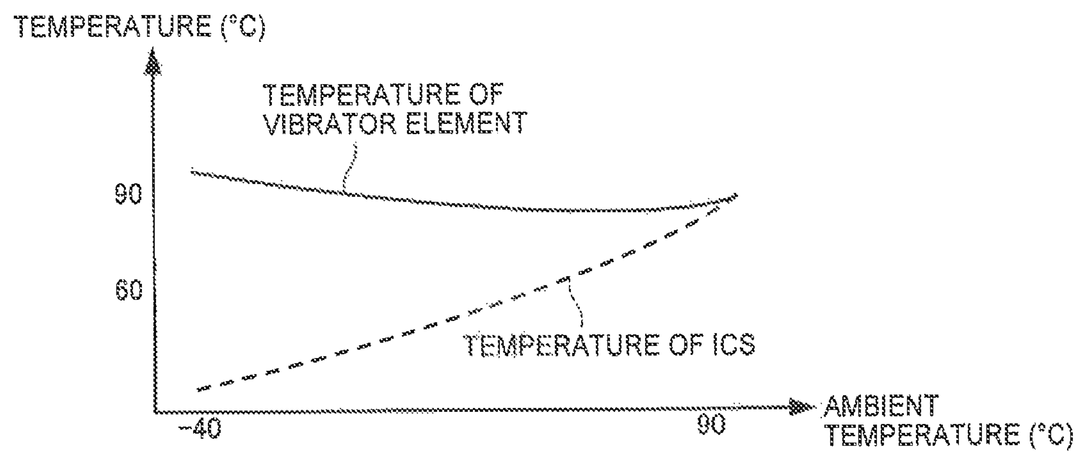
FIG. 6 is a diagram showing a temperature change of a vibrator and a temperature change of ICs with respect to a change in an ambient temperature.

However, the temperature in the thermostatic bath (on the inside of the first container 2) is sometimes not constant because the temperature changes according to the ambient temperature of the oscillator 101. FIG. 6 is a diagram showing, in the oscillator 101 having the structure shown in FIGS. 2 and 3, an example of states of a temperature change of the vibrator element 20 and a temperature change of the ICs (the D/A conversion IC 5 and the IC for oscillation 6) due to a change in the ambient temperature of the oscillator 101. Since the vibrator element 20 is housed in the first container 2, the vibrator element 20 is less easily affected by the ambient temperature. However, as shown in FIG. 6, when the ambient temperature changes in a range of −40° C. to 90° C., the temperature of the vibrator element 20 also slightly changes. The temperature of the ICs (the D/A conversion IC 5 and the IC for oscillation 6) disposed on the outside the thermostatic bath (the outside of the first container 2) is more easily affected by the ambient temperature compared with the vibrator element 20 disposed in the thermostatic bath.

In this embodiment, the temperature compensation circuit 10 corrects a frequency deviation caused by the temperature change of the vibrator element 20 and the temperature change of the ICs due to the change in the ambient temperature. In particular, since the temperature change of the ICs due to the change in the ambient temperature is large, the temperature compensation circuit 10 is provided on the inside of the IC for oscillation 6 separately from the thermosensitive element 50. By generating the temperature compensation voltage TC on the basis of the output signal of the thermosensitive element 13 that more accurately detects the temperature of the ICs, a frequency deviation mainly caused by the temperature change of the ICs is corrected. Consequently, it is possible to realize frequency stability higher than the frequency stability of the OCXO in the past.

The oscillator 101 according to the first embodiment explained above is a new thermostatic bath-type oscillator capable of controlling an oscillation frequency according to a digital signal input from an external terminal. In particular, in the oscillator 101 according to this embodiment, the frequency of the oscillation circuit 30 is controlled by applying the control voltage VC, which is output by the D/A conversion circuit 80, and the temperature compensation voltage TC, which is output by the temperature compensation circuit 10, respectively to the variable capacitance element 8 and the variable capacitance element 7 separate from each other rather than applying a voltage obtained by adding up the control voltage VC and the temperature compensation voltage TC to one variable capacitance element. Consequently, it is unnecessary to allocate a part of a voltage range of the output of the D/A conversion circuit 80 to temperature compensation. A full voltage range of the output of the D/A conversion circuit 80 is successfully allocated to a frequency control range. Therefore, with the oscillator 101 according to this embodiment, it is possible to expand the frequency control range while maintaining the resolution of frequency control. Alternatively, it is possible to increase the resolution of the frequency control while maintaining the frequency control range. In this way, according to this embodiment, it is possible to realize the oscillator 101 capable of performing temperature compensation without narrowing the frequency control range.

Figure 77:
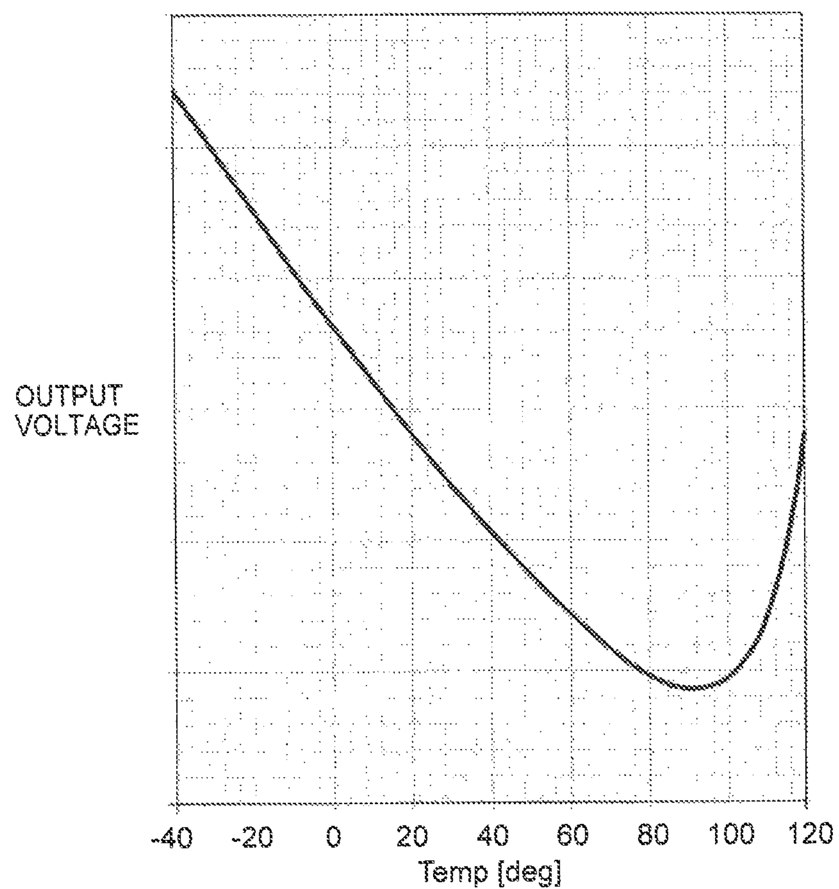
FIG. 77 is a graph showing an example of a temperature characteristic of a regulator.

An output voltage of the reference-voltage generation circuit 70 (the regulator) greatly fluctuates because of temperature (see, for example, FIG. 77). However, in the oscillator 101 according to the first embodiment, since the reference-voltage generation circuit 70 is housed on the inside of the first container 2, for example, compared with when the reference-voltage generation circuit 70 is disposed on the outside of the first container 2, a temperature change of the reference-voltage generation circuit 70 due to the change in the ambient temperature of the oscillator 101 is small. Therefore, with the oscillator 101 according to this embodiment, it is possible to reduce fluctuation in the output voltage of the reference-voltage generation circuit 70 due to the change in the ambient temperature.

For example, when the reference-voltage generation circuit 70 has the temperature characteristic shown in FIG. 77, if the temperature of the reference-voltage generation circuit 70 changes in a range of −40° C. to 85° C., the output voltage of the reference-voltage generation circuit 70 greatly fluctuates. On the other hand, for example, by controlling the fluctuation in the temperature in the first container 2 in a range of 85° C.±1° C., even if the ambient temperature fluctuates in the range of −40° C. to 85° C., it is possible to keep the fluctuation in the temperature of the reference-voltage generation circuit 70 housed on the inside of the first container 2 within the range of 85° C.±1° C. Therefore, it is possible to reduce the fluctuation in the output voltage of the reference-voltage control circuit 70 due to the change in the ambient temperature to be extremely small.

In this way, with the oscillator 101 according to this embodiment, it is possible to reduce the fluctuation in the output voltage of the reference-voltage generation circuit 70 due to the change in the ambient temperature. Therefore, it is possible to reduce fluctuation in an output voltage of the D/A conversion circuit 80 due to the fluctuation in the output voltage of the reference-voltage generation circuit 70. Consequently, it is possible to improve stability of the frequency (an output frequency) of the oscillator 101.

1-2. Second Embodiment

Figure 7:
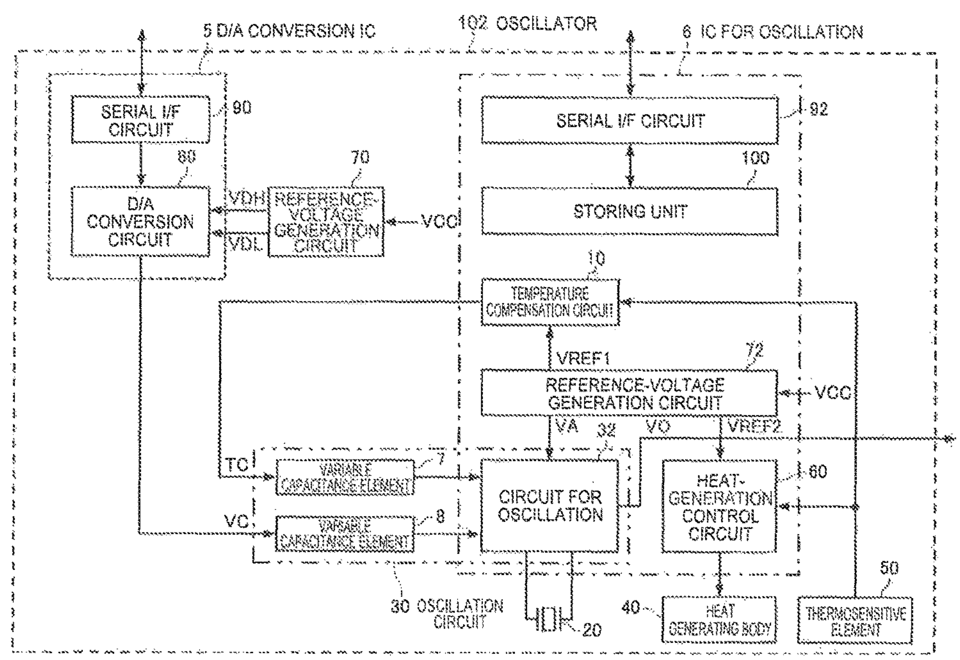
FIG. 7 is a functional block diagram of an oscillator according to a second embodiment.
Figure 8:
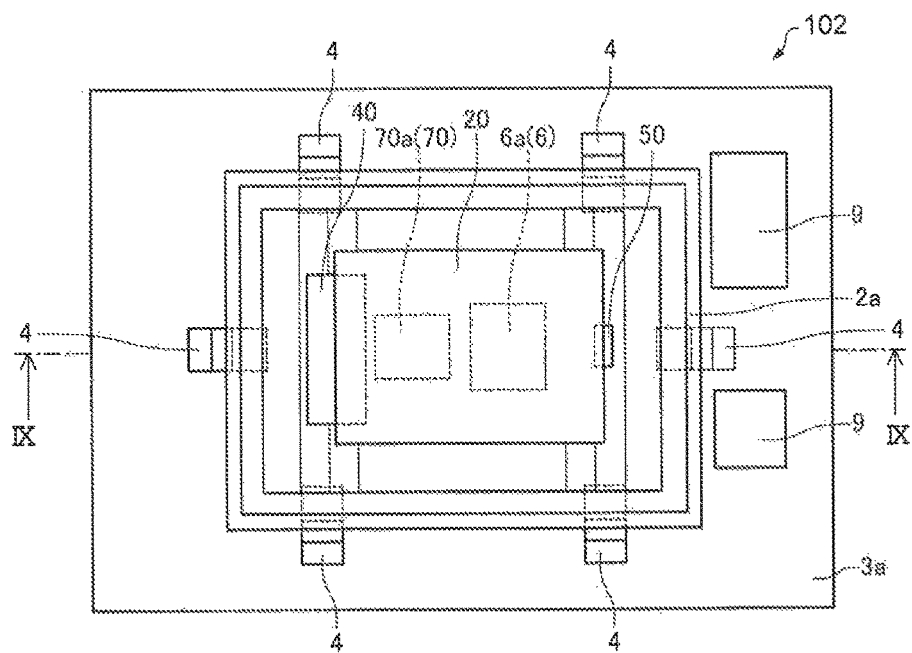
FIG. 8 is a plan view schematically showing the oscillator according to the second embodiment.
Figure 9:
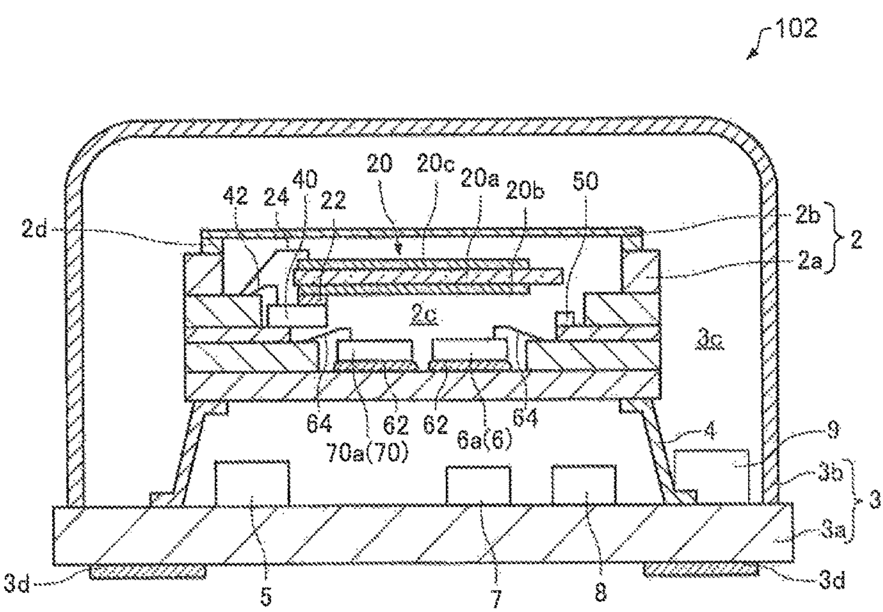
FIG. 9 is a sectional view schematically showing the oscillator according to the second embodiment.

FIG. 7 is an example of a functional block diagram of an oscillator according to a second embodiment. FIG. 8 is a plan view schematically showing the oscillator according to the second embodiment. FIG. 9 is a sectional view schematically showing the oscillator according to the second embodiment and is a IX-IX line sectional view of FIG. 8. In the following explanation, in the oscillator according to the second embodiment, members having functions same as the functions of the constituent members of the oscillator according to the first embodiment are denoted by the same reference numerals and signs. Explanation of the members is omitted.

In an oscillator 102 according to the second embodiment, as shown in FIGS. 7 to 9, the oscillation circuit 30 includes the circuit for oscillation 32 and electronic components such as the variable capacitance elements 7 and 8 and the electronic components 9. The IC for oscillation 6 including the circuit for oscillation 32 is configured by one semiconductor element 6*a*.

The semiconductor element 6*a* is housed on the inside of the first container 2 together with the semiconductor element 70*a* (the reference-voltage generation circuit 70). The semiconductor element 6*a* is disposed on the inner bottom surface of the recess. The semiconductor element 6*a* is joined to the package 2*a* by the joining member 62 such as an adhesive. The semiconductor element 6*a* is electrically connected to, an electrode (not shown in the figures) disposed on the package 2*a* via a bonding wire 64.

The electronic components 7, 8, and 9 configuring the oscillation circuit 30 are disposed on the outside of the first container 2 and on the inside of the second container 3. In an example shown in the figures, the electronic components 7, 8, and 9 are disposed (mounted) on the base substrate 3*a*.

Figure 10:
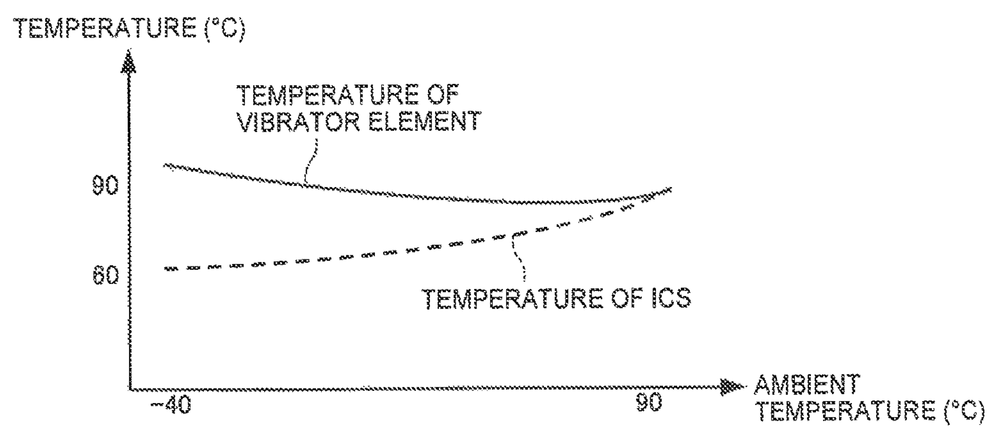
FIG. 10 is a diagram showing a temperature change of a vibrator and a temperature change of ICs with respect to a change in an ambient temperature.

In the oscillator 102 according to the second embodiment, the IC for oscillation 6 is housed on the inside of the first container 2. Therefore, compared with the oscillator 101 according to the first embodiment in which the IC for oscillation 6 is disposed on the outside of the first container 2, the IC for oscillation 6 is less easily affected by an ambient temperature. FIG. 10 is a diagram showing, in the oscillator 102 according to the second embodiment, states of a temperature change of the vibrator element 20 and a temperature change of the IC for oscillation 6 due to a change in an ambient temperature of the oscillator 102. As shown in FIG. 10, in the oscillator 102 according to the second embodiment, compared with the oscillator 101 (FIG. 6) according to the first embodiment, the temperature change of the IC for oscillation 6 due to the change in the ambient temperature of the oscillator 102 is small and a temperature difference between the IC for oscillation 6 and the vibrator element 20 is also small.

Therefore, as shown in FIG. 7, in the oscillator 102 according to the second embodiment, unlike the oscillator 101 according to the first embodiment, the thermosensitive element 13 is not provided in the IC for oscillation 6. The temperature compensation circuit 10 is connected to the thermosensitive element 50. That is, in the oscillator 102 according to the second embodiment, since the temperature difference between the IC for oscillation 6 and the vibrator element 20 is small, the IC for oscillation 6 is reduced in size by using the thermosensitive element 50 for both of heat generation control by the heat-generation control circuit 60 and temperature compensation by the temperature compensation circuit 10. There is a slight difference between temperature detected by the thermosensitive element 50 (substantially equal to the temperature of the vibrator element 20) and the actual temperature of the IC for oscillation 6. However, the difference is within a range in which sufficient temperature compensation by the temperature compensation circuit 10 is possible. Therefore, the oscillator 102 according to the second embodiment is advantageous for a reduction in manufacturing costs and a reduction in size while realizing high frequency stability.

Note that, although not shown in the figures, in the oscillator 102 according to the second embodiment, as in the oscillator 101 according to the first embodiment shown in FIG. 1, the thermosensitive element 13 may be provided in the IC for oscillation 6 and the temperature compensation circuit 10 may be connected to the thermosensitive element 13.

An output voltage of the circuit for oscillation 32 fluctuates because of temperature. However, in the oscillator 102 according to the second embodiment, since the reference-voltage generation circuit 70 and the circuit for oscillation 32 are housed on the inside of the first container 2, for example, compared with when the reference-voltage generation circuit 70 and the circuit for oscillation 32 are disposed on the outside of the first container 2, temperature changes of the reference-voltage generation circuit 70 and the circuit for oscillation 32 due to the change in the ambient temperature of the oscillator 102 are small. Therefore, with the oscillator 102 according to this embodiment, it is possible to reduce fluctuation in an output voltage of the reference-voltage generation circuit 70 and fluctuation in the output voltage of the circuit for oscillation 32 due to the change in the ambient temperature. Consequently, it is possible to further improve stability of the frequency of the oscillator 102.

1-3. Third Embodiment

Figure 11:
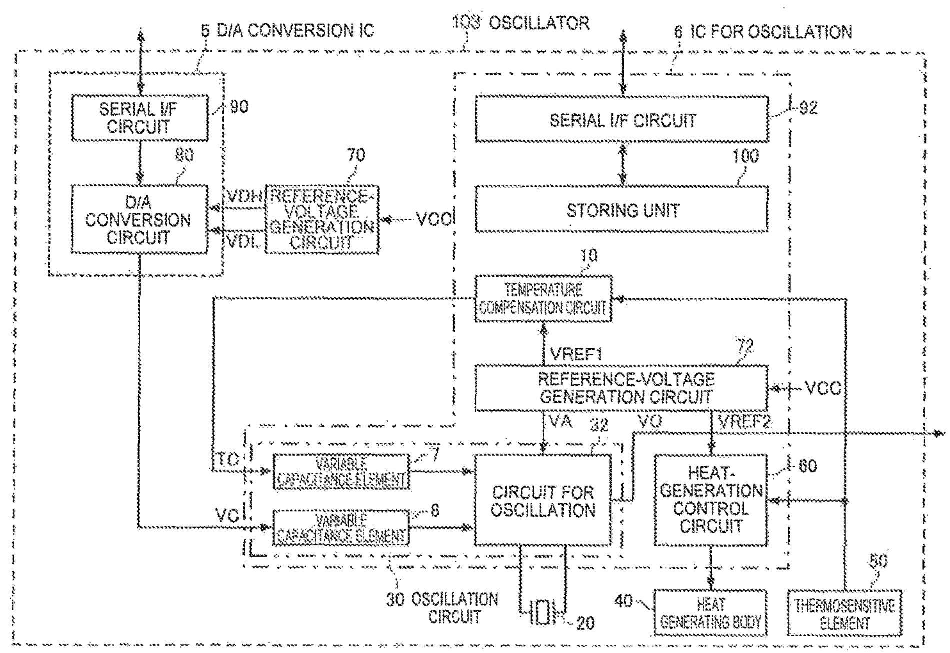
FIG. 11 is a functional block diagram of an oscillator according to a third embodiment.
Figure 12:
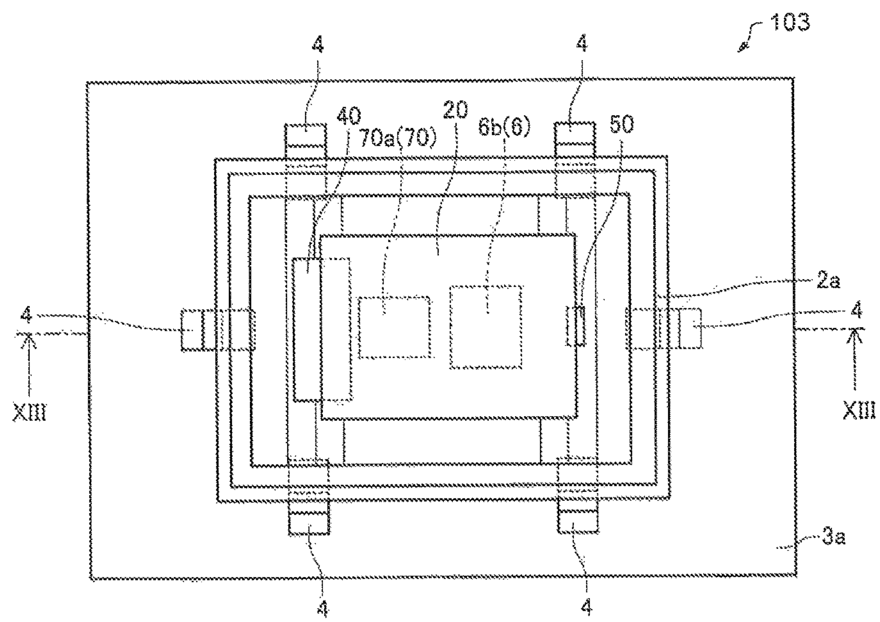
FIG. 12 is a plan view schematically showing the oscillator according to the third embodiment.
Figure 13:
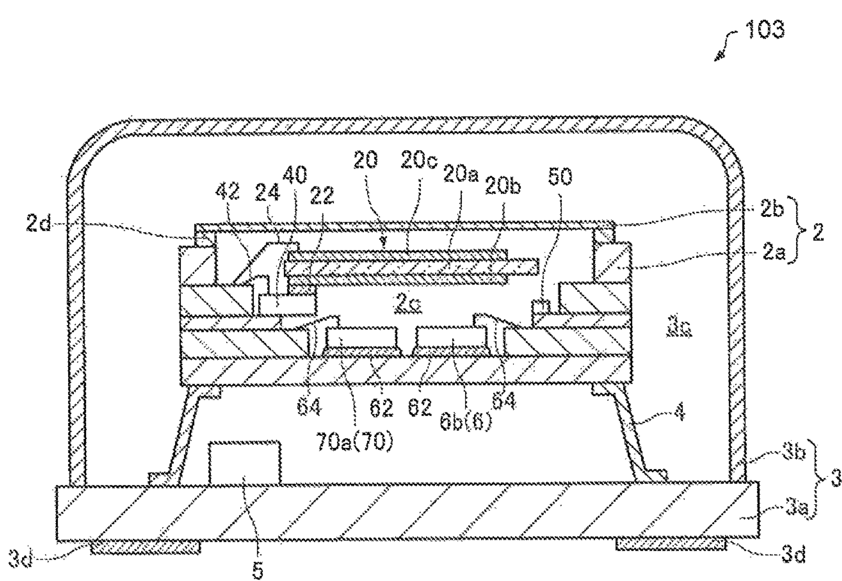
FIG. 13 is a sectional view schematically showing the oscillator according to the third embodiment.

FIG. 11 is an example of a functional block diagram of an oscillator according to a third embodiment. FIG. 12 is a plan view schematically showing the oscillator according to the third embodiment. FIG. 13 is a sectional view schematically showing the oscillator according to the third embodiment. FIG. 12 is a XIII-XIII line sectional view of FIG. 12. In the following explanation, in the oscillator according to the third embodiment, members having functions same as the functions of the constituent members of the oscillators according to the first and second embodiments are denoted by the same reference numerals and signs. Explanation of the members is omitted.

In an oscillator 103 according to the third embodiment, as shown in FIG. 11, the IC for oscillation 6 further includes the variable capacitance element 7 and the variable capacitance element 8 in addition to the temperature compensation circuit 10, the circuit for oscillation 32, the heat-generation control circuit 60, the reference-voltage generation circuit 72, the serial interface circuit 92, and the storing unit 100. Although not shown in FIG. 11, the IC for oscillation 6 further includes the electronic components 9. That is, the IC for oscillation 6 further includes the oscillation circuit 30.

The IC for oscillation 6 is configured by a semiconductor element 6*b*. As shown in FIGS. 12 and 13, the semiconductor element 6*b* is housed on the inside of the first container 2 together with the semiconductor element 70*a* (the reference-voltage generation circuit 70).

An output voltage of the oscillation circuit 30 fluctuates because of temperature. However, in the oscillator 103 according to the third embodiment, since the reference-voltage generation circuit 70 and the oscillation circuit 30 are housed on the inside of the first container 2, for example, compared with when the reference-voltage generation circuit 70 and the oscillation circuit 30 are disposed on the outside of the first container 2, temperature changes of the reference-voltage generation circuit 70 and the oscillation circuit 30 due to a change in an ambient temperature of the oscillator 103 are small. Therefore, with the oscillator 103 according to this embodiment, it is possible to reduce fluctuation in an output voltage of the reference-voltage generation circuit 70 and fluctuation in the output voltage of the oscillation circuit 30 due to the change in the ambient temperature. Consequently, it is possible to further improve stability of the frequency of the oscillator 103.

1-4. Fourth Embodiment

Figure 14:
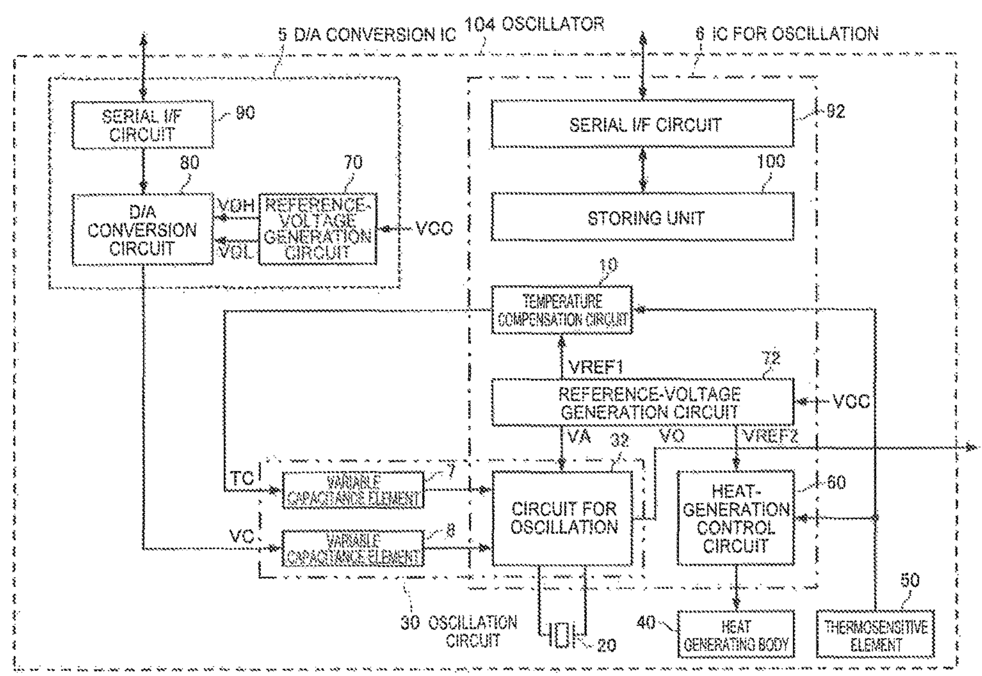
FIG. 14 is a functional block diagram of an oscillator according to a fourth embodiment.
Figure 15:
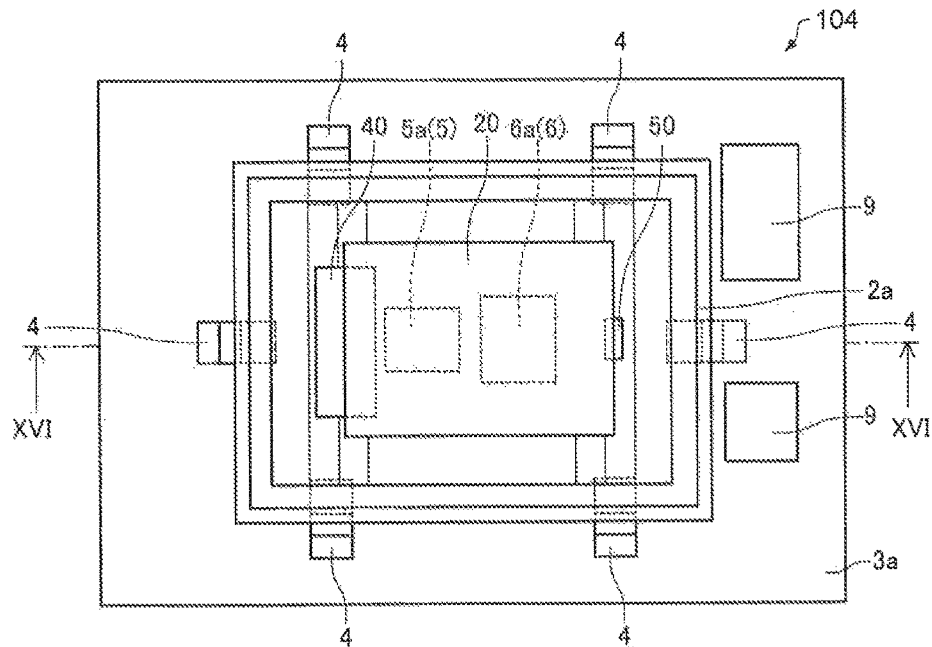
FIG. 15 is a plan view schematically showing the oscillator according to the fourth embodiment.
Figure 16:
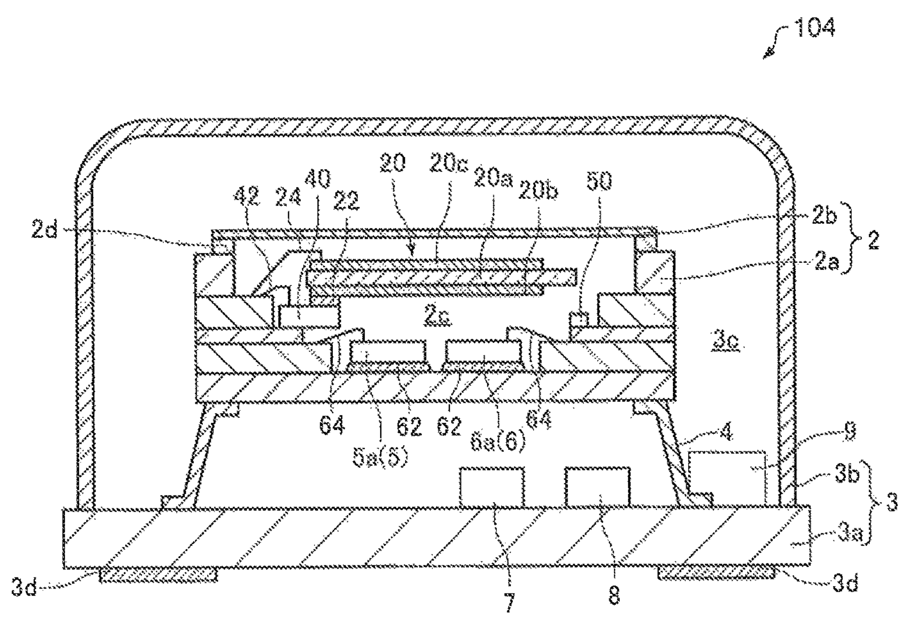
FIG. 16 is a sectional view schematically showing the oscillator according to the fourth embodiment.

FIG. 14 is an example of a functional block diagram of an oscillator according to a fourth embodiment. FIG. 15 is a plan view schematically showing the oscillator according to the fourth embodiment. FIG. 16 is a sectional view schematically showing the oscillator according to the fourth embodiment and is a XVI-XVI line sectional view of FIG. 15. In the following explanation, in the oscillator according to the fourth embodiment, members having functions same as the functions of the constituent members of the oscillators according to the first to third embodiments are denoted by the same reference numerals and signs. Explanation of the members is omitted.

In an oscillator 104 according to the fourth embodiment, as shown in FIG. 14, the D/A conversion IC 5 includes the reference-voltage generation circuit 70, the D/A conversion circuit 80, and the serial interface circuit 90. The D/A conversion IC 5 is configured by a semiconductor element 5*a*. As shown in FIGS. 15 and 16, the semiconductor element 5*a* is housed on the inside of the first container 2. That is, the reference-voltage generation circuit 70 and the D/A conversion circuit 80 are configured by one semiconductor element 5*a* and housed on the inside of the first container 2. In an example shown in the figures, the semiconductor element 5*a* is housed on the inside of the first container 2 together with the semiconductor element 6*a* (the IC for oscillation 6).

An output voltage of the D/A conversion circuit 80 fluctuates because of temperature. However, in the oscillator 104 according to the fourth embodiment, since the reference-voltage generation circuit 70 and the D/A conversion circuit 80 are housed on the inside of the first container 2, for example, compared with when the reference-voltage generation circuit 70 and the D/A conversion circuit 80 are disposed on the outside of the first container 2, temperature changes of the reference-voltage generation circuit 70 and the D/A conversion circuit 80 due to a change in an ambient temperature of the oscillator 104 are small. Therefore, with the oscillator 104 according to this embodiment, it is possible to reduce fluctuation in an output voltage of the reference-voltage generation circuit 70 and fluctuation in the output voltage of the D/A conversion circuit 80 due to the change in the ambient temperature. Consequently, it is possible to further improve stability of the frequency of the oscillator 104.

Further, in the oscillator 104 according to the fourth embodiment, since the IC for oscillation 6 (the semiconductor element 6*a*) is housed in the first container 2, it is possible to reduce fluctuation in an output voltage of the circuit for oscillation 32 due to the change in the ambient temperature. Consequently, it is possible to further improve stability of the frequency of the oscillator 104.

In the oscillator 104 according to the fourth embodiment, the D/A conversion circuit 80 and the reference-voltage generation circuit 70 are configured by one semiconductor element 5*a*. Therefore, the oscillator 104 according to the fourth embodiment is advantageous for a reduction in manufacturing costs and a reduction in size.

1.5 Fifth Embodiment

Figure 17:
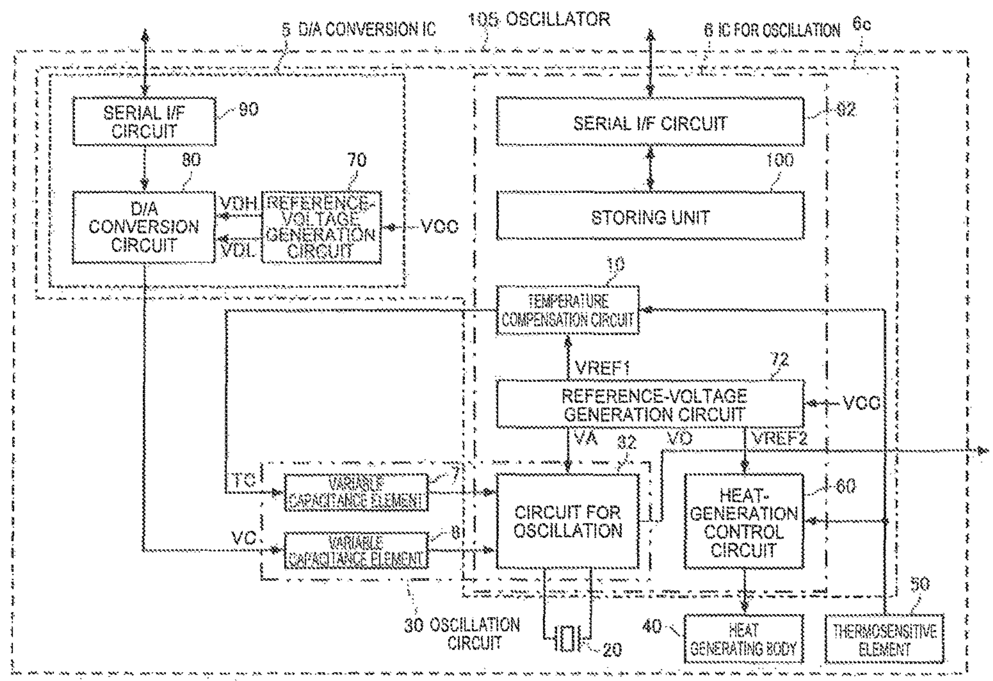
FIG. 17 is a functional block diagram of an oscillator according to a fifth embodiment.
Figure 18:
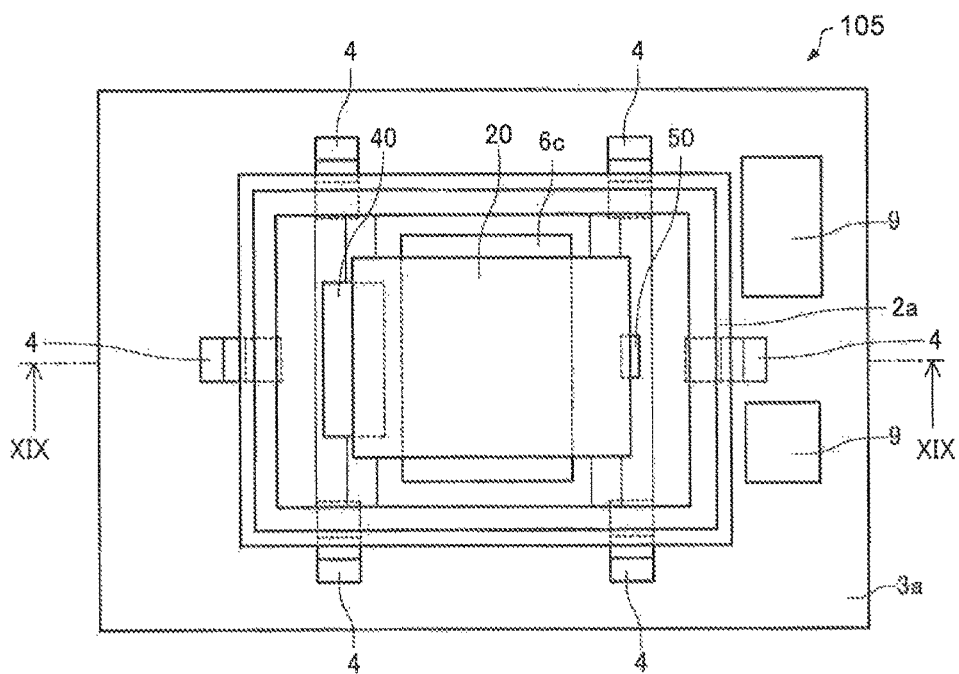
FIG. 18 is a plan view schematically showing the oscillator according to the fifth embodiment.
Figure 19:
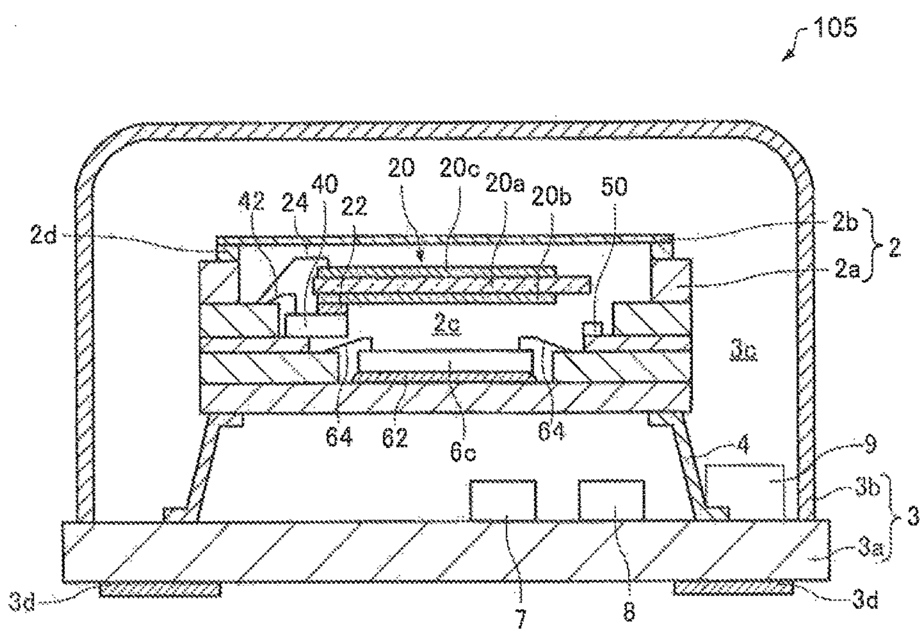
FIG. 19 is a sectional view schematically showing the oscillator according to the fifth embodiment.

FIG. 17 is an example of a functional block diagram of an oscillator according to a fifth embodiment. FIG. 18 is a plan view schematically showing the oscillator according to the fifth embodiment. FIG. 19 is a sectional view schematically showing the oscillator according to the fifth embodiment and is a XIX-XIX line sectional view of FIG. 18. In the following explanation, in the oscillator according to the fifth embodiment, members having functions same as the functions of the constituent members of the oscillators according to the first to fourth embodiments are denoted by the same reference numerals and signs. Explanation of the members is omitted.

In an oscillator 105 according to the fifth embodiment, as shown in FIG. 17, the D/A conversion IC 5 and the IC for oscillation 6 are configured by one semiconductor element 6*c*. As shown in FIGS. 18 and 19, the semiconductor element 6*c* is housed on the inside of the first container 2.

In the oscillator 105 according to the fifth embodiment, as in the oscillator 104, it is possible to further improve frequency stability of the oscillator 105. Further, in the oscillator 105 according to the fifth embodiment, since the D/A conversion IC 5 and the IC for oscillation 6 are configured by one semiconductor element 6*c*, the oscillator 105 according to the fifth embodiment is advantageous for a reduction in manufacturing costs and a reduction in size.

Note that, in the above explanation, as shown in FIGS. 18 and 19, the D/A conversion IC 5 and the IC for oscillation 6 are configured by one semiconductor element 6*c*. However, although not shown in the figures, the D/A conversion IC 5, the IC for oscillation 6, the variable capacitance elements 7 and 8, and the electronic components 9 may be housed in the first container 2 as one semiconductor element.

1-6. Sixth Embodiment

Figure 20:
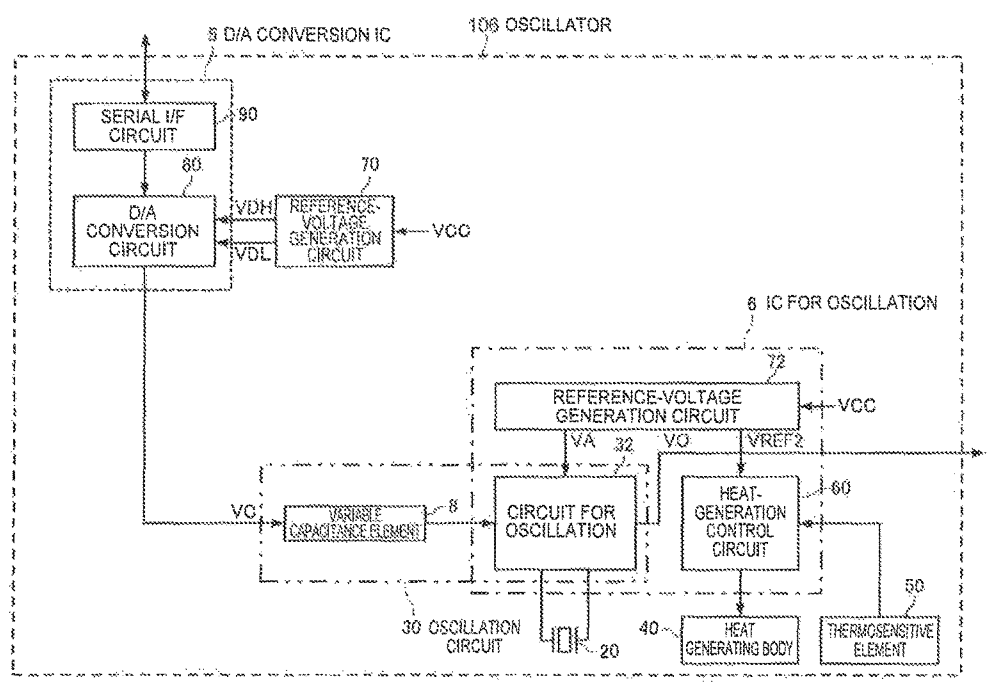
FIG. 20 is a functional block diagram of an oscillator according to a sixth embodiment.

FIG. 20 is an example of a functional block diagram of an oscillator according to a sixth embodiment. Note that a plan view of the oscillator according to the sixth embodiment is the same as FIG. 2 and a sectional view of the oscillator is the same as FIG. 3. Therefore, the plan view and the sectional view are omitted. In the oscillator according to the sixth embodiment, members having functions same as the functions of the constituent members of the oscillators according to the first to fifth embodiments are denoted by the same reference numerals and signs. Explanation of the members is omitted.

An oscillator 106 according to the sixth embodiment is different from the oscillator 101 according to the first embodiment shown in FIG. 1 in that, as shown in FIG. 20, the oscillator 106 does not include the temperature compensation circuit 10, the variable capacitance element 7, the thermosensitive element 13, the serial interface circuit 92, and the storing unit 100. That is, in the oscillator 106 according to the sixth embodiment, correction of a frequency deviation caused by a temperature change of the vibrator element 20 and a temperature change of the ICs due to a change in an ambient temperature is not performed. High frequency stability is realized by controlling, with the heat-generation control circuit 60, the heating element 40 to keep the internal temperature of the first container 2 (the internal temperature of the thermostatic bath) at a desired temperature. Note that this form can also be applied to the oscillators 102 to 105 according to the second to fifth embodiments.

1-7. Seventh Embodiment

Figure 21:
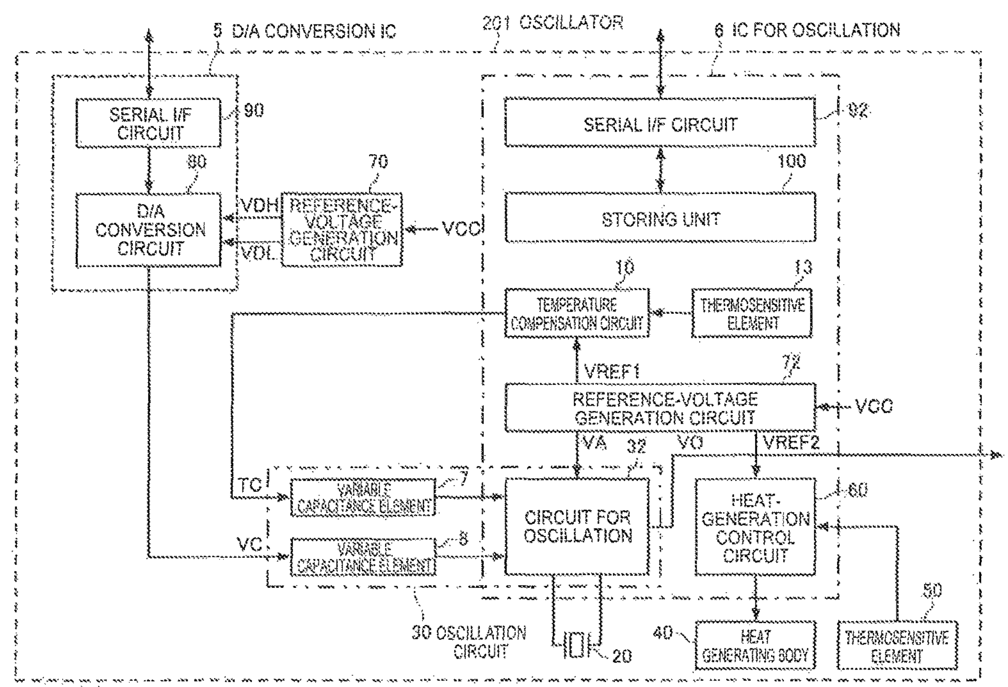
FIG. 21 is a functional block diagram of an oscillator according to a seventh embodiment.
Figure 22:
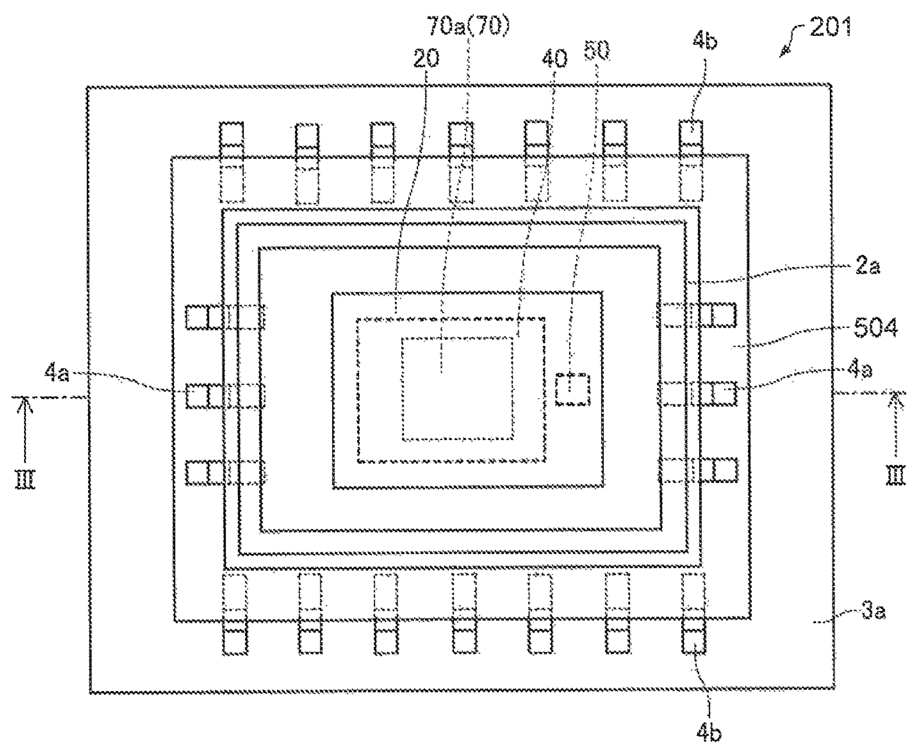
FIG. 22 is a plan view schematically showing the oscillator according to the seventh embodiment.
Figure 23:
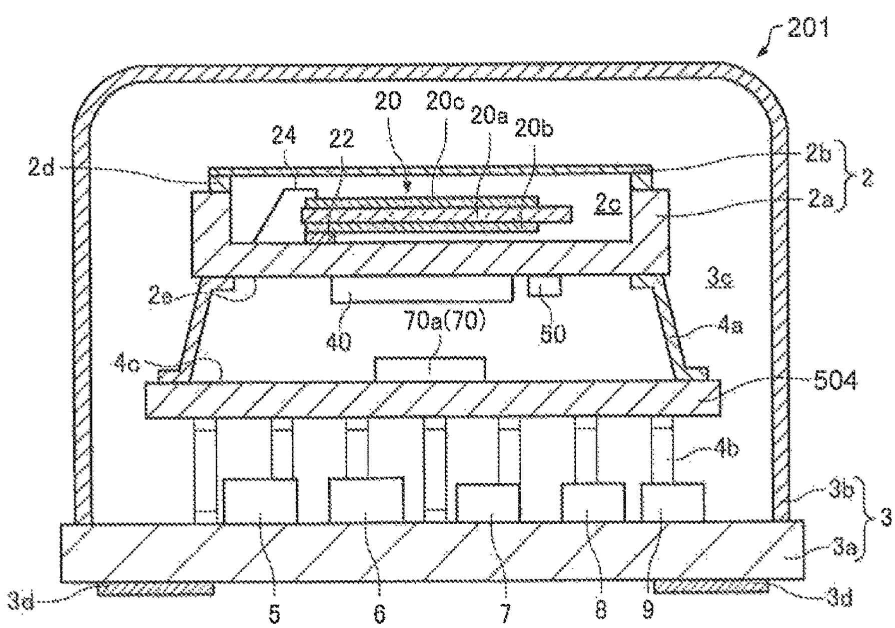
FIG. 23 is a sectional view schematically showing the oscillator according to the seventh embodiment.

FIG. 21 is an example of a functional block diagram of an oscillator according to a seventh embodiment. FIG. 22 is a plan view schematically showing the oscillator according to the seventh embodiment. FIG. 23 is a sectional view schematically showing the oscillator according to the seventh embodiment and is a III-III line sectional view of FIG. 22.

As shown in FIG. 21, an oscillator 201 according to the seventh embodiment includes the vibrator element (the resonator) 20, the D/A conversion integrated circuit (IC) 5, the integrate circuit (IC) for oscillation 6, the variable capacitance element 7, the variable capacitance element 8, the heating element 40, the thermosensitive element 50, and the reference-voltage generation circuit 70. However, in the oscillator 201 according to this embodiment, a part of the components shown in FIG. 21 may be omitted or changed or other components may be added.

As shown in FIGS. 22 and 23, the oscillator 201 according to the seventh embodiment further includes the first container 2 (an example of the container), the second container 3, a supporting substrate 504 (an example of the first substrate), first supporting bodies 4*a*, and second supporting bodies 4*b*.

As shown in FIGS. 22 and 23, the first container 2 houses the vibrator element 20. Note that the first container 2 may house other members configuring the oscillator 201. The first container 2 includes the package 2*a* and the lid 2*b*. Note that, for convenience, in FIG. 2, the lid 2*b* is not shown.

The package 2*a* is, for example, a ceramic package. The package 2*a* is, for example, a ceramic stacked package formed by molding and stacking a ceramic green sheet and then baking the ceramic green sheet. The package 2*a* includes a recess. The vibrator element 20 is housed in the space (the housing chamber) 2*c* in the recess. In the example shown in the figures, an opening is provided in an upper part of the package 2*a*. The housing chamber 2*c* is formed by covering the opening with the lid 2*b*. The housing chamber 2*c* is, for example, a decompressed atmosphere (a vacuum state). Note that the housing chamber 2*c* may be an inert gas atmosphere of nitrogen, argon, helium, or the like.

Note that, although not shown in the figures, in the package 2*a*, electrodes electrically connected to the excitation electrodes 20*b* and 20*c* of the vibrator element 20, a wire for electrically connecting an external terminal provided on the lower surface of the package 2*a* and the vibrator element 20, and the like are provided.

The lid 2*b* covers the opening of the package 2*a*. The shape of the lid 2*b* is, for example, a plate shape. As the lid 2*b*, for example, a plate member (e.g., a ceramics plate) made of a material same as the material of the package 2*a* and metal plates of Kovar, a 42 alloy, stainless steel, and the like can be used. The lid 2*b* is connected to the package 2*a* via the joining member 2*d* such as a seal ring, low-melting point glass, or an adhesive.

In the oscillator 201, the inside of the first container 2 (the space (the housing chamber 2*c*) formed by the first container 2) is used as a thermostatic bath to perform control to keep, with the heating element 40, the temperature of the inside of the first container 2 (the inside of the thermostatic bath) constant.

The vibrator element 20 is housed on the inside of the first container 2. The vibrator element 20 is mounted (disposed) on the package 2*a*. In the example shown in the figures, the vibrator element 20 is joined on the package 2*a* via the joining member 22. Examples of the joining member 22 include silver paste, solder, a conductive adhesive (an adhesive obtained by dispersing a conductive filler such as metal particles in a resin material).

The vibrator element 20 is, for example, a quartz crystal vibrator of SC cut. The vibrator element 20 includes the crystal substrate 20*a* and the excitation electrodes 20*b* and 20*c*. Note that, for convenience, in FIG. 22, the vibrator element 20 is simplified and shown.

As the crystal substrate 20*a*, an SC cut crystal substrate (piezoelectric substrate) is used. A plane shape of the crystal substrate 20*a* (a shape viewed from the thickness direction of the crystal substrate 20*a*) is, for example, a circle, an ellipse, a square, or other polygons.

The first excitation electrode 20*b* and the second excitation electrode 20*c* are provided to sandwich the crystal substrate 20*a*. The excitation electrodes 20*b* and 20*c* apply a voltage to the crystal substrate 20*a* to vibrate the crystal substrate 20*a*.

The first excitation electrode 20*b* is provided on the lower surface of the crystal substrate 20*a*. The first excitation electrode 20*b* is electrically connected to, via an extraction electrode provided on the lower surface of the crystal substrate 20*a* and the joining member 22, an electrode provided on the package 2*a*.

The second excitation electrode 20*c* is provided on the upper surface of the crystal substrate 20*a*. The second excitation electrode 20*c* is electrically connected to, via an extraction electrode provided on the upper surface of the crystal substrate 20*a* and the bonding wire 24, the electrode (not shown in the figures) provided on the package 2*a*. Note that, in FIG. 22, for convenience, the bonding wire 24 is not shown. As the excitation electrodes 20*b* and 20*c*, for example, electrodes obtained by stacking chrome and gold in this order from the crystal substrate 20*a* side are used.

Note that the vibrator element 20 is not limited to the quartz crystal vibrator of the SC cut. For example, quartz crystal vibrators of AT cut and BT cut and an SAW (Surface Acoustic Wave) resonator can be used. As the vibrator element 20, a piezoelectric vibrator, an MEMS (Micro Electro Mechanical Systems) vibrator, and the like other than the quartz crystal vibrator can also be used. As a substrate material of the vibrator element 20, piezoelectric material such as piezoelectric single crystal such as quartz crystal, lithium tantalate, and lithium niobate and piezoelectric ceramics such as lead zirconate titanate, a silicon semiconductor material, and the like can be used. As the exciting unit for the vibrator element 20, exciting means by a piezoelectric effect may be used or electrostatic driving by a Coulomb's force may be used.

The heating element 40 is disposed on an outer surface 2*e* of the first container 2. The outer surface 2*e* of the first container 2, on which the heating element 40 is disposed, is the lower surface of the package 2*a* and is a surface opposed to a principal plane 4*c* of the supporting substrate 504 (the upper surface of the supporting substrate 504). The heating element 40 is joined to the outer surface 2*e* of the first container 2 by a joining member (not shown in the figures) such as resin.

The heating element 40 is, for example, a heater. Elements (a power transistor, a resistor, etc.) that generate heat when an electric current is fed thereto can be used. The heating element 40 controls the temperature on the inside of the first container 2. The heating element 40 is controlled by the heat-generation control circuit 60 to keep the temperature on the inside (the housing chamber 2*c*) of the first container 2 constant (or substantially constant).

The thermosensitive element 50 is disposed on the outer surface 2*e* of the first container 2. The thermosensitive element 50 is disposed on the outer surface 2*e* of the first container 2 opposed to the supporting substrate 504 together with the heating element 40. The thermosensitive element 50 is joined to the outer surface 2*e* of the first container 2 by a joining member (not shown in the figures) such as resin.

As the thermosensitive element 50, for example, thermistors (an NTC (Negative Temperature Coefficient) thermistor, a PTC (Positive Temperature Coefficient) thermistor, etc.) and a platinum resistor can be used.

Note that, in an example shown in the figures, the heating element 40 and the thermosensitive element 50 are respectively disposed on the outer surface 2*e* of the first container 2 as separate elements. However, the heating element 40 (e.g., a power transistor) and the thermosensitive element 50 configure one semiconductor element and the semiconductor element may be disposed on the outer surface 2*e* of the first container 2.

The second container 3 includes the base substrate 3*a* (an example of the second substrate) and the cover 3*b*. Note that, for convenience, in FIG. 22, the cover 3*b* is not shown.

The base substrate 3*a* is formed of a material such as glass epoxy resin having insulation or ceramic. On the lower surface of the base substrate 3*a*, the external terminal 3*d* for electrically connecting an element housed on the inside of the second container 3 and an external apparatus or the like is provided.

The cover 3*b* is put over the base substrate 3*a* to form the space 3*c* in conjunction with the base substrate 3*a*. The material of the cover 3*b* is, for example, metal or resin. As the cover 3*b*, for example, a cover obtained by applying nickel plating to an iron-based alloy having low thermal conductivity such as a 42 alloy (an iron nickel alloy) may be used. The cover 3*b* is fixed on the base substrate 3*a* using solder or the like. The space 3*c* is, for example, a decompressed atmosphere (a vacuum state). Note that the space 3*c* may be an inert gas atmosphere of nitrogen, argon, helium, or the like. In the space 3*c* (on the inside of the second container 3), the first container 2, the supporting substrate 504, the supporting bodies 4*a* and 4*b*, the D/A conversion IC 5, the IC for oscillation 6, the variable capacitance element 7, the variable capacitance element 8, the electronic components 9, the heating element 40, the thermosensitive element 50, and the semiconductor element 70*a* (the reference-voltage generation circuit 70) are housed.

On the base substrate 3*a*, the D/A conversion IC 5, the IC for oscillation 6, the variable capacitance element 7, the variable capacitance element 8, and other one or more electronic components 9 (a resistor, a capacitor, a coil, etc.) are disposed (mounted). Terminals of the variable capacitance element 7, the variable capacitance element 8, the electronic components 9, the vibrator element 20, the heating element 40, the thermosensitive element 50, and the reference-voltage generation circuit 70 are respectively electrically connected to desired terminals of the D/A conversion IC 5 or the IC for oscillation 6 by not-shown wiring patterns.

The supporting substrate 504 is mounted on the base substrate 3*a* via the second supporting bodies 4*b*. The supporting substrate 504 is supported by the second supporting bodies 4*b* to be separated from the base substrate 3*a*. That is, a gap is present between the supporting substrate 504 and the base substrate 3*a*. The supporting substrate 504 and the base substrate 3*a* are not in contact with each other. The supporting substrate 504 is, for example, a tabular member. The material of the supporting substrate 504 is, for example, ceramic or glass epoxy resin.

The first container 2 is mounted on the supporting substrate 504 via the first supporting bodies 4*a*. The first container 2 is supported by the first supporting bodies 4*a* to be separated from the supporting substrate 504. That is, a gap is present between the supporting substrate 504 and the first container 2 (the package 2*a*). The supporting substrate 504 and the first container 2 (the package 2*a*) are not in contact with each other.

The semiconductor element 70*a* (the reference-voltage generation circuit 70) is mounted (disposed) on the supporting substrate 504. The semiconductor element 70*a* is disposed on the principal plane 4*c* of the supporting substrate 504. That is, the semiconductor element 70*a* is provided on the principal plane 4*c* of the supporting substrate 504 opposed to the outer surface 2*e* of the first container 2 on which the heating element 40 is disposed. For example, the semiconductor element 70*a* is disposed to overlap the heating element 40 in plan view. The semiconductor element 70*a* is desirably provided in the vicinity of the heating element 40. Note that, on the supporting substrate 504, other members configuring the oscillator 201 may be mounted. On the supporting substrate 504, although not shown in the figures, wires electrically connected to elements mounted on the supporting substrate 504 (e.g., a wire for electrically connecting the semiconductor element 70*a* and the D/A conversion IC 5 and a wire for supplying the power supply voltage VCC to the semiconductor element 70*a* from the outside of the oscillator 201), electrodes, and the like are provided.

The first supporting bodies 4*a* are provided on the supporting substrate 504 to support the first container 2. Six first supporting bodies 4*a* are provided in the example shown in the figures. The first container 2 is supported by the first supporting bodies 4*a*. The first container 2 is supported by the first supporting bodies 4*a* to be separated from the supporting substrate 504. The first supporting bodies 4*a* may function as a part of wires for electrically connecting the members disposed on the inside and the outer surface of the first container 2 and other members.

The second supporting bodies 4*b* are provided on the base substrate 3*a* to support the supporting substrate 504. Fourteen second supporting bodies 4*b* are provided in the example shown in the figures. The supporting substrate 504 is supported by the second supporting bodies 4*b*. The second supporting bodies 4*b* may function as a part of wires for electrically connecting the members mounted on the inside and the outer surface of the first container 2 and the members mounted on the supporting substrate 504 and other members.

The thermal conductivity of the second supporting bodies 4*b* is smaller than the thermal conductivity of the first supporting bodies 4*a*. This makes it possible to prevent heat from being easily transferred to the second supporting bodies 4*b* compared with the first supporting bodies 4*a*. For example, as the material of the first supporting bodies 4*a*, any one kind of gold, copper, tungsten, silver, and aluminum or an alloy containing one kind or more of the materials is used. As the material of the second supporting bodies 4*b*, any one kind of iron, titanium, and platinum or an alloy containing one or more kinds of the materials is used. In particular, a copper-based material is desirable as the material of the first supporting bodies 4*a*. Kovar or a 42 alloy, which is an iron-based alloy, is desirably used as the material of the second supporting bodies 4*b*.

In the oscillator 201 according to this embodiment, heat generated in the heating element 40 is transferred to the package 2*a* and transferred to the vibrator element 20 via the package 2*a* and the joining member 22. Consequently, the vibrator element 20 and the inside of the first container 2 are heated. The heat generated in the heating element 40 is transferred to the semiconductor element 70*a* (the reference-voltage generation circuit 70) via the package 2*a*, the first supporting bodies 4*a*, and the supporting substrate 504. Further, the heat generated in the heating element 40 is transferred to the semiconductor element 70*a* as radiant heat via a space between the heating element 40 and the semiconductor element 70*a*. In this way, the heat generated in the heating element 40 is transferred to the semiconductor element 70*a* by the heat conduction and the radiation and the semiconductor element 70*a* is heated. The heating element 40 is controlled by the heat-generation control circuit 60 to keep temperature constant as explained below. Therefore, the temperature of the vibrator element 20 and the temperature of the semiconductor element 70*a* are kept constant (substantially constant).

As shown in FIG. 21, the reference-voltage generation circuit 70 generates the high-potential side reference voltage VDH and the low-potential side reference voltage VDL of the D/A conversion circuit 80 on the basis of the power supply voltage VCC supplied from the outside of the oscillator 201 and supplies the high-potential side reference voltage VDH and the low-potential side reference voltage VDL to the D/A conversion circuit 80. The reference-voltage generation circuit 70 includes, for example, a regulator.

The D/A conversion IC 5 includes the D/A conversion circuit 80 (the D/A converter) and the serial interface circuit 90. However, in the D/A conversion IC 5, a part of the components may be omitted or changed or other components may be added.

The serial interface circuit 90 acquires a serial data signal (digital data for controlling the frequency of the oscillation circuit 30) input from the outside of the D/A conversion IC 5 (the outside of the oscillator 201), converts the serial data signal into an N-bit data signal, and outputs the N-bit data signal to the D/A conversion circuit 80.

The N-bit data signal (the digital data for controlling the frequency of the oscillation circuit 30) output by the serial interface circuit 90 is input to the D/A conversion circuit 80. The D/A conversion circuit 80 converts the N-bit data signal into an analog signal of a voltage between the high-potential side reference voltage VDH and the low-potential side reference voltage VDL and outputs the analog signal. As the D/A conversion circuit 80, D/A conversion circuits of well-known various types such as a resistance voltage dividing type (also called voltage distribution type, resistance string type, or voltage potentiometer type), a resistance ladder type (an R-2R ladder type, etc.), a capacitive array type, and a delta/sigma type can be used.

A voltage (a control voltage) VC of the analog signal output by the D/A conversion circuit 80 is applied to the variable capacitance element 8 on the outside of the D/A conversion IC 5. A capacitance value of the variable capacitance element 8 changes according to the control voltage VC. The variable capacitance element 8 may be, for example, a varicap diode (a varactor), a capacitance value of which changes according to the control voltage VC applied to one end thereof.

The IC for oscillation 6 includes the temperature compensation circuit 10, the thermosensitive element 13, the circuit for oscillation 32, the heat-generation control circuit 60, the reference-voltage generation circuit 72, the serial interface circuit 92, and the storing unit 100. However, in the IC for oscillation 6, a part of the components may be omitted or changed or other components may be added.

The temperature compensation circuit 10 is connected to the thermosensitive element 13. The temperature compensation circuit 10 generates, according to an output signal of the thermosensitive element 13, the temperature compensation voltage TC for correcting a frequency temperature characteristic of an output signal of the oscillation circuit 30. For example, the temperature compensation circuit 10 may be capable of performing only correction of a primary component of the frequency temperature characteristic of the output signal of the oscillation circuit 30 (hereinafter referred to as "primary correction"), may be capable of performing only correction of a secondary component (hereinafter referred to as "secondary correction"), or may be capable of performing both of the primary correction and the secondary correction. When the temperature compensation circuit 10 is capable of performing both of the primary correction and the secondary correction, the temperature compensation circuit 10 may be capable of independently setting whether the primary correction and the secondary correction are respectively enabled or disabled or may be capable of setting a correction parameter of the primary correction and a correction parameter of the secondary correction independently from each other. Further, the temperature compensation circuit 10 may be capable of performing the secondary correction in a plurality of temperature regions (e.g., a low temperature side and a high temperature side) independently from one another.

The thermosensitive element 13 may output, for example, a voltage corresponding to the temperature around the thermosensitive element 13. The thermosensitive element 13 may be a thermosensitive element of a positive polarity having a higher output voltage as temperature is higher or may be a thermosensitive element of a negative polarity having a lower output voltage as temperature is higher.

The temperature compensation voltage TC output by the temperature compensation circuit 10 is applied to the variable capacitance element 7 on the outside of the IC for oscillation 6. A capacitance value of the variable capacitance element 7 changes according to the temperature compensation voltage TC. The variable capacitance element 7 may be a varicap diode (a varactor), a capacitance value of which changes according to the temperature compensation voltage TC applied to one end thereof.

The circuit for oscillation 32 configures the oscillation circuit 30, which causes the vibrator element 20 to oscillate, in conjunction with the variable capacitance element 7, the variable capacitance element 8, and the other electronic components 9 (not shown in FIG. 21) externally attached to terminals of the IC for oscillation 6.

The oscillation circuit 30 is electrically connected to the vibrator element 20. The oscillation circuit 30 causes the vibrator element 20 to oscillate at a frequency corresponding to a capacitance value of the variable capacitance element 7 and a capacitance value of the variable capacitance element 8 and outputs an oscillation signal VO. The oscillation signal VO output by the oscillation circuit 30 is output to the outside of the IC for oscillation 6 (the outside of the oscillator 201).

The heat-generation control circuit 60 controls, on the basis of an output voltage of the thermosensitive element 50, the heating element 40 for heating the vibrator element 20. Specifically, the heat-generation control circuit 60 controls, according to the output voltage of the thermosensitive element 50, heat generation of the heating element 40 to keep temperature constant.

For example, the thermosensitive element 50 having a temperature characteristic of a positive gradient may be disposed on the outer surface 2*e* of the first container 2. The heat-generation control circuit 60 may perform control to feed an electric current to the heating element 40 to cause the heating element 40 to generate heat when the output voltage of the thermosensitive element 50 is smaller than a reference value and not to feed an electric current to the heating element 40 when the output voltage of the thermosensitive element 50 is larger than the reference value.

The reference-voltage generation circuit 72 generates, on the basis of the power supply voltage VCC supplied from the outside of the IC for oscillation 6 (the outside of the oscillator 201), the power supply voltage VA of the oscillation circuit 30, the reference voltage VREF1 of the temperature compensation circuit 10, the reference voltage VREF2 of the heat-generation control circuit 60, and the like.

The storing unit 100 includes a nonvolatile memory and a register not shown in the figures. In the nonvolatile memory, setting information of the temperature compensation circuit 10 (information concerning whether the primary correction and the secondary correction are respectively performed, a correction parameter of the primary correction, a correction parameter of the secondary correction, etc.) and the like are stored. The nonvolatile memory can be realized by, for example, a flash memory such as an MONOS (Metal-Oxide-Nitride-Oxide-Silicon) memory and an EEPROM (Electrically Erasable Programmable Read-Only Memory).

The setting information stored in the nonvolatile memory is transferred from the nonvolatile memory to the register when a power supply of the IC for oscillation 6 is turned on (when the power supply voltage VCC rises from 0 V to a desired voltage) and retained in the register. The setting information retained in the register is supplied to the temperature compensation circuit 10 and the like.

The serial interface circuit 92 is a circuit for performing read/write on the storing unit 100 (the nonvolatile memory and the register) from the outside of the IC for oscillation 6 (the outside of the oscillator 201). The serial interface circuit 92 may be, for example, an interface circuit corresponding to an $I^2C$ (Inter-integrated Circuit) bus or may be, for example, an interface circuit corresponding to a SPI (Serial Peripheral Interface) bus.

Figure 24:
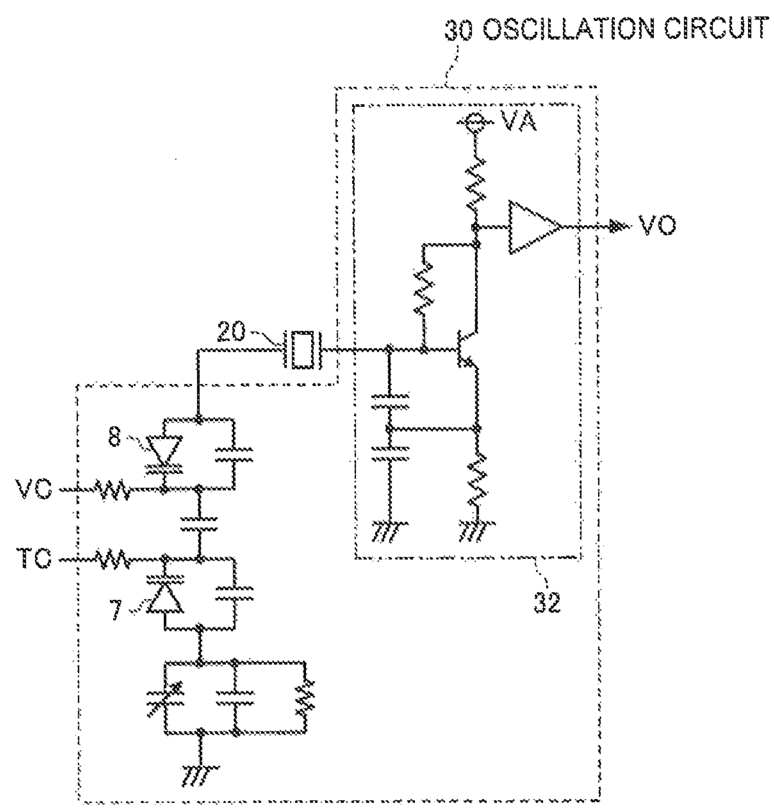
FIG. 24 is a diagram showing a configuration example of an oscillation circuit.

FIG. 24 is a diagram showing a configuration example of the oscillation circuit 30. In the oscillation circuit 30 shown in FIG. 24, the control voltage VC is applied to one end of the variable capacitance element 8 (the varicap diode), the capacitance value of the variable capacitance element 8 changes according to a voltage value of the control voltage VC, and an oscillation frequency changes according to the change in the capacitance value. The temperature compensation voltage TC is applied to one end of the variable capacitance element 7 (the varicap diode), the capacitance value of the variable capacitance element 7 changes according to a voltage value of the temperature compensation voltage TC, and the oscillation frequency is kept substantially constant according to the change in the capacitance value irrespective of temperature.

Figure 25:
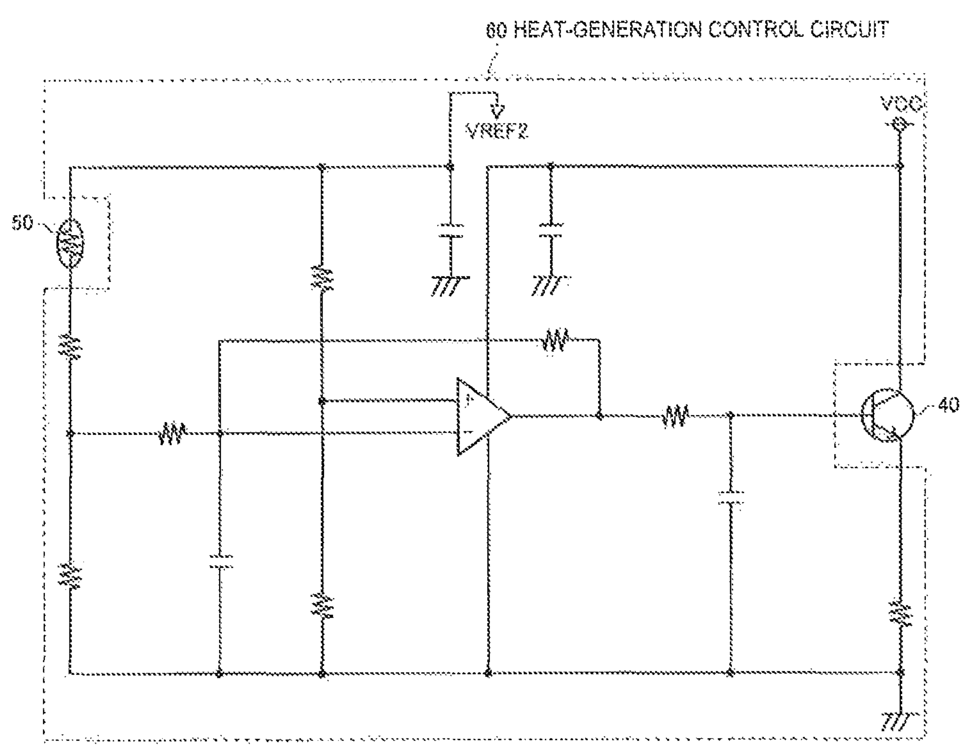
FIG. 25 is a diagram showing a configuration example of a heat-generation control circuit.

FIG. 25 is a diagram showing a configuration example of the heat-generation control circuit 60. In FIG. 25, an NPN-type power transistor is used as the heating element 40. An NTC thermistor is used as the thermosensitive element 50. In the heat-generation control circuit 60 shown in FIG. 25, when temperature drops, a resistance value of the thermosensitive element 50 (the NTC thermistor) increases and an input potential difference of an operational amplifier increases. Conversely, when temperature rises, the resistance value of the thermosensitive element 50 (the NTC thermistor) decreases and the input potential difference of the operational amplifier decreases. An output voltage of the operational amplifier is proportional to the input potential difference. When the output voltage of the operational amplifier is larger than a predetermined voltage value, a more electric current flows to the heating element 40 (the NPN-type power transistor) and a heat generation amount of the heating element 40 increases as the voltage value is larger. When the output voltage of the operational amplifier is smaller than the predetermined voltage value, an electric current does not flow to the heating element 40 and the heat generation amount gradually decreases. Therefore, the operation of the heating element 40 is controlled to set the resistance value of the thermosensitive element 50 (the NTC thermistor) to a desired value, that is, keep the temperature at a desired temperature.

In the oscillator 201 according to this embodiment having such a configuration, the heat-generation control circuit 60 performs, on the basis of the frequency temperature characteristic of the output signal of the oscillation circuit 30 determined according to temperature characteristics of the vibrator element 20, the ICs (the D/A conversion IC 5 and the IC for oscillation 6), and the like, control to keep the internal temperature of the first container 2 (the internal temperature of the thermostatic bath) at a desired temperature (e.g., if the vibrator element 20 is an SC cut quartz crystal vibrator, temperature at which a frequency is maximized).

Figure 26:
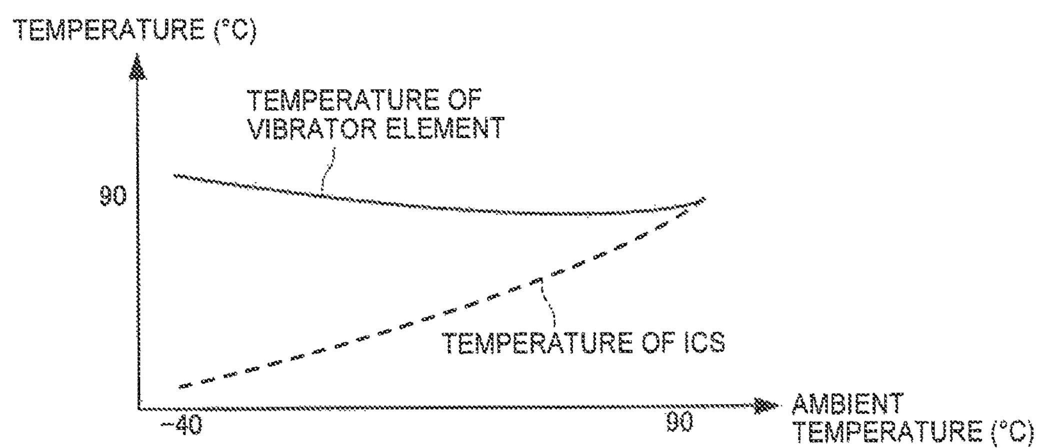
FIG. 26 is a diagram showing a temperature change of a vibrator and a temperature change of ICs with respect to a change in an ambient temperature.

However, the temperature in the thermostatic bath (the inside of the first container 2) is sometimes not constant because the temperature changes according to the ambient temperature of the oscillator 201. FIG. 26 is a diagram showing, in the oscillator 201 having the structure shown in FIGS. 22 and 23, an example of states of a temperature change of the vibrator element 20 and a temperature change of the ICs (the D/A conversion IC 5 and the IC for oscillation 6) due to a change in the ambient temperature of the oscillator 201. Since the vibrator element 20 is housed in the first container 2, the vibrator element 20 is less easily affected by the ambient temperature. However, as shown in FIG. 26, when the ambient temperature changes in a range of −40° C. to 90° C., the temperature of the vibrator element 20 also slightly changes. The temperature of the ICs (the D/A conversion IC 5 and the IC for oscillation 6) disposed on the outside the thermostatic bath (the outside of the first container 2) is more easily affected by the ambient temperature compared with the vibrator element 20 disposed in the thermostatic bath.

In this embodiment, the temperature compensation circuit 10 corrects a frequency deviation caused by the temperature change of the vibrator element 20 and the temperature change of the ICs due to the change in the ambient temperature. In particular, since the temperature change of the ICs due to the change in the ambient temperature is large, the temperature compensation circuit 10 is provided on the inside of the IC for oscillation 6 separately from the thermosensitive element 50. By generating the temperature compensation voltage TC on the basis of the output signal of the thermosensitive element 13 that more accurately detects the temperature of the ICs, a frequency deviation mainly caused by the temperature change of the ICs is corrected. Consequently, it is possible to realize frequency stability higher than the frequency stability of the OCXO in the past.

The oscillator 201 according to the seventh embodiment explained above is a new thermostatic bath-type oscillator capable of controlling an oscillation frequency according to a digital signal input from an external terminal. In particular, in the oscillator 201 according to this embodiment, the frequency of the oscillation circuit 30 is controlled by applying the control voltage VC, which is output by the D/A conversion circuit 80, and the temperature compensation voltage TC, which is output by the temperature compensation circuit 10, respectively to the variable capacitance element 8 and the variable capacitance element 7 separate from each other rather than applying a voltage obtained by adding up the control voltage VC and the temperature compensation voltage TC to one variable capacitance element. Consequently, it is unnecessary to allocate a part of a voltage range of the output of the D/A conversion circuit 80 to temperature compensation. A full voltage range of the output of the D/A conversion circuit 80 is successfully allocated to a frequency control range. Therefore, with the oscillator 201 according to this embodiment, it is possible to expand the frequency control range while maintaining the resolution of frequency control. Alternatively, it is possible to increase the resolution of the frequency control while maintaining the frequency control range. In this way, according to this embodiment, it is possible to realize the oscillator 201 capable of performing temperature compensation without narrowing the frequency control range.

An output voltage of the reference-voltage generation circuit 70 (the regulator) greatly fluctuates because of temperature (see, for example, FIG. 77). However, in the oscillator 201 according to the seventh embodiment, since the reference-voltage generation circuit 70 is mounted on the supporting substrate 504, for example, compared with when the reference-voltage generation circuit 70 is mounted on the base substrate 3*a*, a temperature change of the reference-voltage generation circuit 70 due to the change in the ambient temperature of the oscillator 201 is small. Therefore, with the oscillator 201 according to this embodiment, it is possible to reduce fluctuation in the output voltage of the reference-voltage generation circuit 70 due to the change in the ambient temperature.

In this way, with the oscillator 201 according to this embodiment, it is possible to reduce the fluctuation in the output voltage of the reference-voltage generation circuit 70 due to the change in the ambient temperature. Therefore, it is possible to reduce fluctuation in an output voltage of the D/A conversion circuit 80 due to the fluctuation in the output voltage of the reference-voltage generation circuit 70. Consequently, it is possible to improve stability of the frequency (an output frequency) of the oscillator 201.

In the oscillator 201 according to the seventh embodiment, the outer surface 2*e* of the first container 2, on the heating element 40 is disposed, is opposed to the supporting substrate 504 on which the reference-voltage generation circuit 70 is mounted. Therefore, it is possible to set the heating element 40 and the reference-voltage generation circuit 70 close to each other. Further, it is possible to heat the reference-voltage generation circuit 70 with the radiant heat radiated from the heating element 40. Consequently, it is possible to further reduce the temperature change of the reference-voltage generation circuit 70 due to the change in the ambient temperature of the oscillator 201. It is possible to reduce the fluctuation in the output voltage of the reference-voltage generation circuit 70 due to the change in the ambient temperature.

In the oscillator 201 according to the seventh embodiment, since the thermal conductivity of the second supporting bodies 4*b* is smaller than the thermal conductivity of the first supporting bodies 4*a*, it possible to prevent heat from being easily transferred to the second supporting bodies 4*b* compared with the first supporting bodies 4*a*. Therefore, it is possible to efficiently transfer the heat generated in the heating element 40 to the supporting substrate 504 via the first supporting bodies 4*a*. It is possible to reduce an amount of heat escaping from the supporting substrate 504 via the second supporting bodies 4*b*. Therefore, it is possible to reduce a temperature difference between the first container 2 and the supporting substrate 504. It is possible to further reduce the fluctuation in the output voltage of the reference-voltage generation circuit 70 due to the change in the ambient temperature. Further, in the oscillator 201 according to this embodiment, since it is possible to reduce an amount of heat escaping to the outside from the supporting substrate 504 via the second supporting bodies 4*b*, it is possible to realize a reduction in power consumption.

Note that, in addition to setting the thermal conductivity of the second supporting bodies 4*b* smaller than the thermal conductivity of the first supporting bodies 4*a*, the second supporting bodies 4*b* may be formed in a shape that prevent heat from being easily transferred to the second supporting bodies 4*b* compared with the first supporting bodies 4*a*. For example, the sectional area of the second supporting bodies 4*b* may be set smaller than the sectional area of the first supporting bodies 4*a* or the length of the second supporting bodies 4*b* larger than the length of the first supporting bodies 4*a* to prevent heat from being easily transferred to the second supporting bodies 4*b* compared with the first supporting bodies 4*a*.

1-8. Eighth Embodiment

Figure 27:
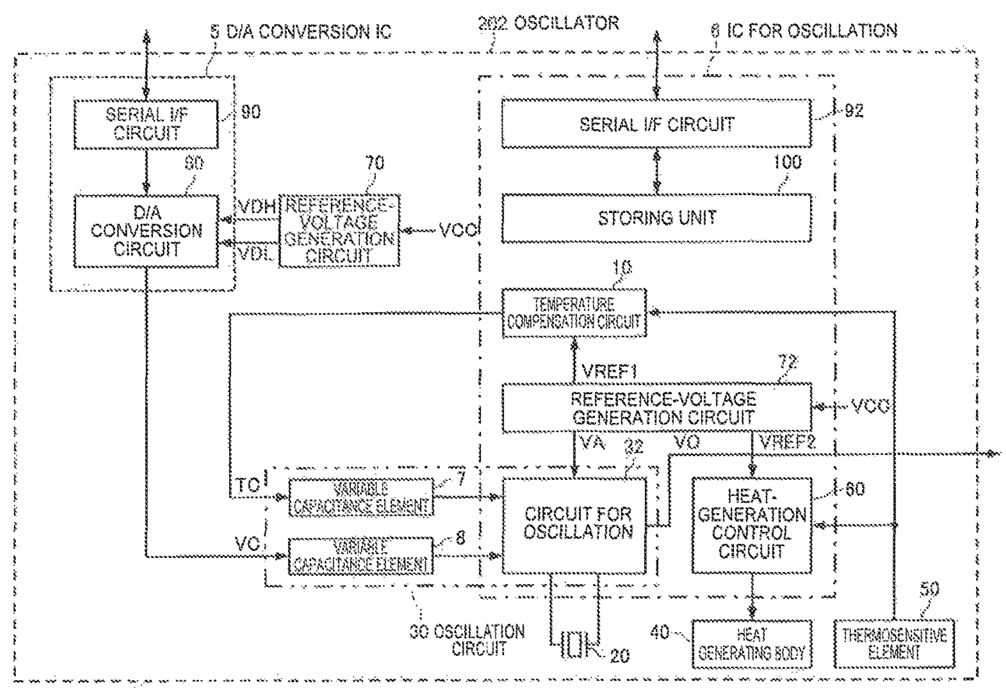
FIG. 27 is a functional block diagram of an oscillator according to an eighth embodiment.
Figure 28:
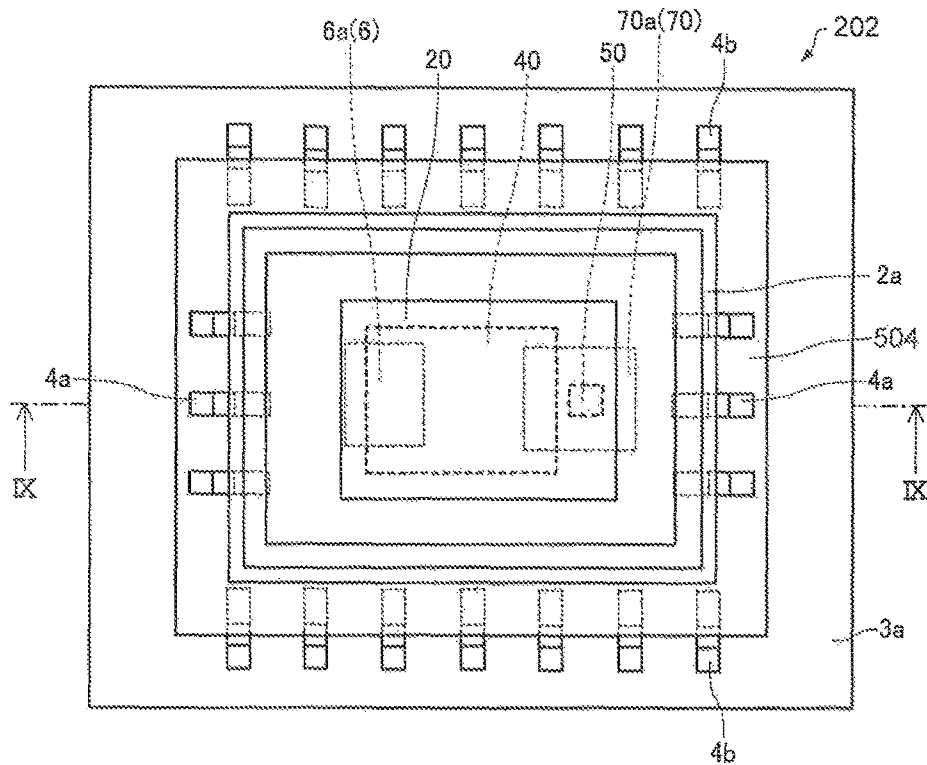
FIG. 28 is a plan view schematically showing the oscillator according to the eighth embodiment.
Figure 29:
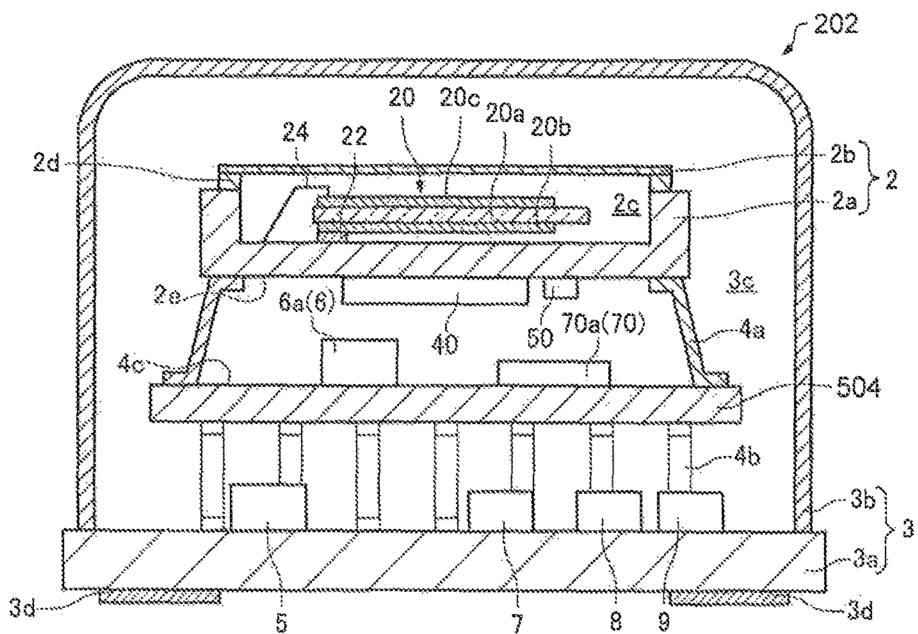
FIG. 29 is a sectional view schematically showing the oscillator according to the eighth embodiment.

FIG. 27 is an example of a functional block diagram of an oscillator according to an eighth embodiment. FIG. 28 is a plan view schematically showing the oscillator according to the eighth embodiment. FIG. 29 is a sectional view schematically showing the oscillator according to the eighth embodiment and is a IX-IX line sectional view of FIG. 28. In the following explanation, in the oscillator according to the eighth embodiment, members having functions same as the functions of the constituent members of the oscillator according to the seventh embodiment are denoted by the same reference numerals and signs. Explanation of the members is omitted.

In an oscillator 202 according to the eighth embodiment, as shown in FIGS. 27 to 29, the oscillation circuit 30 includes the circuit for oscillation 32 and electronic components such as the variable capacitance elements 7 and 8 and the electronic components 9. The IC for oscillation 6 including the circuit for oscillation 32 is configured by one semiconductor element 6*a*.

The semiconductor element 6*a* is mounted on the supporting substrate 504 together with the semiconductor element 70*a* (the reference-voltage generation circuit 70). The semiconductor element 6*a* is disposed on the principal plane 4*c* of the supporting substrate 504. The semiconductor element 6*a* is joined to the supporting substrate 504 by a joining member (not shown in the figures) such as an adhesive. The semiconductor element 6*a* is electrically connected to an electrode (not shown in the figures) disposed on the supporting substrate 504 and a wire.

The electronic components 7, 8, and 9 configuring the oscillation circuit 30 are mounted (disposed) on the base substrate 3*a*.

Figure 30:
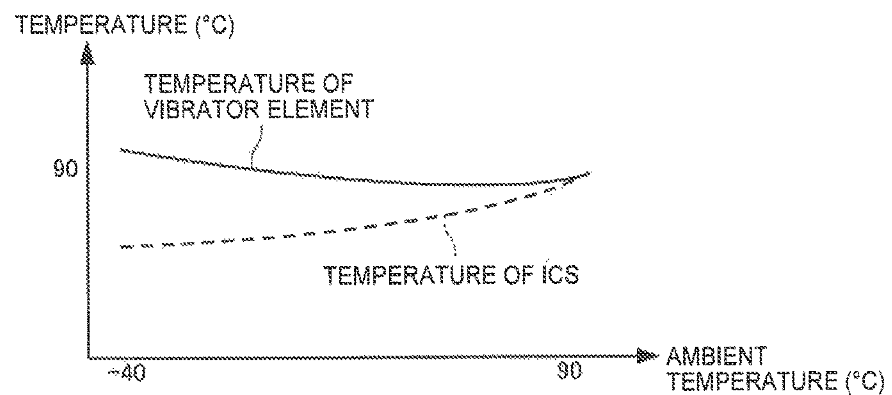
FIG. 30 is a diagram showing a temperature change of a vibrator and a temperature change of ICs with respect to a change in an ambient temperature.

In the oscillator 202 according to the eighth embodiment, the IC for oscillation 6 is mounted on the supporting substrate 504. Therefore, compared with the oscillator 201 according to the seventh embodiment in which the IC for oscillation 6 is mounted on the base substrate 3*a*, the IC for oscillation 6 is less easily affected by an ambient temperature. FIG. 30 is a diagram showing, in the oscillator 202 according to the eighth embodiment, states of a temperature change of the vibrator element 20 and a temperature change of the IC for oscillation 6 due to a change in an ambient temperature of the oscillator 202. As shown in FIG. 30, in the oscillator 202 according to the eighth embodiment, compared with the oscillator 201 (FIG. 26) according to the seventh embodiment, the temperature change of the IC for oscillation 6 due to the change in the ambient temperature of the oscillator 202 is small and a temperature difference between the IC for oscillation 6 and the vibrator element 20 is also small.

Therefore, as shown in FIG. 27, in the oscillator 202 according to the eighth embodiment, unlike the oscillator 201 according to the seventh embodiment, the thermosensitive element 13 is not provided in the IC for oscillation 6. The temperature compensation circuit 10 is connected to the thermosensitive element 50. That is, in the oscillator 202 according to the eighth embodiment, since the temperature difference between the IC for oscillation 6 and the vibrator element 20 is small, the IC for oscillation 6 is reduced in size by using the thermosensitive element 50 for both of heat generation control by the heat-generation control circuit 60 and temperature compensation by the temperature compensation circuit 10. There is a slight difference between temperature detected by the thermosensitive element 50 (substantially equal to the temperature of the vibrator element 20) and the actual temperature of the IC for oscillation 6. However, the difference is within a range in which sufficient temperature compensation by the temperature compensation circuit 10 is possible. Therefore, the oscillator 202 according to the eighth embodiment is advantageous for a reduction in manufacturing costs and a reduction in size while realizing high frequency stability.

Note that, although not shown in the figures, in the oscillator 202 according to the eighth embodiment, as in the oscillator 201 according to the seventh embodiment shown in FIG. 21, the thermosensitive element 13 may be provided in the IC for oscillation 6 and the temperature compensation circuit 10 may be connected to the thermosensitive element 13.

An output voltage of the circuit for oscillation 32 fluctuates because of temperature. However, in the oscillator 202 according to the eighth embodiment, since the reference-voltage generation circuit 70 and the circuit for oscillation 32 (the semiconductor element 6*a*) are mounted on the supporting substrate 504, for example, compared with when the reference-voltage generation circuit 70 and the circuit for oscillation 32 are disposed on the base substrate 3*a*, temperature changes of the reference-voltage generation circuit 70 and the circuit for oscillation 32 due to the change in the ambient temperature of the oscillator 202 are small. Therefore, with the oscillator 202 according to this embodiment, it is possible to reduce fluctuation in an output voltage of the reference-voltage generation circuit 70 and fluctuation in the output voltage of the circuit for oscillation 32 due to the change in the ambient temperature. Consequently, it is possible to further improve stability of the frequency of the oscillator 202.

1-9. Ninth Embodiment

Figure 31:
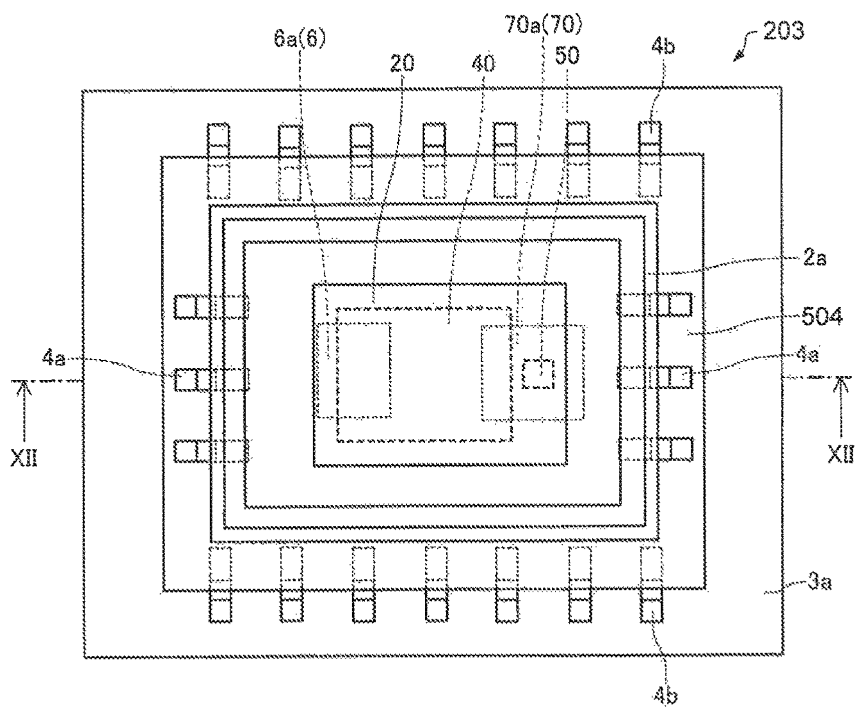
FIG. 31 is a plan view schematically showing an oscillator according to a ninth embodiment.
Figure 32:
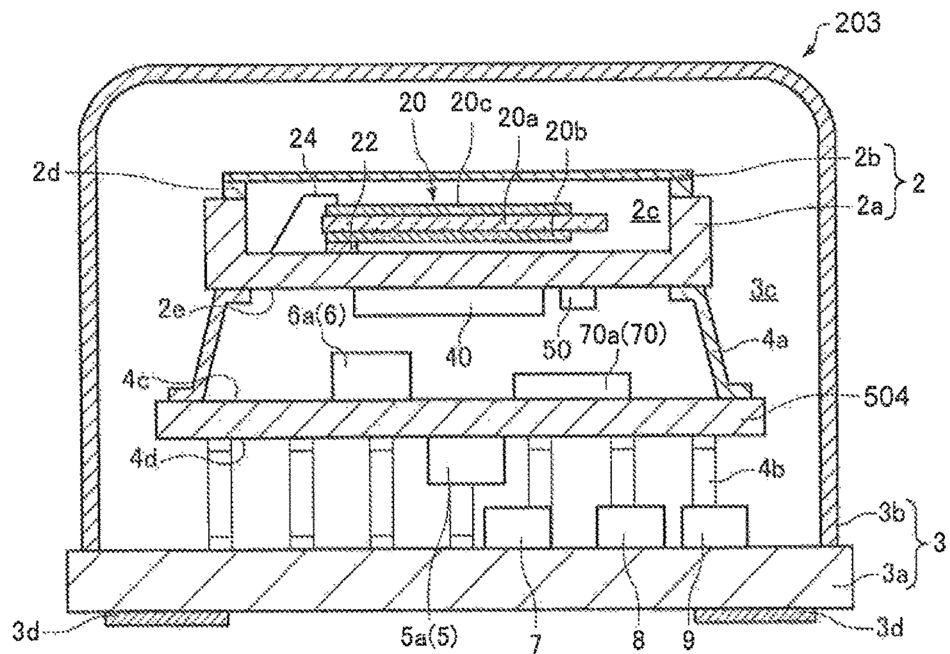
FIG. 32 is a sectional view schematically showing the oscillator according to the ninth embodiment.

FIG. 31 is a plan view schematically showing an oscillator according to a ninth embodiment. FIG. 32 is a sectional view schematically showing the oscillator according to the ninth embodiment and is a XII-XII line sectional view of FIG. 31. Note that a functional block diagram of the oscillator according to the ninth embodiment is the same as the functional block diagram of the oscillator according to the eighth embodiment shown in FIG. 27. The functional block diagram is omitted. In the following explanation, in the oscillator according to the ninth embodiment, members having functions same as the functions of the constituent members of the oscillators according to the seventh and eighth embodiments are denoted by the same reference numerals and signs. Explanation of the members is omitted.

In an oscillator 203 according to the ninth embodiment, as shown in FIGS. 27, 31, and 32, the D/A conversion IC 5 including the D/A conversion circuit 80 is configured by the semiconductor element 5*a*. The semiconductor element 5*a* is mounted on the supporting substrate 504. The semiconductor element 5*a* is mounted on a principal plane 4*d* on the opposite side of the principal plane 4*c* of the supporting substrate 504 on which the semiconductor element 70*a* (the reference-voltage generation circuit 70) and the semiconductor element 6*a* (the IC for oscillation 6) are disposed. The semiconductor element 5*a* is joined to the supporting substrate 504 by a joining member (not shown in the figures) such as an adhesive.

An output voltage of the D/A conversion circuit 80 fluctuates because of temperature. However, in the oscillator 203 according to the ninth embodiment, since the reference-voltage generation circuit 70 and the D/A conversion circuit 80 (the semiconductor element 5*a*) are mounted on the supporting substrate 504, for example, compared with the reference-voltage generation circuit 70 and the D/A conversion circuit 80 are mounted on the base substrate 3*a*, temperature changes of the reference-voltage generation circuit 70 and the D/A conversion circuit 80 due to a change in an ambient temperature of the oscillator 203 are small. Therefore, with the oscillator 203 according to this embodiment, it is possible to reduce fluctuation in an output voltage of the reference-voltage generation circuit 70 and fluctuation in the output voltage of the D/A conversion circuit 80 due to the change in the ambient temperature. Consequently, it is possible to further improve stability of the frequency of the oscillator 203.

Further, in the oscillator 203 according to the ninth embodiment, since the circuit for oscillation 32 (the semiconductor element 6*a*) is mounted on the supporting substrate 504, it is possible to reduce fluctuation in an output voltage of the circuit for oscillation 32 due to the change in the ambient temperature. Consequently, it is possible to further improve stability of the frequency of the oscillator 203.

1-10. Tenth Embodiment

Figure 33:
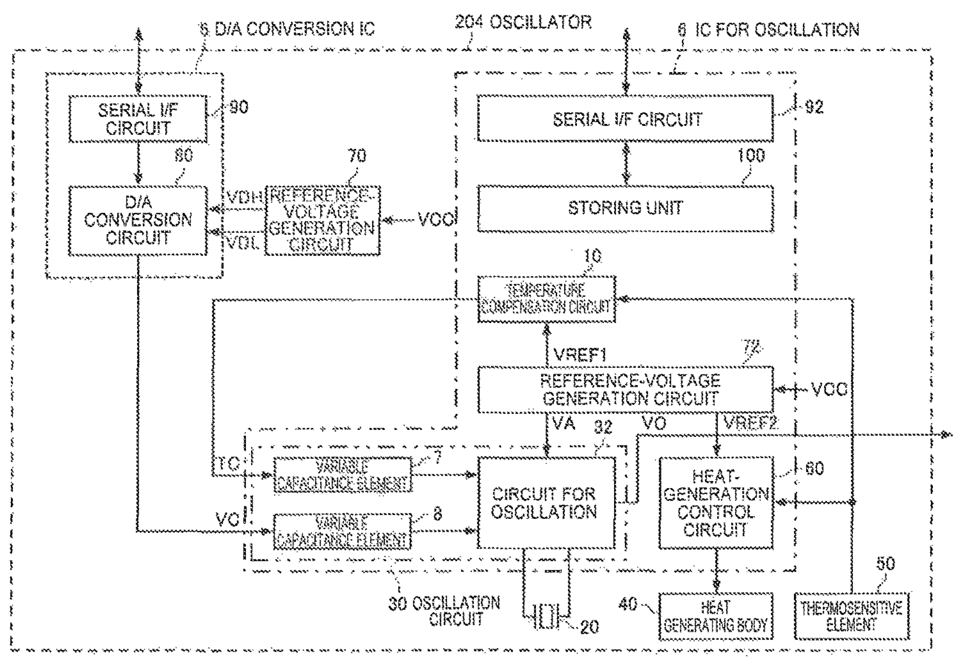
FIG. 33 is a functional block diagram of an oscillator according to a tenth embodiment.
Figure 34:
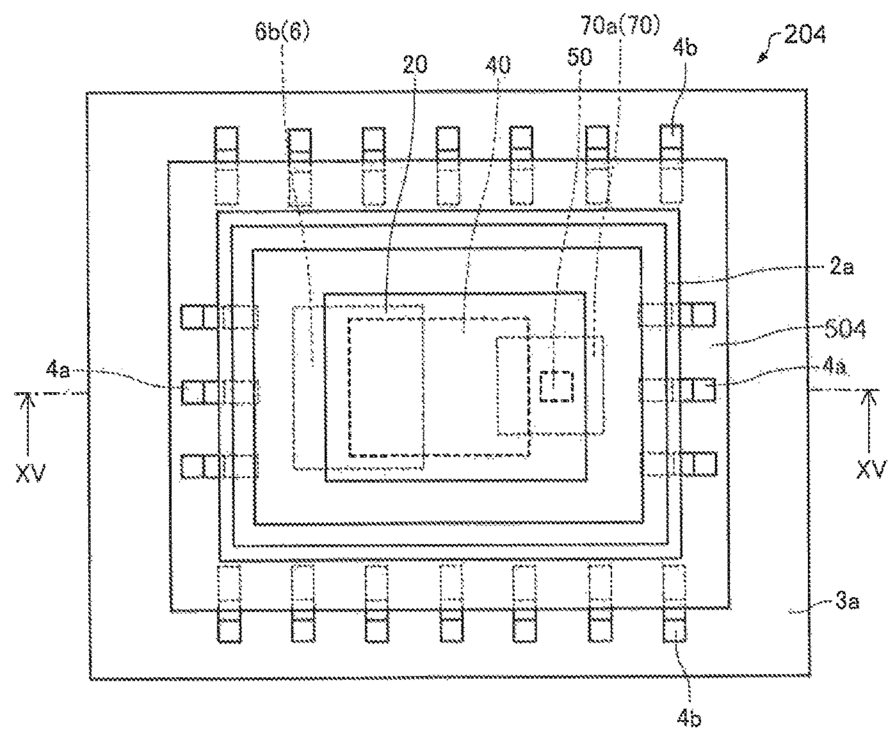
FIG. 34 is a plan view schematically showing the oscillator according to the tenth embodiment.
Figure 35:
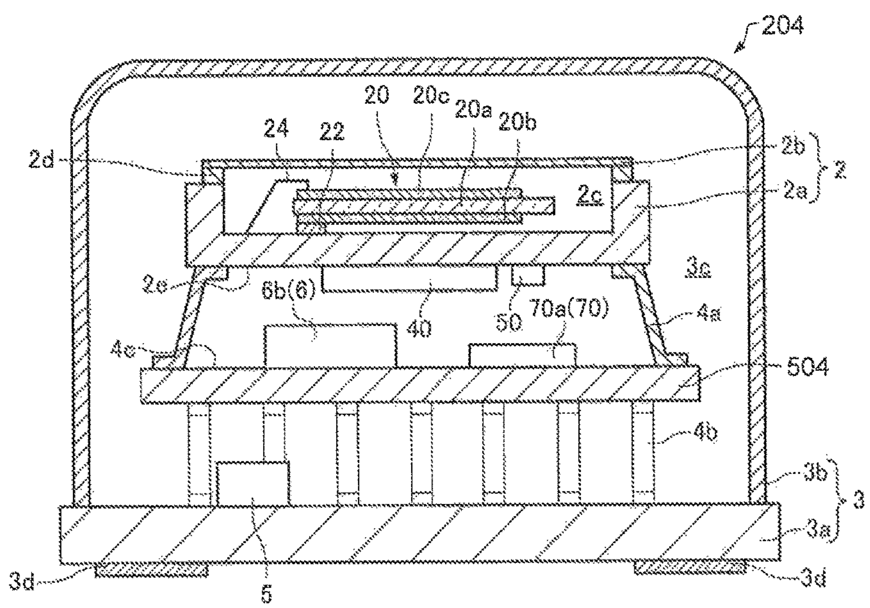
FIG. 35 is a sectional view schematically showing the oscillator according to the tenth embodiment.

FIG. 33 is an example of a functional block diagram of an oscillator according to a tenth embodiment. FIG. 34 is a plan view schematically showing the oscillator according to the tenth embodiment. FIG. 35 is a sectional view schematically showing the oscillator according to the tenth embodiment and is a XV-XV line sectional view of FIG. 34. In the following explanation, in the oscillator according to the tenth embodiment, members having functions same as the functions of the constituent members of the oscillators according to the seventh to ninth embodiments are denoted by the same reference numerals and signs. Explanation of the members is omitted.

In an oscillator 204 according to the tenth embodiment, as shown in FIG. 33, the IC for oscillation 6 further includes the variable capacitance element 7 and the variable capacitance element 8 in addition to the temperature compensation circuit 10, the circuit for oscillation 32, the heat-generation control circuit 60, the reference-voltage generation circuit 72, the serial interface circuit 92, and the storing unit 100. Although not shown in FIG. 33, the IC for oscillation 6 further includes the electronic components 9. That is, the IC for oscillation 6 further includes the oscillation circuit 30.

The IC for oscillation 6 is configured by the semiconductor element 6*b*. As shown in FIGS. 34 and 35, the semiconductor element 6*b* is mounted on the supporting substrate 504 together with the semiconductor element 70*a* (the reference-voltage generation circuit 70). The semiconductor element 6*b* is mounted on the principal plane 4*c* of the supporting substrate 504.

An output voltage of the oscillation circuit 30 fluctuates because of temperature. However, in the oscillator 204 according to the tenth embodiment, since the reference-voltage generation circuit 70 and the oscillation circuit 30 are mounted on the supporting substrate 504, for example, compared with when the reference-voltage generation circuit 70 and the oscillation circuit 30 are mounted on the base substrate 3*a*, temperature changes of the reference-voltage generation circuit 70 and the oscillation circuit 30 due to a change in an ambient temperature of the oscillator 204 are small. Therefore, with the oscillator 204 according to this embodiment, it is possible to reduce fluctuation in an output voltage of the reference-voltage generation circuit 70 and fluctuation in the output voltage of the oscillation circuit 30 due to the change in the ambient temperature. Consequently, it is possible to further improve stability of the frequency of the oscillator 204.

1-11. Eleventh Embodiment

Figure 36:
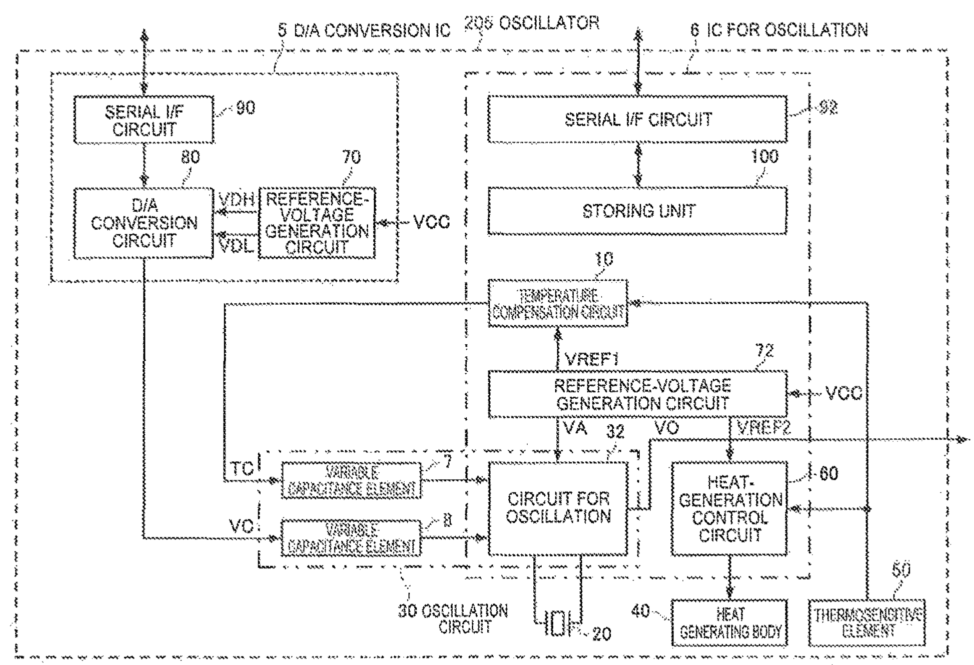
FIG. 36 is a functional block diagram of an oscillator according to an eleventh embodiment.
Figure 37:
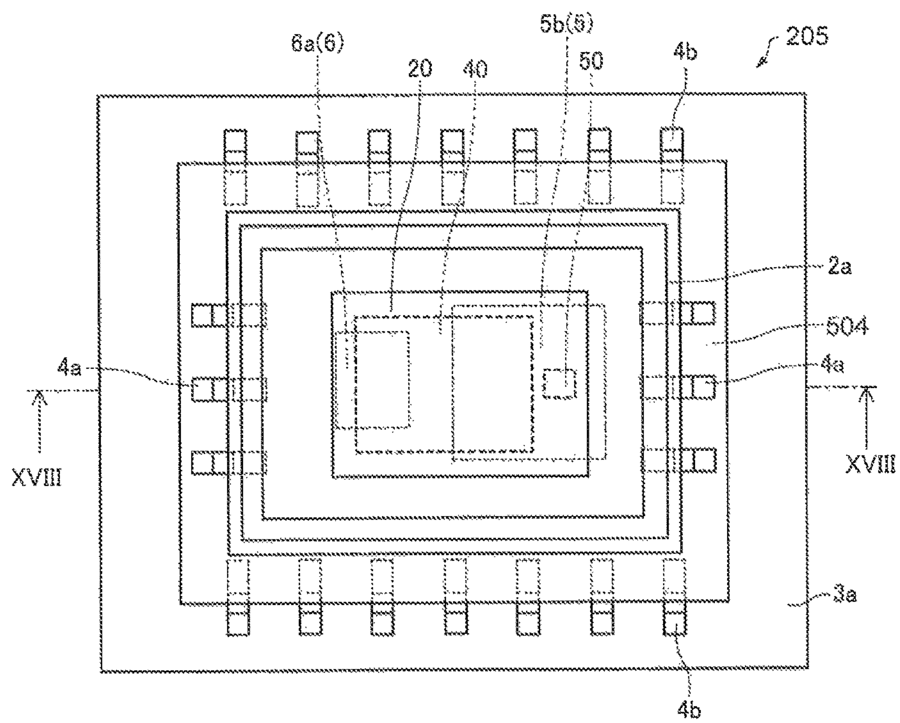
FIG. 37 is a plan view schematically showing the oscillator according to the eleventh embodiment.
Figure 38:
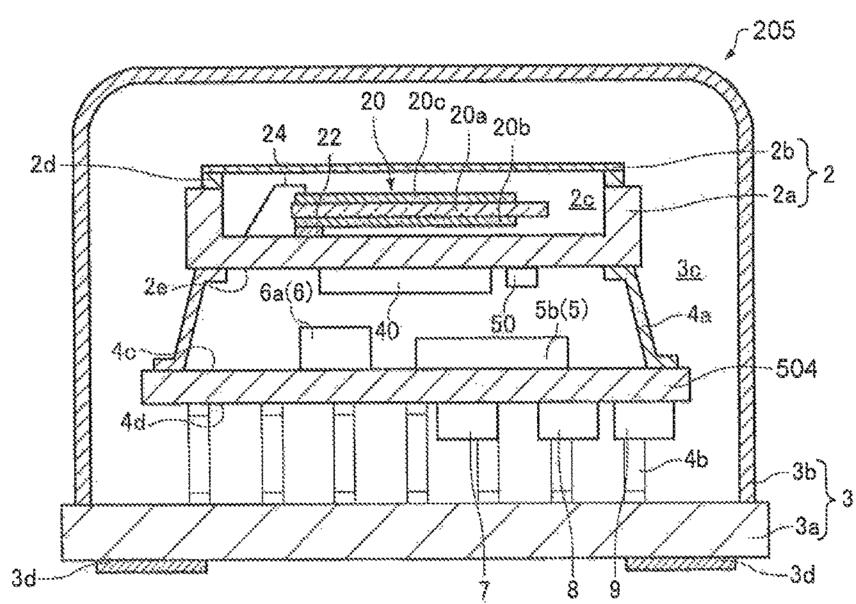
FIG. 38 is a sectional view schematically showing the oscillator according to the eleventh embodiment.

FIG. 36 is an example of a functional block diagram of an oscillator according to an eleventh embodiment. FIG. 37 is a plan view schematically showing the oscillator according to the eleventh embodiment. FIG. 38 is a sectional view schematically showing the oscillator according to the eleventh embodiment and is a XVIII-XVIII line sectional view of FIG. 37. In the following explanation, in the oscillator according to the eleventh embodiment, members having functions same as the functions of the constituent members of the oscillators according to the seventh to tenth embodiments are denoted by the same reference numerals and signs. Explanation of the members is omitted.

In an oscillator 205 according to the eleventh embodiment, as shown in FIG. 36, the D/A conversion IC 5 includes the reference-voltage generation circuit 70, the D/A conversion circuit 80, and the serial interface circuit 90. The D/A conversion IC 5 is configured by a semiconductor element 5*b*. As shown in FIGS. 37 and 38, the semiconductor element 5*b* is mounted on the supporting substrate 504. That is, the reference-voltage generation circuit 70 and the D/A conversion circuit 80 are configured by one semiconductor element 5*b* and mounted on the supporting substrate 504. In an example shown in the figures, the semiconductor element 5*b* is mounted on the supporting substrate 504 together with the semiconductor element 6*a* (the IC for oscillation 6).

The variable capacitance element 7, the variable capacitance element 8, and the electronic components 9 are mounted on the supporting substrate 504. The variable capacitance element 7, the variable capacitance element 8, and the electronic components 9 are disposed on the principal plane 4*d* of the supporting substrate 504. In the oscillator 205 according to this embodiment, constituent members of the oscillation circuit 30 are mounted on the supporting substrate 504.

In the oscillator 205 according to the eleventh embodiment, since the D/A conversion IC 5 including the reference-voltage generation circuit 70, the IC for oscillation 6, the variable capacitance element 7, the variable capacitance element 8, and the electronic components 9 are mounted on the supporting substrate 504, for example, compared with when the members are mounted on the base substrate 3*a*, it is possible to reduce fluctuation in output voltages of the members 5, 6, 7, 8, and 9 due to a change in an ambient temperature. Therefore, with the oscillator 205 according to this embodiment, it is possible to further improve stability of the frequency of the oscillator 205.

In the oscillator 205 according to the eleventh embodiment, the D/A conversion circuit 80 and the reference-voltage generation circuit 70 are configured by one semiconductor element 5*b*. Therefore, the oscillator 205 according to the eleventh embodiment is advantageous for a reduction in manufacturing costs and a reduction in size.

1-12. Twelfth Embodiment

Figure 39:
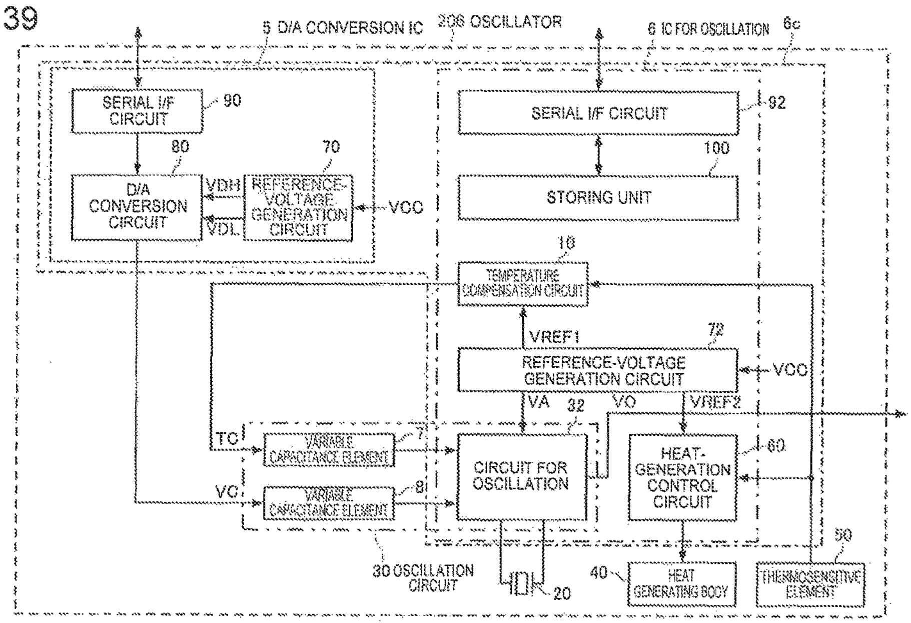
FIG. 39 is a functional block diagram of an oscillator according to a twelfth embodiment.
Figure 40:
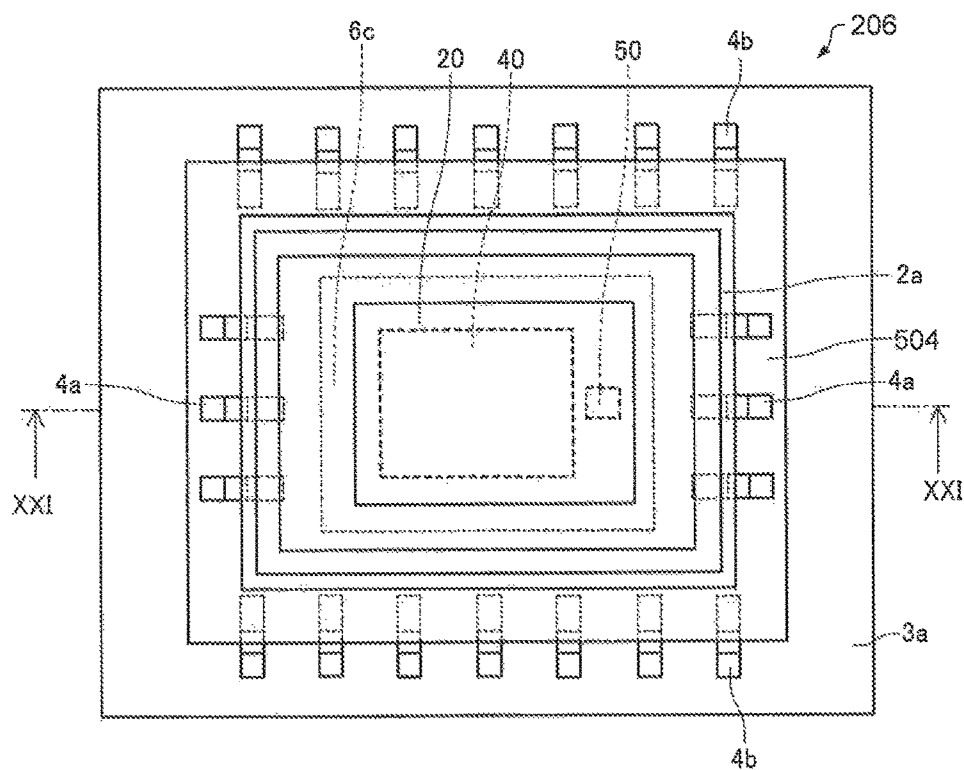
FIG. 40 is a plan view schematically showing the oscillator according to the twelfth embodiment.
Figure 41:
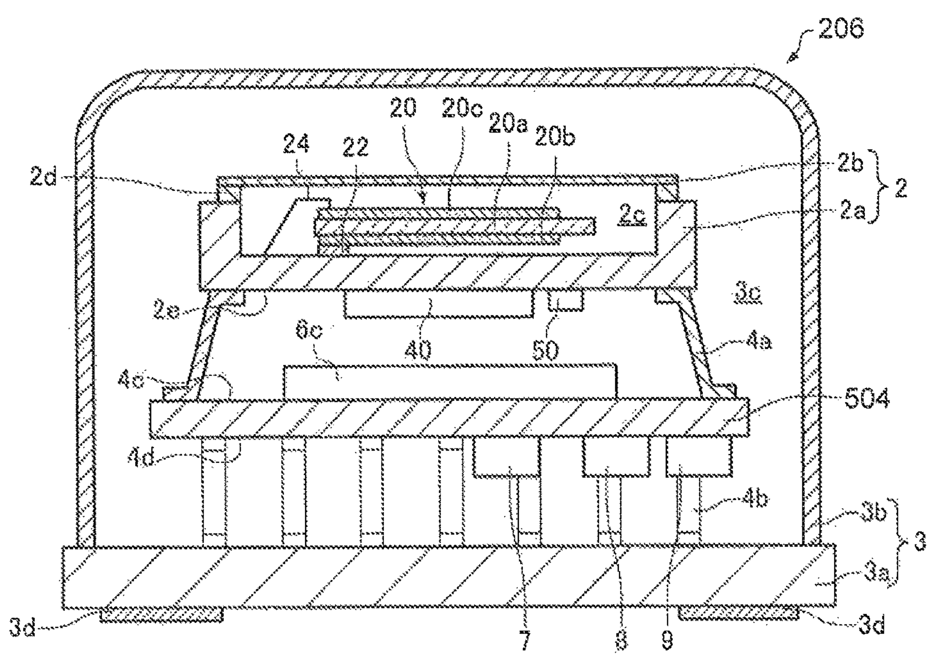
FIG. 41 is a sectional view schematically showing the oscillator according to the twelfth embodiment.

FIG. 39 is an example of a functional block diagram of an oscillator according to a twelfth embodiment. FIG. 40 is a plan view schematically showing the oscillator according to the twelfth embodiment. FIG. 41 is a sectional view schematically showing the oscillator according to the twelfth embodiment and is a XXI-XXI line sectional view of FIG. 40. In the following explanation, in the oscillator according to the twelfth embodiment, members having functions same as the functions of the constituent members of the oscillators according to the seventh to eleventh embodiments are denoted by the same reference numerals and signs. Explanation of the members is omitted.

In an oscillator 206 according to the twelfth embodiment, as shown in FIG. 39, the D/A conversion IC 5 and the IC for oscillation 6 are configured by one semiconductor element 6*c*. As shown in FIGS. 40 and 41, the semiconductor element 6*c* is mounted on the supporting substrate 504. The semiconductor element 6*c* is disposed on the principal plane 4*c* of the supporting substrate 504.

In the oscillator 206 according to the twelfth embodiment, as in the oscillator 205 according to the eleventh embodiment, it is possible to further improve frequency stability of the oscillator 206. Further, in the oscillator 206 according to the twelfth embodiment, since the D/A conversion IC 5 and the IC for oscillation 6 are configured by one semiconductor element 6*c*, the oscillator 206 according to the twelfth embodiment is advantageous for a reduction in manufacturing costs and a reduction in size.

Note that, in the above explanation, as shown in FIGS. 40 and 41, the D/A conversion IC 5 and the IC for oscillation 6 are configured by one semiconductor element 6*c*. However, although not shown in the figures, the D/A conversion IC 5, the IC for oscillation 6, the variable capacitance elements 7 and 8, and the electronic components 9 may be mounted on the supporting substrate 504 as one semiconductor element.

1-13. Thirteenth Embodiment

Figure 42:
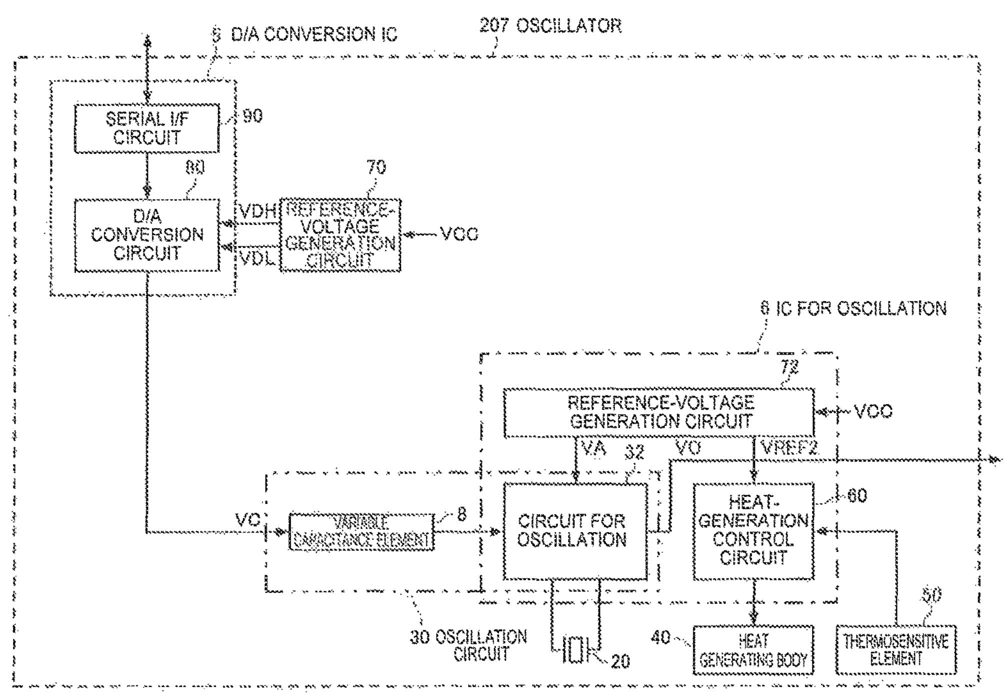
FIG. 42 is a functional block diagram of an oscillator according to a thirteenth embodiment.

FIG. 42 is an example of a functional block diagram of an oscillator 207 according to a thirteenth embodiment. Note that a plan view of the oscillator according to the thirteenth embodiment is the same as FIG. 22 and a sectional view of the oscillator is the same as FIG. 23. Therefore, the plan view and the sectional view are omitted. In the oscillator according to the thirteenth embodiment, members having functions same as the functions of the constituent members of the oscillators according to the seventh to twelfth embodiments are denoted by the same reference numerals and signs. Explanation of the members is omitted.

An oscillator 207 according to the thirteenth embodiment is different from the oscillator 201 according to the seventh embodiment shown in FIG. 21 in that, as shown in FIG. 42, the oscillator 207 does not include the temperature compensation circuit 10, the variable capacitance element 7, the thermosensitive element 13, the serial interface circuit 92, and the storing unit 100. That is, in the oscillator 207 according to this embodiment, correction of a frequency deviation caused by a temperature change of the vibrator element 20 and a temperature change of the ICs due to a change in an ambient temperature is not performed. High frequency stability is realized by controlling, with the heat-generation control circuit 60, the heating element 40 to keep the internal temperature of the first container 2 (the internal temperature of the thermostatic bath) at a desired temperature. Note that this form can also be applied to the oscillators 202 to 206 according to the eighth to twelfth embodiments.

1-14. Fourteenth Embodiment

Figure 43:
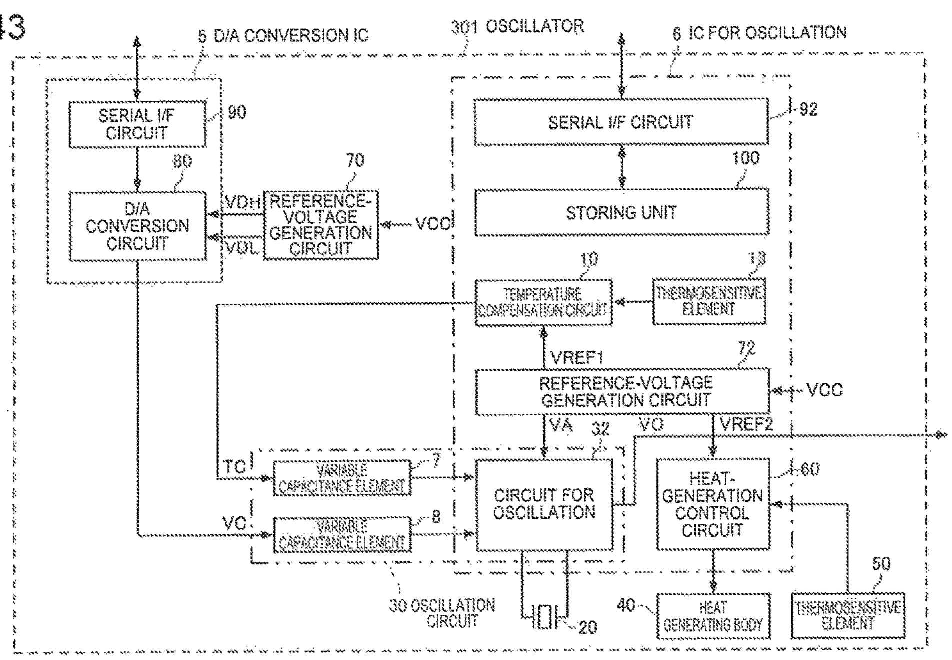
FIG. 43 is a functional block diagram of an oscillator according to a fourteenth embodiment.
Figure 44:
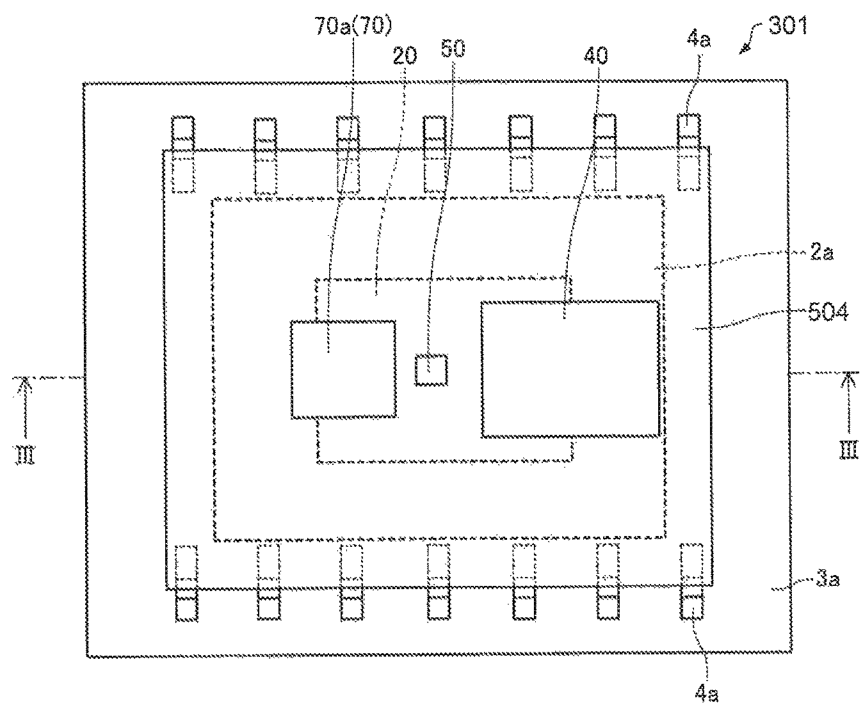
FIG. 44 is a plan view schematically showing the oscillator according to the fourteenth embodiment.
Figure 45:
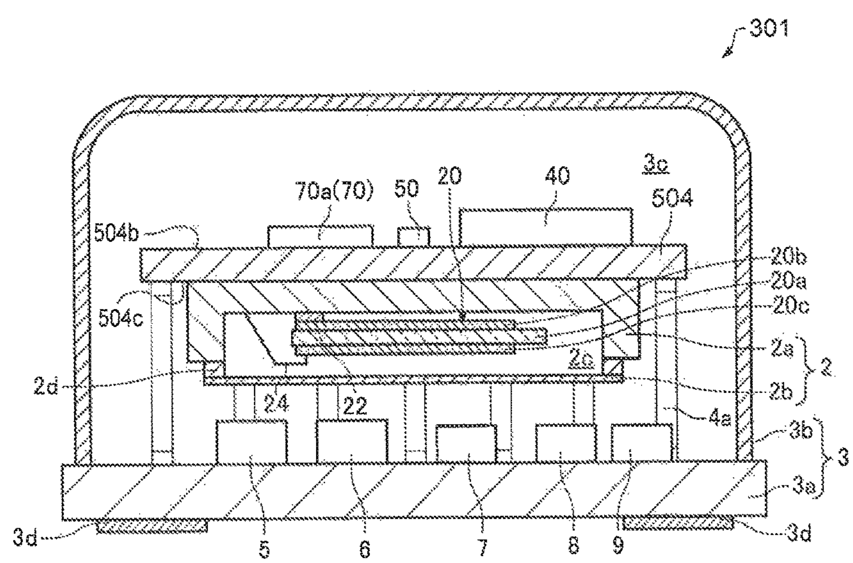
FIG. 45 is a sectional view schematically showing the oscillator according to the fourteenth embodiment.

FIG. 43 is an example of a functional block diagram of an oscillator according to a fourteenth embodiment. FIG. 44 is a plan view schematically showing the oscillator according to the fourteenth embodiment. FIG. 45 is a sectional view schematically showing the oscillator according to the fourteenth embodiment and is a III-III line sectional view of FIG. 44.

As shown in FIG. 43, an oscillator 301 according to the fourteenth embodiment includes the vibrator element (the resonator) 20, the D/A conversion integrated circuit (IC) 5, the integrate circuit (IC) for oscillation 6, the variable capacitance element 7, the variable capacitance element 8, the heating element 40, the thermosensitive element 50, and the reference-voltage generation circuit 70. However, in the oscillator 301 according to this embodiment, a part of the components shown in FIG. 43 may be omitted or changed or other components may be added.

As shown in FIGS. 44 and 45, the oscillator 301 according to the fourteenth embodiment further includes the first container 2 (an example of the container), the second container 3, the supporting substrate 504 (an example of the first substrate), and the supporting bodies 4*a*.

As shown in FIGS. 44 and 45, the first container 2 houses the vibrator element 20. Note that the first container 2 may house other members configuring the oscillator 301. The first container 2 includes the package 2*a* and the lid 2*b*. Note that, for convenience, in FIG. 44, the lid 2*b* is not shown.

The material of the package 2*a* is, for example, ceramic. The package 2*a* is, for example, a ceramic package. The package 2*a* is, for example, a ceramic stacked package formed by molding and stacking a ceramic green sheet and then baking the ceramic green sheet. The package 2*a* includes a recess. The vibrator element 20 is housed in the space (the housing chamber) 2*c* in the recess. In the example shown in the figures, an opening is provided in an upper part of the package 2*a*. The housing chamber 2*c* is formed by covering the opening with the lid 2*b*. The housing chamber 2*c* is, for example, a decompressed atmosphere (a vacuum state). Note that the housing chamber 2*c* may be an inert gas atmosphere of nitrogen, argon, helium, or the like.

Note that, although not shown in the figures, in the package 2*a*, electrodes electrically connected to the excitation electrodes 20*b* and 20*c* of the vibrator element 20, a wire for electrically connecting an external terminal provided in the package 2*a* and the vibrator element 20, and the like are provided.

The lid 2*b* covers the opening of the package 2*a*. The shape of the lid 2*b* is, for example, a plate shape. As the lid 2*b*, for example, a plate member (e.g., a ceramics plate) made of a material same as the material of the package 2*a* and metal plates of Kovar, a 42 alloy, stainless steel, and the like can be used. The lid 2*b* is connected to the package 2*a* via the joining member 2*d* such as a seal ring, low-melting point glass, or an adhesive.

In the oscillator 301, the inside of the first container 2 (the space (the housing chamber 2*c*) formed by the first container 2) is used as a thermostatic bath to perform control to keep, with the heating element 40, the temperature of the inside of the first container 2 (the inside of the thermostatic bath) constant.

The vibrator element 20 is housed on the inside of the first container 2. The vibrator element 20 is mounted (disposed) on the package 2*a*. In the example shown in the figures, the vibrator element 20 is joined to the package 2*a* via the joining member 22. Examples of the joining member 22 include silver paste, solder, a conductive adhesive (an adhesive obtained by dispersing a conductive filler such as metal particles in a resin material).

The vibrator element 20 is, for example, a quartz crystal vibrator of SC cut. The vibrator element 20 includes the crystal substrate 20*a* and the excitation electrodes 20*b* and 20*c*. Note that, for convenience, in FIG. 44, the vibrator element 20 is simplified and shown.

As the crystal substrate 20*a*, an SC cut crystal substrate (piezoelectric substrate) is used. A plane shape of the crystal substrate 20*a* (a shape viewed from the thickness direction of the crystal substrate 20*a*) is, for example, a circle, an ellipse, a square, or other polygons.

The first excitation electrode 20*b* and the second excitation electrode 20*c* are provided to sandwich the crystal substrate 20*a*. The excitation electrodes 20*b* and 20*c* apply a voltage to the crystal substrate 20*a* to vibrate the crystal substrate 20*a*.

The first excitation electrode 20*b* is provided on one principal plane (a surface on the inner bottom surface side of the package 2*a*) of the crystal substrate 20*a*. The first excitation electrode 20*b* is electrically connected to, via an extraction electrode provided on one principal plane of the crystal substrate 20*a* and the joining member 22, an electrode provided on the package 2*a*.

The second excitation electrode 20*c* is provided on the other principal plane of the crystal substrate 20*a*. The second excitation electrode 20*c* is electrically connected to, via an extraction electrode provided on the other principal plane of the crystal substrate 20*a* and the bonding wire 24, the electrode (not shown in the figures) provided on the package 2*a*. As the excitation electrodes 20*b* and 20*c*, for example, electrodes obtained by stacking chrome and gold in this order from the crystal substrate 20*a* side are used.

Note that the vibrator element 20 is not limited to the quartz crystal vibrator of the SC cut. For example, quartz crystal vibrators of AT cut and BT cut and an SAW (Surface Acoustic Wave) resonator can be used. As the vibrator element 20, a piezoelectric vibrator, an MEMS (Micro Electro Mechanical Systems) vibrator, and the like other than the quartz crystal vibrator can also be used. As a substrate material of the vibrator element 20, piezoelectric material such as piezoelectric single crystal such as quartz crystal, lithium tantalate, and lithium niobate and piezoelectric ceramics such as lead zirconate titanate, a silicon semiconductor material, and the like can be used. As an exciting unit for the vibrator element 20, exciting means by a piezoelectric effect may be used or electrostatic driving by a Coulomb's force may be used.

The second container 3 includes the base substrate 3*a* (an example of the second substrate) and the cover 3*b*. Note that, for convenience, in FIG. 44, the cover 3*b* is not shown.

The base substrate 3*a* is formed of a material such as glass epoxy resin having insulation or ceramic. On the lower surface of the base substrate 3*a*, the external terminal 3*d* for electrically connecting an element housed on the inside of the second container 3 and an external apparatus or the like is provided.

The cover 3*b* is put over the base substrate 3*a* to form the space 3*c* in conjunction with the base substrate 3*a*. The material of the cover 3*b* is, for example, metal or resin. As the cover 3*b*, for example, a cover obtained by applying nickel plating to an iron-based alloy having low thermal conductivity such as a 42 alloy (an iron nickel alloy) may be used. The cover 3*b* is fixed on the base substrate 3*a* using solder or the like. The space 3*c* is, for example, a decompressed atmosphere (a vacuum state). Note that the space 3*c* may be an inert gas atmosphere of nitrogen, argon, helium, or the like. In the space 3*c* (on the inside of the second container 3), the first container 2, the supporting substrate 504, the supporting bodies 4*a*, the D/A conversion IC 5, the IC for oscillation 6, the variable capacitance element 7, the variable capacitance element 8, the electronic components 9, the heating element 40, the thermosensitive element 50, and the semiconductor element 70*a* (the reference-voltage generation circuit 70) are housed.

On the base substrate 3*a*, the D/A conversion IC 5, the IC for oscillation 6, the variable capacitance element 7, the variable capacitance element 8, and other one or more electronic components 9 (a resistor, a capacitor, a coil, etc.) are disposed (mounted). Terminals of the variable capacitance element 7, the variable capacitance element 8, the electronic components 9, the vibrator element 20, the heating element 40, the thermosensitive element 50, and the reference-voltage generation circuit 70 are respectively electrically connected to desired terminals of the D/A conversion IC 5 or the IC for oscillation 6 by not-shown wiring patterns.

The supporting substrate 504 is mounted on the base substrate 3*a* via the supporting bodies 4*a*. The supporting substrate 504 is supported by the supporting bodies 4*a* to be separated from the base substrate 3*a*. That is, a gap is present between the supporting substrate 504 and the base substrate 3*a*. The supporting substrate 504 and the base substrate 3*a* are not in contact with each other. Therefore, for example, compared with when the supporting substrate 504 is in contact with the base substrate 3*a*, the supporting substrate 504 is less easily affected by an ambient temperature of the oscillator 301 (the temperature outside the second container 3). The supporting substrate 504 is, for example, a tabular member. The material of the supporting substrate 504 is, for example, ceramic. That is, the supporting substrate 504 is configured by a ceramic substrate. Note that the material of the supporting substrate 504 is not limited to ceramic and may be, for example, glass epoxy resin.

The supporting bodies 4*a* are provided on the base substrate 3*a* to support the supporting substrate 504. Fourteen supporting bodies 4*a* are provided. The supporting substrate 504 is supported by the supporting bodies 4*a*. The supporting bodies 4*a* may function as a part of wires for electrically connecting the members housed on the inside of the first container 2 and the members mounted on the supporting substrate 504 and other members. The supporting bodies 4*a* are desirably formed of a material having small thermal conductivity. Specifically, as the material of the supporting bodies 4*a*, any one kind of iron, titanium, and platinum or an alloy containing one or more kinds of the materials is used. In particular, as the material of the supporting bodies 4*a*, it is desirable to use Kovar or a 42 alloy, which is an iron-based alloy. By forming the supporting bodies 4*a* with the material having small thermal conductivity in this way, it is possible to reduce an amount of heat escaping to the outside from the supporting substrate 504 via the supporting bodies 4*a*. It is possible to achieve reduction in power consumption.

On the supporting substrate 504, the first container 2, the heating element 40, the thermosensitive element 50, and the semiconductor element 70*a* (the reference-voltage generation circuit 70) are mounted (disposed). The heating element 40, the thermosensitive element 50, and the semiconductor element 70*a* are disposed on a principal plane 504*b* of the supporting substrate 504. The first container 2 is disposed on a principal plane 504*c* (a principal plane on the opposite side of the principal plane 504*b*; in the example shown in the figures, a principal plane on the base substrate 3*a* side) of the supporting substrate 504. These members 2, 40, 50, and 70*a* are joined to the supporting substrate 504 by a joining member such as an adhesive. On the supporting substrate 504, wires for electrically connecting the members 2 (the vibrator element 20), 40, 50, and 70*a* and the other members and electrodes are provided.

The heating element 40 is, for example, a heater. Elements (a power transistor, a resistor, etc.) that generate heat when an electric current is fed thereto can be used. The heating element 40 controls the temperature on the inside of the first container 2. The heating element 40 is controlled by the heat-generation control circuit 60 to keep the temperature on the inside (the housing chamber 2*c*) of the first container 2 constant (or substantially constant). Heat generated in the heating element 40 is transferred to the supporting substrate 504 to heat the first container 2 (the vibrator element 20) and the semiconductor element 70*a*.

As the thermosensitive element 50, for example, thermistors (an NTC (Negative Temperature Coefficient) thermistor, a PTC (Positive Temperature Coefficient) thermistor, etc.) and a platinum resistor can be used.

Note that, in the example shown in the figures, the heating element 40 and the thermosensitive element 50 are respectively disposed on the principal plane 504*b* of the supporting substrate 504 as separate elements. However, the heating element 40 (e.g., a power transistor) and the thermosensitive element 50 may configure one semiconductor element and the semiconductor element may be disposed on the principal plane 504*b* of the supporting substrate 504.

As explained above, the semiconductor element 70*a* (the reference-voltage generation circuit 70) is disposed on the principal plane 504*b* of the supporting substrate 504 together with the heating element 40. The semiconductor element 70*a* is desirably provided in the vicinity of the heating element 40.

As shown in FIG. 43, the reference-voltage generation circuit 70 generates the high-potential side reference voltage VDH and the low-potential side reference voltage VDL of the D/A conversion circuit 80 on the basis of a power supply voltage VCC supplied from the outside of the oscillator 301 and supplies the high-potential side reference voltage VDH and the low-potential side reference voltage VDL to the D/A conversion circuit 80. The reference-voltage generation circuit 70 includes, for example, a regulator.

The D/A conversion IC 5 includes the D/A conversion circuit 80 (the D/A converter) and the serial interface circuit 90. However, in the D/A conversion IC 5, a part of the components may be omitted or changed or other components may be added.

The serial interface circuit 90 acquires a serial data signal (digital data for controlling the frequency of the oscillation circuit 30) input from the outside of the D/A conversion IC 5 (the outside of the oscillator 301), converts the serial data signal into an N-bit data signal, and outputs the N-bit data signal to the D/A conversion circuit 80.

The N-bit data signal (the digital data for controlling the frequency of the oscillation circuit 30) output by the serial interface circuit 90 is input to the D/A conversion circuit 80. The D/A conversion circuit 80 converts the N-bit data signal into an analog signal of a voltage between the high-potential side reference voltage VDH and the low-potential side reference voltage VDL and outputs the analog signal. As the D/A conversion circuit 80, D/A conversion circuits of well-known various types such as a resistance voltage dividing type (also called voltage distribution type, resistance string type, or voltage potentiometer type), a resistance ladder type (an R-2R ladder type, etc.), a capacitive array type, and a delta/sigma type can be used.

A voltage (a control voltage) VC of the analog signal output by the D/A conversion circuit 80 is applied to the variable capacitance element 8 on the outside of the D/A conversion IC 5. A capacitance value of the variable capacitance element 8 changes according to the control voltage VC. The variable capacitance element 8 may be, for example, a varicap diode (a varactor), a capacitance value of which changes according to the control voltage VC applied to one end thereof.

The IC for oscillation 6 includes the temperature compensation circuit 10, the thermosensitive element 13, the circuit for oscillation 32, the heat-generation control circuit 60, the reference-voltage generation circuit 72, the serial interface circuit 92, and the storing unit 100. However, in the IC for oscillation 6, a part of the components may be omitted or changed or other components may be added.

The temperature compensation circuit 10 is connected to the thermosensitive element 13. The temperature compensation circuit 10 generates, according to an output signal of the thermosensitive element 13, the temperature compensation voltage TC for correcting a frequency temperature characteristic of an output signal of the oscillation circuit 30. For example, the temperature compensation circuit 10 may be capable of performing only correction of a primary component of the frequency temperature characteristic of the output signal of the oscillation circuit 30 (hereinafter referred to as “primary correction”), may be capable of performing only correction of a secondary component (hereinafter referred to as “secondary correction”), or may be capable of performing both of the primary correction and the secondary correction. When the temperature compensation circuit 10 is capable of performing both of the primary correction and the secondary correction, the temperature compensation circuit 10 may be capable of independently setting whether the primary correction and the secondary correction are respectively enabled or disabled or may be capable of setting a correction parameter of the primary correction and a correction parameter of the secondary correction independently from each other. Further, the temperature compensation circuit 10 may be capable of performing the secondary correction in a plurality of temperature regions (e.g., a low temperature side and a high temperature side) independently from one another.

The thermosensitive element 13 may output, for example, a voltage corresponding to the temperature around the thermosensitive element 13. The thermosensitive element 13 may be a thermosensitive element of a positive polarity having a higher output voltage as temperature is higher or may be a thermosensitive element of a negative polarity having a lower output voltage as temperature is higher.

The temperature compensation voltage TC output by the temperature compensation circuit 10 is applied to the variable capacitance element 7 on the outside of the IC for oscillation 6. A capacitance value of the variable capacitance element 7 changes according to the temperature compensation voltage TC. The variable capacitance element 7 may be a varicap diode (a varactor), a capacitance value of which changes according to the temperature compensation voltage TC applied to one end thereof.

The circuit for oscillation 32 configures the oscillation circuit 30, which causes the vibrator element 20 to oscillate, in conjunction with the variable capacitance element 7, the variable capacitance element 8, and the other electronic components 9 (not shown in FIG. 43) externally attached to terminals of the IC for oscillation 6.

The oscillation circuit 30 is electrically connected to the vibrator element 20. The oscillation circuit 30 causes the vibrator element 20 to oscillate at a frequency corresponding to a capacitance value of the variable capacitance element 7 and a capacitance value of the variable capacitance element 8 and outputs the oscillation signal VO. The oscillation signal VO output by the oscillation circuit 30 is output to the outside of the IC for oscillation 6 (the outside of the oscillator 301).

The heat-generation control circuit 60 controls, on the basis of an output voltage of the thermosensitive element 50, the heating element 40 for heating the vibrator element 20. Specifically, the heat-generation control circuit 60 controls, according to the output voltage of the thermosensitive element 50, heat generation of the heating element 40 to keep temperature constant.

For example, the thermosensitive element 50 having a temperature characteristic of a positive gradient may be mounted on the supporting substrate 504. The heat-generation control circuit 60 may perform control to feed an electric current to the heating element 40 to cause the heating element 40 to generate heat when the output voltage of the thermosensitive element 50 is smaller than a reference value and not to feed an electric current to the heating element 40 when the output voltage of the thermosensitive element 50 is larger than the reference value.

The reference-voltage generation circuit 72 generates, on the basis of the power supply voltage VCC supplied from the outside of the IC for oscillation 6 (the outside of the oscillator 301), the power supply voltage VA of the oscillation circuit 30, the reference voltage VREF1 of the temperature compensation circuit 10, the reference voltage VREF2 of the heat-generation control circuit 60, and the like.

The storing unit 100 includes a nonvolatile memory and a register not shown in the figures. In the nonvolatile memory, setting information of the temperature compensation circuit 10 (information concerning whether the primary correction and the secondary correction are respectively performed, a correction parameter of the primary correction, a correction parameter of the secondary correction, etc.) and the like are stored. The nonvolatile memory can be realized by, for example, a flash memory such as an MONOS (Metal-Oxide-Nitride-Oxide-Silicon) memory and an EEPROM (Electrically Erasable Programmable Read-Only Memory).

The setting information stored in the nonvolatile memory is transferred from the nonvolatile memory to the register when a power supply of the IC for oscillation 6 is turned on (when the power supply voltage VCC rises from 0 V to a desired voltage) and retained in the register. The setting information retained in the register is supplied to the temperature compensation circuit 10 and the like.

The serial interface circuit 92 is a circuit for performing read/write on the storing unit 100 (the nonvolatile memory and the register) from the outside of the IC for oscillation 6 (the outside of the oscillator 301). The serial interface circuit 92 may be, for example, an interface circuit corresponding to an $I^2C$ (Inter-integrated Circuit) bus or may be, for example, an interface circuit corresponding to a SPI (Serial Peripheral Interface) bus.

Figure 46:
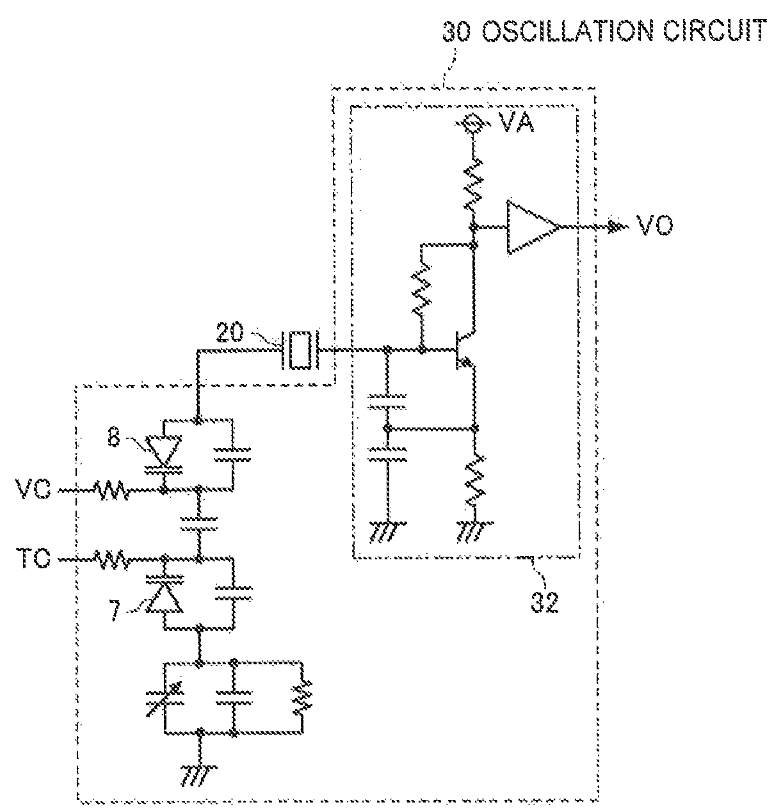
FIG. 46 is a diagram showing a configuration example of an oscillation circuit.

FIG. 46 is a diagram showing a configuration example of the oscillation circuit 30. In the oscillation circuit 30 shown in FIG. 46, the control voltage VC is applied to one end of the variable capacitance element 8 (the varicap diode), the capacitance value of the variable capacitance element 8 changes according to a voltage value of the control voltage VC, and an oscillation frequency changes according to the change in the capacitance value. The temperature compensation voltage TC is applied to one end of the variable capacitance element 7 (the varicap diode), the capacitance value of the variable capacitance element 7 changes according to a voltage value of the temperature compensation voltage TC, and the oscillation frequency is kept substantially constant according to the change in the capacitance value irrespective of temperature.

Figure 47:
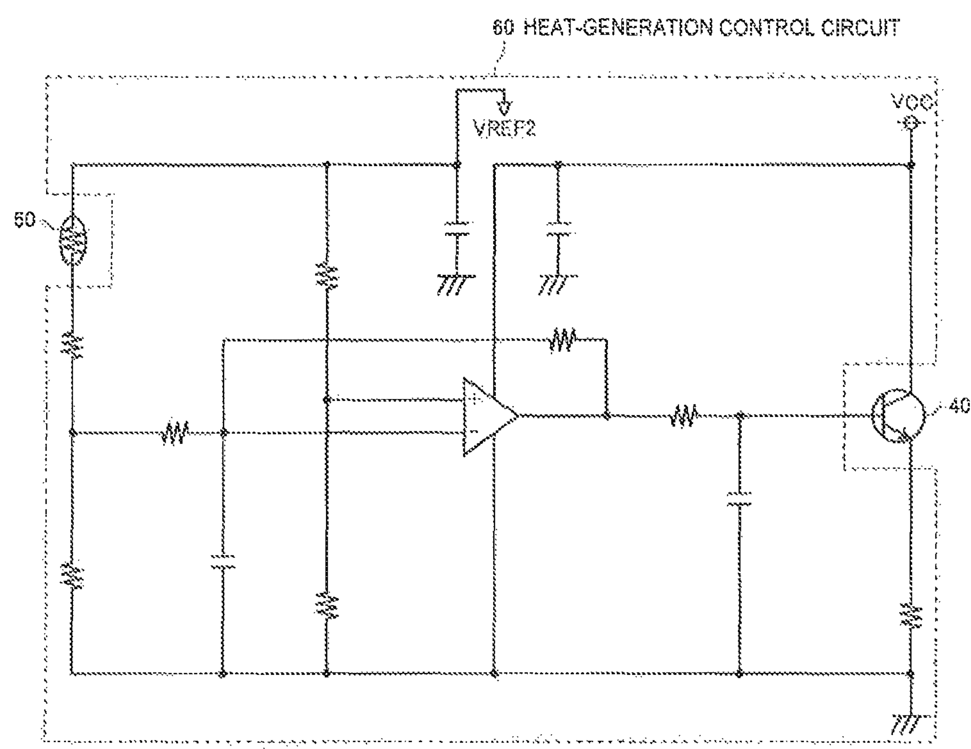
FIG. 47 is a diagram showing a configuration example of a heat-generation control circuit.

FIG. 47 is a diagram showing a configuration example of the heat-generation control circuit 60. In FIG. 47, an NPN-type power transistor is used as the heating element 40. An NTC thermistor is used as the thermosensitive element 50. In the heat-generation control circuit 60 shown in FIG. 47, when temperature drops, a resistance value of the thermosensitive element 50 (the NTC thermistor) increases and an input potential difference of an operational amplifier increases. Conversely, when temperature rises, the resistance value of the thermosensitive element 50 (the NTC thermistor) decreases and the input potential difference of the operational amplifier decreases. An output voltage of the operational amplifier is proportional to the input potential difference. When the output voltage of the operational amplifier is larger than a predetermined voltage value, a more electric current flows to the heating element 40 (the NPN-type power transistor) and a heat generation amount of the heating element 40 increases as the voltage value is larger. When the output voltage of the operational amplifier is smaller than the predetermined voltage value, an electric current does not flow to the heating element 40 and the heat generation amount gradually decreases. Therefore, the operation of the heating element 40 is controlled to set the resistance value of the thermosensitive element 50 (the NTC thermistor) to a desired value, that is, keep the temperature at a desired temperature.

In the oscillator 301 according to this embodiment having such a configuration, the heat-generation control circuit 60 performs, on the basis of the frequency temperature characteristic of the output signal of the oscillation circuit 30 determined according to temperature characteristics of the vibrator element 20, the ICs (the D/A conversion IC 5 and the IC for oscillation 6), and the like, control to keep the internal temperature of the first container 2 (the internal temperature of the thermostatic bath) at a desired temperature (e.g., if the vibrator element 20 is an SC cut quartz crystal vibrator, temperature at which a frequency is maximized).

Figure 48:
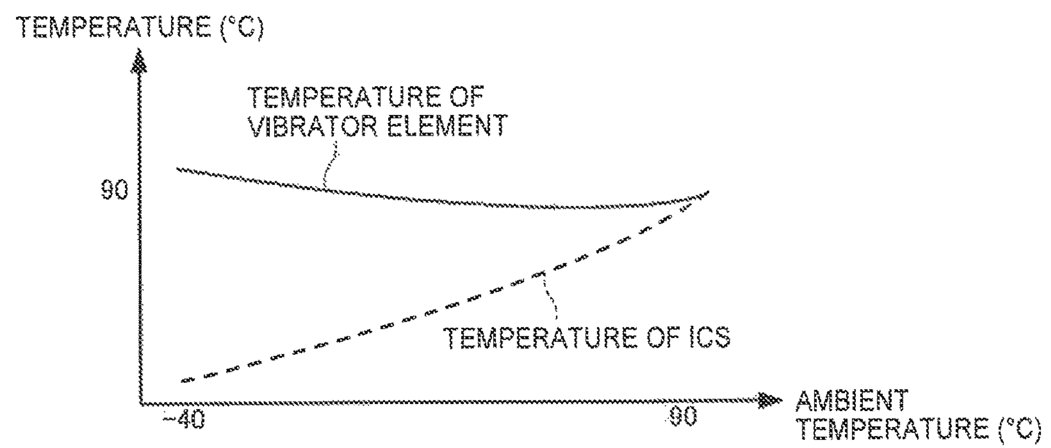
FIG. 48 is a diagram showing a temperature change of a vibrator and a temperature change of ICs with respect to a change in an ambient temperature.

However, the temperature in the thermostatic bath (the inside of the first container 2) is sometimes not constant because the temperature changes according to the ambient temperature of the oscillator 301. FIG. 48 is a diagram showing, in the oscillator 301 having the structure shown in FIGS. 44 and 45, an example of states of a temperature change of the vibrator element 20 and a temperature change of the ICs (the D/A conversion IC 5 and the IC for oscillation 6) due to a change in the ambient temperature of the oscillator 301. Since the vibrator element 20 is housed in the first container 2, the vibrator element 20 is less easily affected by the ambient temperature. However, as shown in FIG. 48, when the ambient temperature changes in a range of −40° C. to 90° C., the temperature of the vibrator element 20 also slightly changes. The temperature of the ICs (the D/A conversion IC 5 and the IC for oscillation 6) disposed on the outside the thermostatic bath (the outside of the first container 2) is more easily affected by the ambient temperature compared with the vibrator element 20 disposed in the thermostatic bath.

In this embodiment, the temperature compensation circuit 10 corrects a frequency deviation caused by the temperature change of the vibrator element 20 and the temperature change of the ICs due to the change in the ambient temperature. In particular, since the temperature change of the ICs due to the change in the ambient temperature is large, the temperature compensation circuit 10 is provided on the inside of the IC for oscillation 6 separately from the thermosensitive element 50. By generating the temperature compensation voltage TC on the basis of the output signal of the thermosensitive element 13 that more accurately detects the temperature of the ICs, a frequency deviation mainly caused by the temperature change of the ICs is corrected. Consequently, it is possible to realize frequency stability higher than the frequency stability of the OCXO in the past.

The oscillator 301 according to the fourteenth embodiment explained above is a new thermostatic bath-type oscillator capable of controlling an oscillation frequency according to a digital signal input from an external terminal. In particular, in the oscillator 301 according to this embodiment, the frequency of the oscillation circuit 30 is controlled by applying the control voltage VC, which is output by the D/A conversion circuit 80, and the temperature compensation voltage TC, which is output by the temperature compensation circuit 10, respectively to the variable capacitance element 8 and the variable capacitance element 7 separate from each other rather than applying a voltage obtained by adding up the control voltage VC and the temperature compensation voltage TC to one variable capacitance element. Consequently, it is unnecessary to allocate a part of a voltage range of the output of the D/A conversion circuit 80 to temperature compensation. A full voltage range of the output of the D/A conversion circuit 80 is successfully allocated to a frequency control range. Therefore, with the oscillator 301 according to this embodiment, it is possible to expand the frequency control range while maintaining the resolution of frequency control. Alternatively, it is possible to increase the resolution of the frequency control while maintaining the frequency control range. In this way, according to this embodiment, it is possible to realize the oscillator 301 capable of performing temperature compensation without narrowing the frequency control range.

An output voltage of the reference-voltage generation circuit 70 (the regulator) greatly fluctuates because of temperature (see, for example, FIG. 77). However, in the oscillator 301 according to the fourteenth embodiment, since the reference-voltage generation circuit 70 is mounted on the supporting substrate 504 on which the heating element 40 is disposed, for example, compared with when the reference-voltage generation circuit 70 is mounted on the base substrate 3*a*, a temperature change of the reference-voltage generation circuit 70 due to the change in the ambient temperature of the oscillator 301 is small. Therefore, with the oscillator 301 according to this embodiment, it is possible to reduce fluctuation in the output voltage of the reference-voltage generation circuit 70 due to the change in the ambient temperature.

In this way, with the oscillator 301 according to this embodiment, it is possible to reduce the fluctuation in the output voltage of the reference-voltage generation circuit 70 due to the change in the ambient temperature. Therefore, it is possible to reduce fluctuation in an output voltage of the D/A conversion circuit 80 (the D/A converter) due to the fluctuation in the output voltage of the reference-voltage generation circuit 70. Consequently, it is possible to improve stability of the frequency (an output frequency) of the oscillator 301.

In the oscillator 301 according to the fourteenth embodiment, since the first container 2 is directly mounted on the supporting substrate 504 not via members such as supporting bodies, for example, compared with when the first container 2 is mounted on the supporting substrate 504 via supporting bodies, it is possible to efficiently heat the first container 2 with the heating element 40. Therefore, in the oscillator 301 according to this embodiment, it is possible to achieve a reduction in power consumption. Further, in the oscillator 301 according to this embodiment, since the first container 2 is mounted on the supporting substrate 504 not via supporting bodies, for example, compared with when the first container 2 is mounted on the supporting substrate 504 via supporting bodies, it is possible to achieve a reduction in size.

In the oscillator 301 according to the fourteenth embodiment, the supporting substrate 504 is configured by a ceramic substrate. Since the package 2*a* of the first container 2 is a ceramic package, in the oscillator 301 according to this embodiment, it is possible to equalize a coefficient of thermal expansion (a coefficient of linear expansion) of the first container 2 and a coefficient of thermal expansion of the supporting substrate 504 on which the first container 2 is mounted (or reduce a difference between the coefficient of linear expansions). Consequently, it is possible to reduce stress caused by the difference between the coefficient of thermal expansion of the first container 2 and the coefficient of thermal efficient of the supporting substrate 504.

1-15. Fifteenth Embodiment

Figure 49:
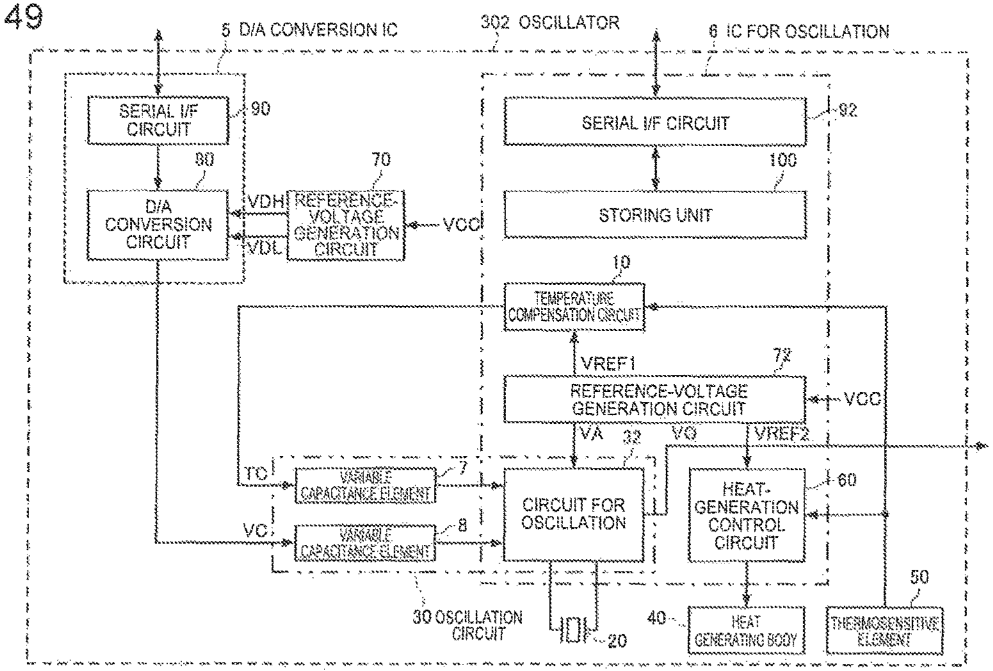
FIG. 49 is a functional block diagram of an oscillator according to a fifteenth embodiment.
Figure 50:
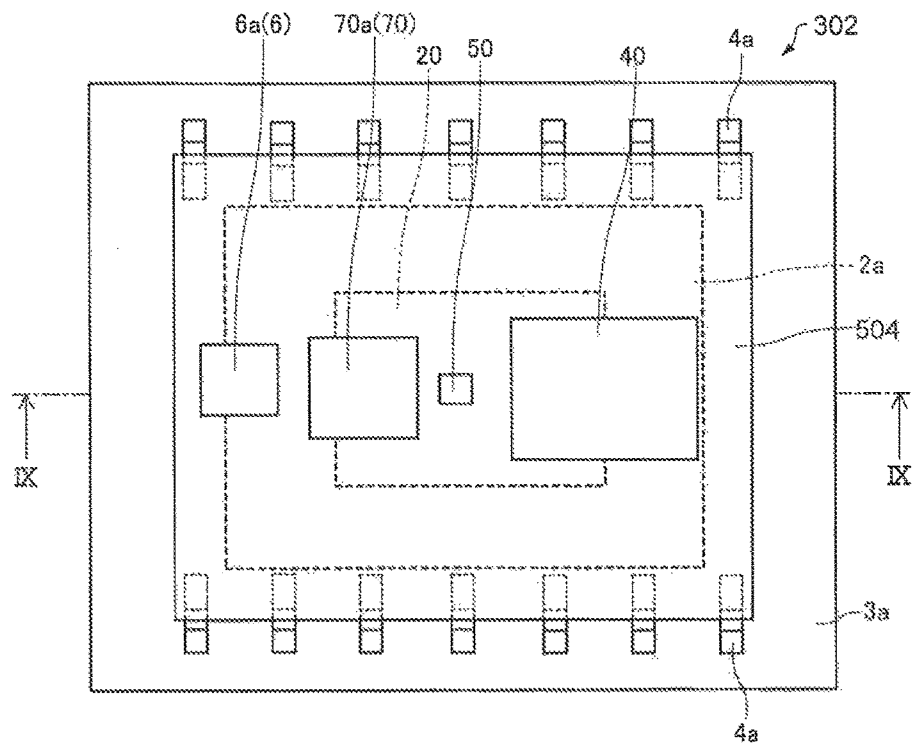
FIG. 50 is a plan view schematically showing the oscillator according to the fifteenth embodiment.
Figure 51:
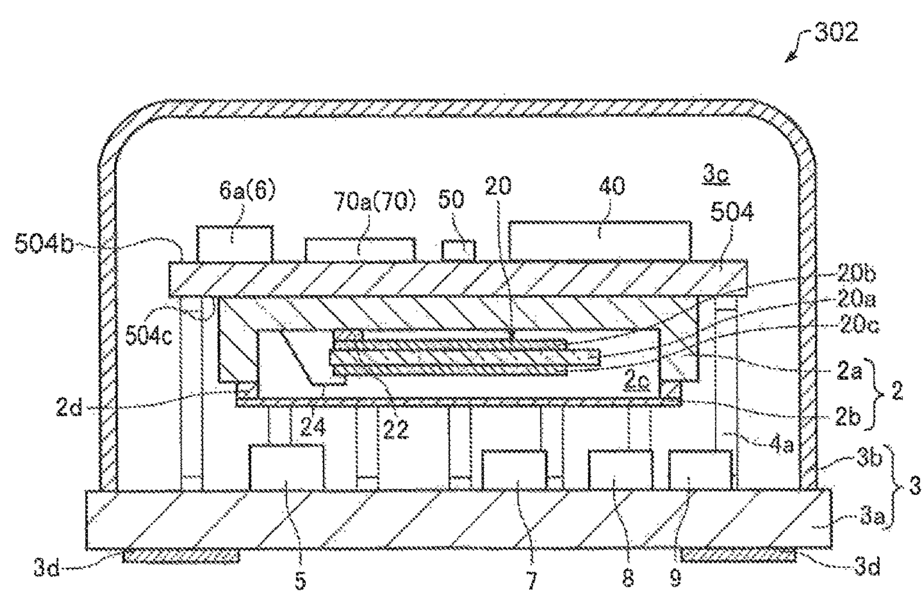
FIG. 51 is a sectional view schematically showing the oscillator according to the fifteenth embodiment.

FIG. 49 is an example of a functional block diagram of an oscillator according to a fifteenth embodiment. FIG. 50 is a plan view schematically showing the oscillator according to the fifteenth embodiment. FIG. 51 is a sectional view schematically showing the oscillator according to the fifteenth embodiment and is a IX-IX line sectional view of FIG. 50. In the following explanation, in the oscillator according to the fifteenth embodiment, members having functions same as the functions of the constituent members of the oscillator according to the fourteenth embodiment are denoted by the same reference numerals and signs. Explanation of the members is omitted.

In an oscillator 302 according to the fifteenth embodiment, as shown in FIGS. 49 to 51, the oscillation circuit 30 includes the circuit for oscillation 32 and electronic components such as the variable capacitance elements 7 and 8, and the electronic components 9. The IC for oscillation 6 including the circuit for oscillation 32 is configured by one semiconductor element 6*a*.

The semiconductor element 6*a* is mounted on the supporting substrate 50 together with the semiconductor element 70*a* (the reference-voltage generation circuit 70). The semiconductor element 6*a* is disposed on the principal plane 504*b* of the supporting substrate 504. The semiconductor element 6*a* is joined to the supporting substrate 504 by a joining member (not shown in the figures) such as an adhesive. The semiconductor element 6*a* is electrically connected to an electrode (not shown in the figures) disposed on the supporting substrate 504 and a wire.

The electronic components 7, 8, and 9 configuring the oscillation circuit 30 are mounted (disposed) on the base substrate 3*a*.

Figure 52:
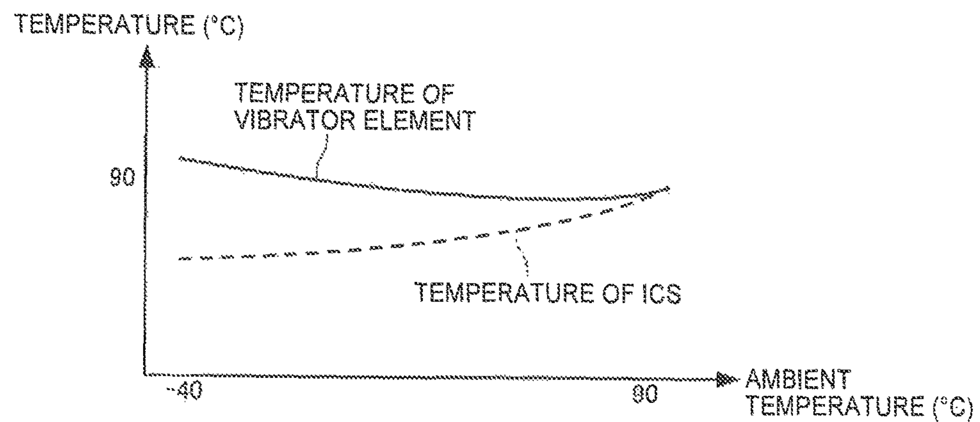
FIG. 52 is a diagram showing a temperature change of a vibrator and a temperature change of ICs with respect to a change in an ambient temperature.

In the oscillator 302 according to the fifteenth embodiment, the IC for oscillation 6 is mounted on the supporting substrate 504. Therefore, compared with the oscillator 301 according to the fourteenth embodiment in which the IC for oscillation 6 is mounted on the base substrate 3*a*, the IC for oscillation 6 is less easily affected by an ambient temperature. FIG. 52 is a diagram showing, in the oscillator 302 according to the fifteenth embodiment, states of a temperature change of the vibrator element 20 and a temperature change of the IC for oscillation 6 due to a change in an ambient temperature of the oscillator 302. As shown in FIG. 52, in the oscillator 302 according to the fifteenth embodiment, compared with the oscillator 301 (FIG. 48) according to the fourteenth embodiment, the temperature change of the IC for oscillation 6 due to the change in the ambient temperature of the oscillator 302 is small and a temperature difference between the IC for oscillation 6 and the vibrator element 20 is also small.

Therefore, as shown in FIG. 49, in the oscillator 302 according to the fifteenth embodiment, unlike the oscillator 301 according to the fourteenth embodiment, the thermosensitive element 13 is not provided in the IC for oscillation 6. The temperature compensation circuit 10 is connected to the thermosensitive element 50. That is, in the oscillator 302 according to the fifteenth embodiment, since the temperature difference between the IC for oscillation 6 and the vibrator element 20 is small, the IC for oscillation 6 is reduced in size by using the thermosensitive element 50 for both of heat generation control by the heat-generation control circuit 60 and temperature compensation by the temperature compensation circuit 10. There is a slight difference between temperature detected by the thermosensitive element 50 (substantially equal to the temperature of the vibrator element 20) and the actual temperature of the IC for oscillation 6. However, the difference is within a range in which sufficient temperature compensation by the temperature compensation circuit 10 is possible. Therefore, the oscillator 302 according to the fifteenth embodiment is advantageous for a reduction in manufacturing costs and a reduction in size while realizing high frequency stability.

Note that, although not shown in the figures, in the oscillator 302 according to the fifteenth embodiment, as in the oscillator 301 according to the fourteenth embodiment shown in FIG. 43, the thermosensitive element 13 may be provided in the IC for oscillation 6 and the temperature compensation circuit 10 may be connected to the thermosensitive element 13.

An output voltage of the circuit for oscillation 32 fluctuates because of temperature. However, in the oscillator 302 according to the fifteenth embodiment, since the reference-voltage generation circuit 70 and the circuit for oscillation 32 (the semiconductor element 6*a*) are mounted on the supporting substrate 504, for example, compared with when the reference-voltage generation circuit 70 and the circuit for oscillation 32 are mounted on the base substrate 3*a*, temperature changes of the reference-voltage generation circuit 70 and the circuit for oscillation 32 due to the change in the ambient temperature of the oscillator 302 are small. Therefore, with the oscillator 302 according to this embodiment, it is possible to reduce fluctuation in an output voltage of the reference-voltage generation circuit 70 and fluctuation in the output voltage of the circuit for oscillation 32 due to the change in the ambient temperature. Consequently, it is possible to further improve stability of the frequency of the oscillator 302.

1-16. Sixteenth Embodiment

Figure 53:
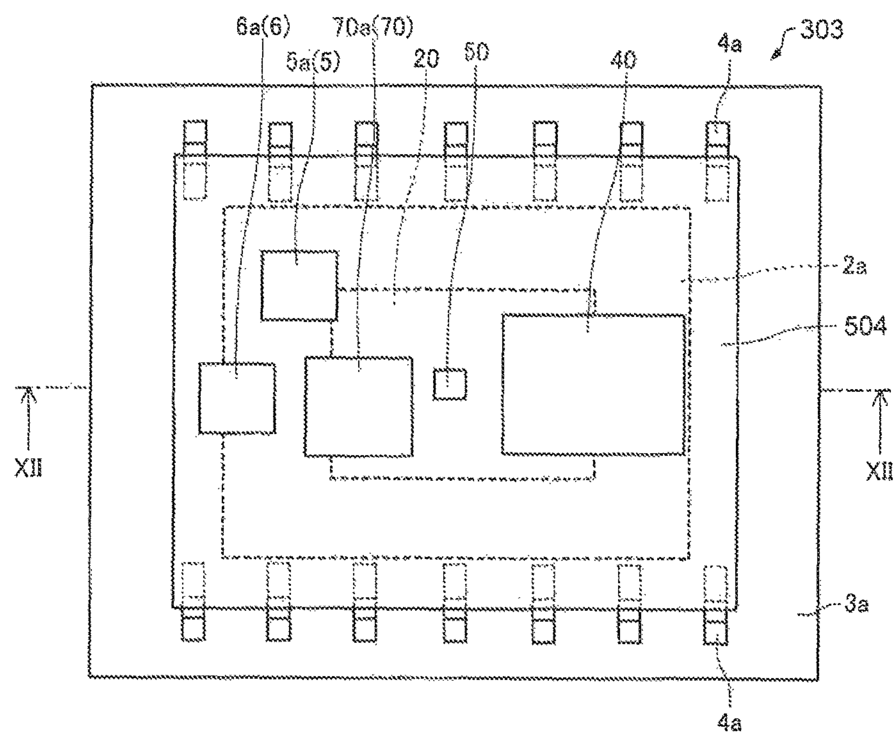
FIG. 53 is a plan view schematically showing an oscillator according to a sixteenth embodiment.
Figure 54:
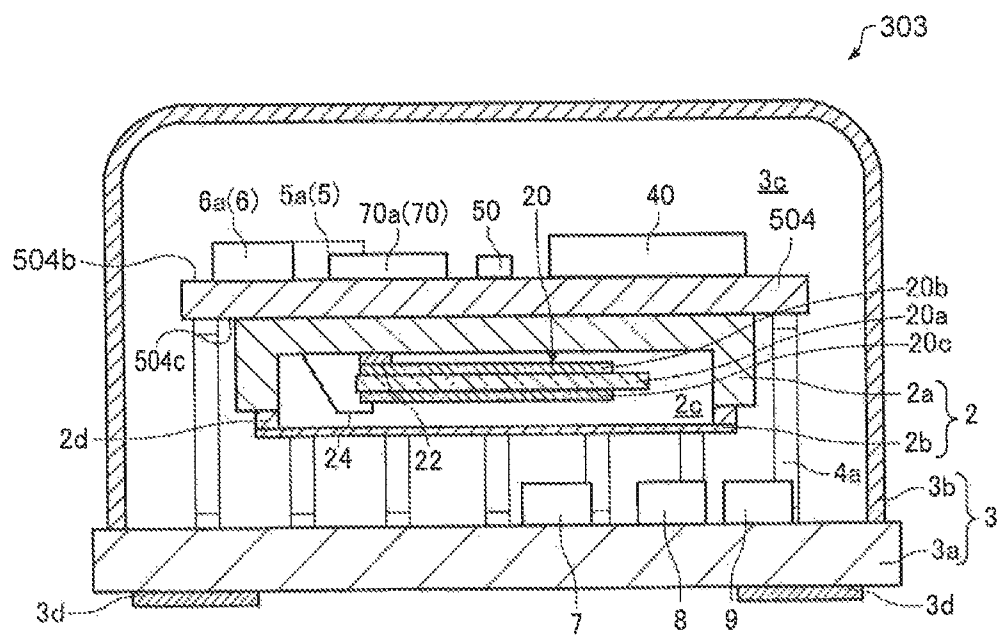
FIG. 54 is a sectional view schematically showing the oscillator according to the sixteenth embodiment.

FIG. 53 is a plan view schematically showing an oscillator according to a sixteenth embodiment. FIG. 54 is a sectional view schematically showing the oscillator according to the sixteenth embodiment and is a XII-XII line sectional view of FIG. 53. Note that a functional block diagram of the oscillator according to the sixteenth embodiment is the same as the functional block diagram of the oscillator according to the fifteenth embodiment shown in FIG. 49. Therefore, the functional block diagram is omitted. In the following explanation, in the oscillator according to the sixteenth embodiment, members having functions same as the functions of the constituent members of the oscillators according to the fourteenth and fifteenth embodiments are denoted by the same reference numerals and signs. Explanation of the members is omitted.

In an oscillator 303 according to the sixteenth embodiment, as shown in FIGS. 49, 53, and 54, the D/A conversion IC 5 including the D/A conversion circuit 80 is configured by the semiconductor element 5*a*. The semiconductor element 5*a* is mounted on the supporting substrate 504 together with the semiconductor element 6*a* (the IC for oscillation 6 including the circuit for oscillation 32) and the semiconductor element 70*a* (the reference-voltage generation circuit 70). The semiconductor element 5*a* is mounted on a principal plane 504*b* of the supporting substrate 504. The semiconductor element 5*a* is joined to the supporting substrate 504 by a joining member (not shown in the figures) such as an adhesive.

An output voltage of the D/A conversion circuit 80 fluctuates because of temperature. However, in the oscillator 303 according to the sixteenth embodiment, since the reference-voltage generation circuit 70 and the D/A conversion circuit 80 (the semiconductor element 5*a*) are mounted on the supporting substrate 504, for example, compared with the reference-voltage generation circuit 70 and the D/A conversion circuit 80 are mounted on the base substrate 3*a*, temperature changes of the reference-voltage generation circuit 70 and the D/A conversion circuit 80 due to a change in an ambient temperature of the oscillator 303 are small. Therefore, with the oscillator 303 according to this embodiment, it is possible to reduce fluctuation in an output voltage of the reference-voltage generation circuit 70 and fluctuation in the output voltage of the D/A conversion circuit 80 due to the change in the ambient temperature. Consequently, it is possible to further improve stability of the frequency of the oscillator 303.

Further, in the oscillator 303 according to the sixteenth embodiment, since the circuit for oscillation 32 (the semiconductor element 6*a*) is mounted on the supporting substrate 504, it is possible to reduce fluctuation in an output voltage of the circuit for oscillation 32 due to the change in the ambient temperature. Consequently, it is possible to further improve stability of the frequency of the oscillator 303.

1-17. Seventeenth Embodiment

Figure 55:
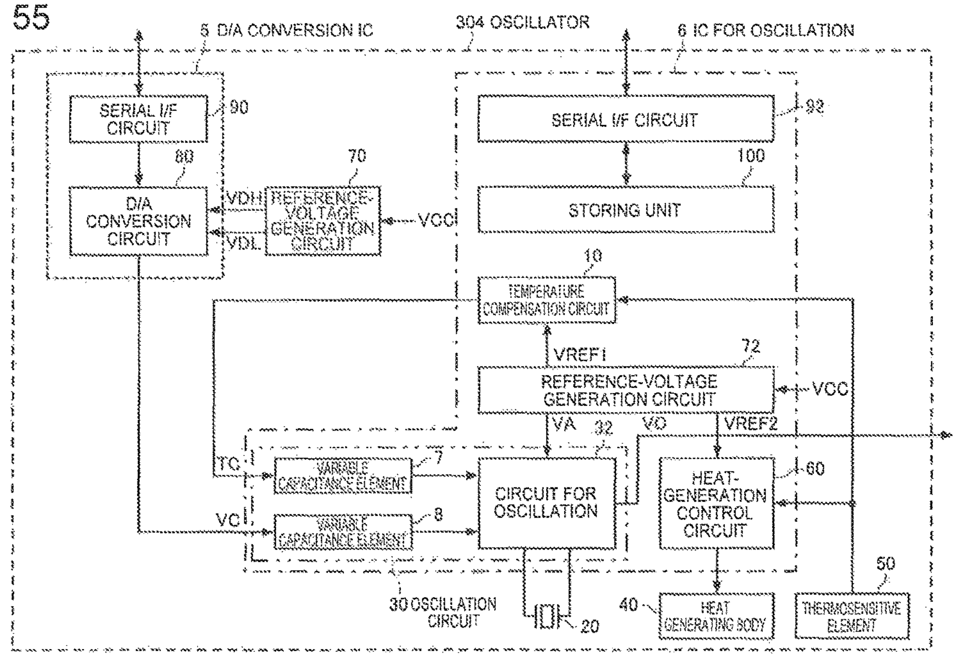
FIG. 55 is a functional block diagram of an oscillator according to a seventeenth embodiment.
Figure 56:
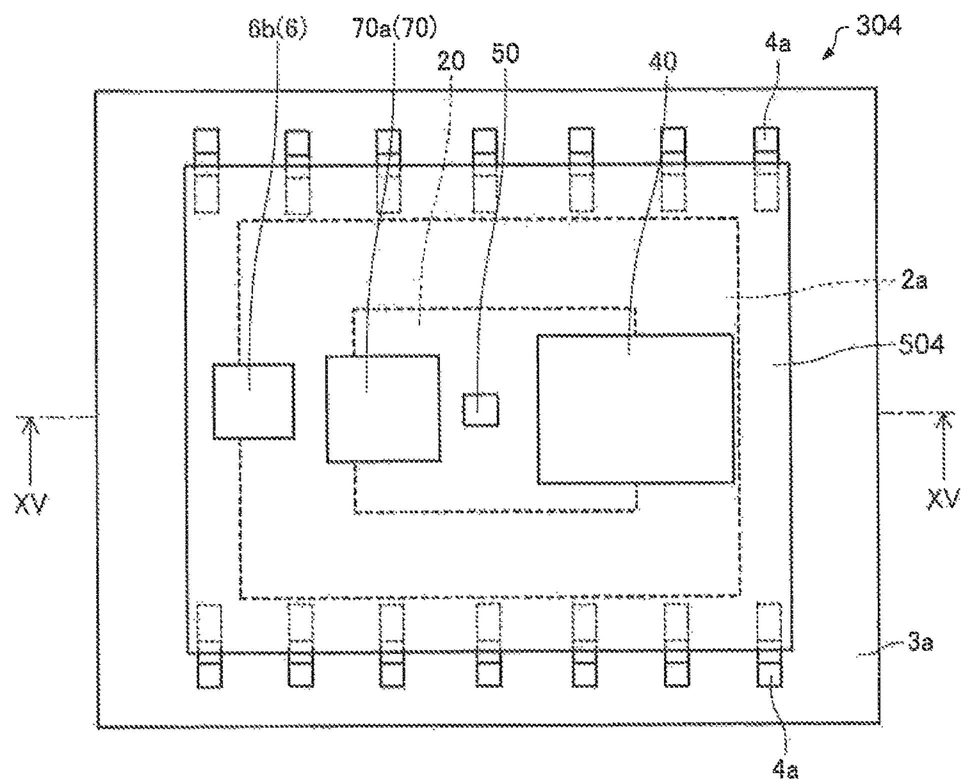
FIG. 56 is a plan view schematically showing the oscillator according to the seventeenth embodiment.
Figure 57:
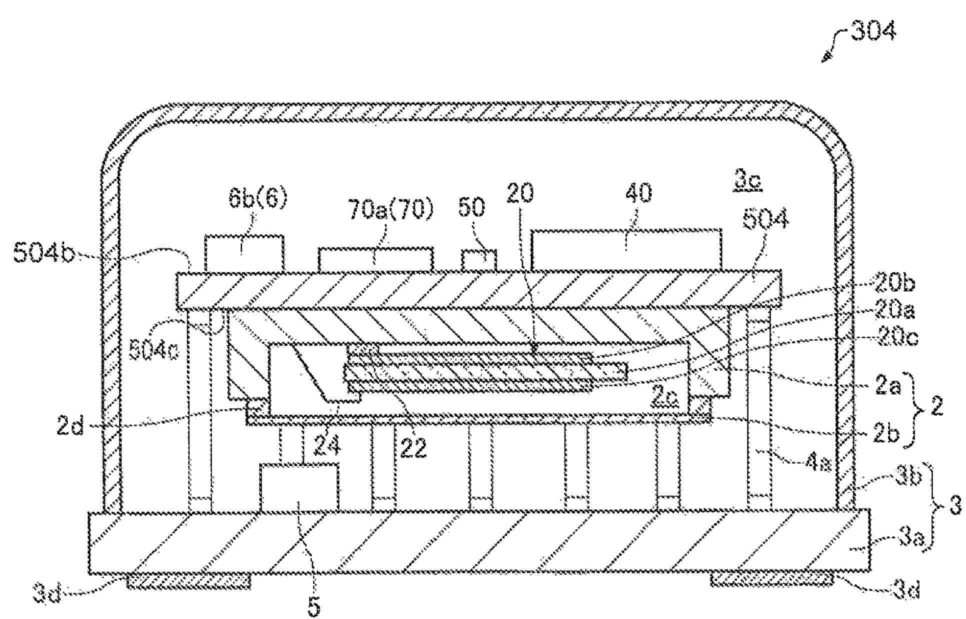
FIG. 57 is a sectional view schematically showing the oscillator according to the seventeenth embodiment.

FIG. 55 is an example of a functional block diagram of an oscillator according to a seventeenth embodiment. FIG. 56 is a plan view schematically showing the oscillator according to the seventeenth embodiment. FIG. 57 is a sectional view schematically showing the oscillator according to the seventeenth embodiment and is a XV-XV line sectional view of FIG. 56. In the following explanation, in the oscillator according to the seventeenth embodiment, members having functions same as the functions of the constituent members of the oscillators according to the fourteenth to sixteenth embodiments are denoted by the same reference numerals and signs. Explanation of the members is omitted.

In an oscillator 304 according to the seventeenth embodiment, as shown in FIG. 55, the IC for oscillation 6 further includes the variable capacitance element 7 and the variable capacitance element 8 in addition to the temperature compensation circuit 10, the circuit for oscillation 32, the heat-generation control circuit 60, the reference-voltage generation circuit 72, the serial interface circuit 92, and the storing unit 100. Although not shown in FIG. 55, the IC for oscillation 6 further includes the electronic components 9. That is, the IC for oscillation 6 further includes the oscillation circuit 30.

The IC for oscillation 6 is configured by the semiconductor element 6*b*. As shown in FIGS. 56 and 57, the semiconductor element 6*b* is mounted on the supporting substrate 504 together with the semiconductor element 70*a* (the reference-voltage generation circuit 70). The semiconductor element 6*b* is mounted on the principal plane 504*b* of the supporting substrate 504.

An output voltage of the oscillation circuit 30 fluctuates because of temperature. However, in the oscillator 304 according to the seventeenth embodiment, since the reference-voltage generation circuit 70 and the oscillation circuit 30 (the semiconductor element 6*b*) are mounted on the supporting substrate 504, for example, compared with when the reference-voltage generation circuit 70 and the oscillation circuit 30 are mounted on the base substrate 3*a*, temperature changes of the reference-voltage generation circuit 70 and the oscillation circuit 30 due to a change in an ambient temperature of the oscillator 304 are small. Therefore, with the oscillator 304 according to this embodiment, it is possible to reduce fluctuation in an output voltage of the reference-voltage generation circuit 70 and fluctuation in the output voltage of the oscillation circuit 30 due to the change in the ambient temperature. Consequently, it is possible to further improve stability of the frequency of the oscillator 304.

1-18. Eighteenth Embodiment

Figure 59:
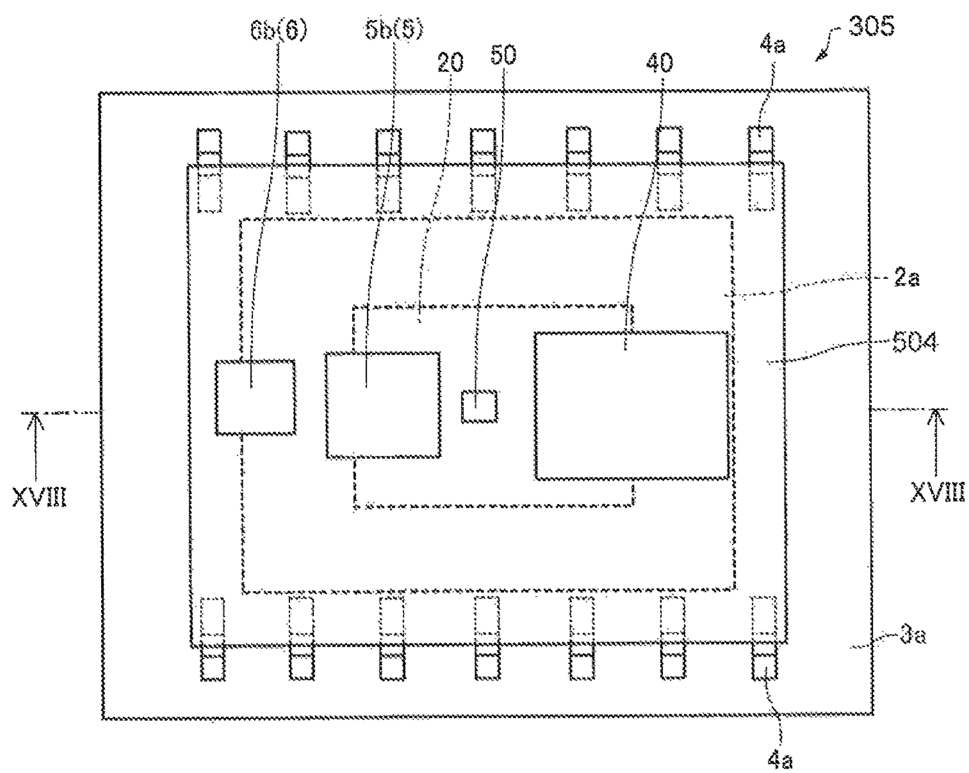
FIG. 59 is a plan view schematically showing the oscillator according to the eighteenth embodiment.
Figure 60:
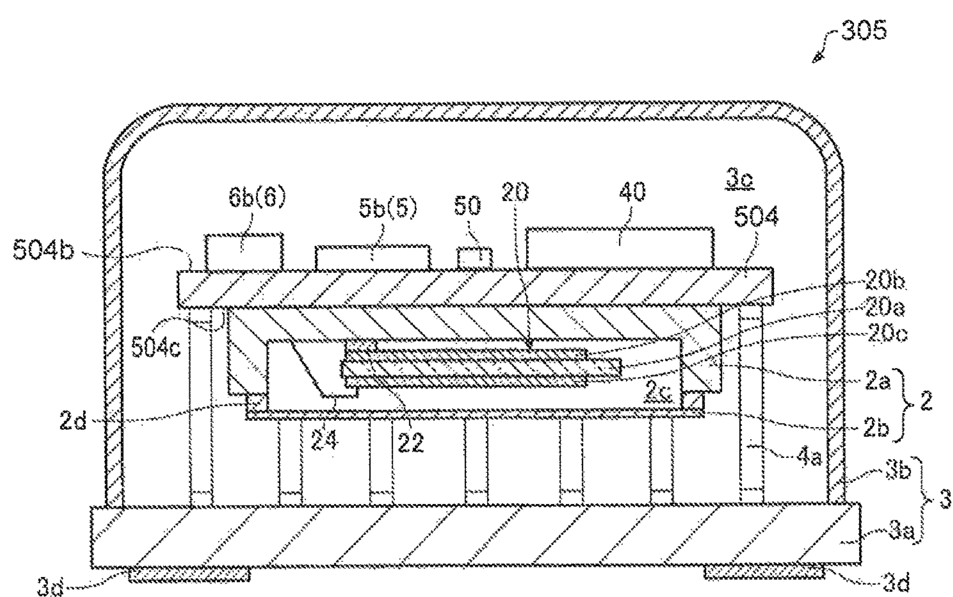
FIG. 60 is a sectional view schematically showing the oscillator according to the eighteenth embodiment.

FIG. 58 is an example of a functional block diagram of an oscillator according to an eighteenth embodiment. FIG. 59 is a plan view schematically showing the oscillator according to the eighteenth embodiment. FIG. 60 is a sectional view schematically showing the oscillator according to the eighteenth embodiment and is a XVIII-XVIII line sectional view of FIG. 59. In the following explanation, in the oscillator according to the eighteenth embodiment, members having functions same as the functions of the constituent members of the oscillators according to the fourteenth to seventeenth embodiments are denoted by the same reference numerals and signs. Explanation of the members is omitted.

In an oscillator 305 according to the eighteenth embodiment, as shown in FIG. 58, the D/A conversion IC 5 includes the reference-voltage generation circuit 70, the D/A conversion circuit 80, and the serial interface circuit 90. The D/A conversion IC 5 is configured by the semiconductor element 5*b*. As shown in FIGS. 59 and 60, the semiconductor element 5*b* is mounted on the supporting substrate 504. That is, the reference-voltage generation circuit 70 and the D/A conversion circuit 80 are configured by one semiconductor element 5*b* and mounted on the supporting substrate 504. In an example shown in the figures, the semiconductor element 5*b* is mounted on the supporting substrate 504 together with the semiconductor element 6*b* (the IC for oscillation 6).

In the oscillator 305 according to the eighteenth embodiment, since the D/A conversion IC 5 (the semiconductor element 5*b*) including the reference-voltage generation circuit 70 and the IC for oscillation 6 (the semiconductor element 6*b*) are mounted on the supporting substrate 504, for example, compared with when the members are mounted on the base substrate 3*a*, it is possible to reduce fluctuation in an output voltage of the D/A conversion IC 5 and fluctuation in an output voltage of the IC for oscillation 6 due to a change in an ambient temperature. Therefore, with the oscillator 305 according to this embodiment, it is possible to further improve stability of the frequency of the oscillator 305.

In the oscillator 305 according to the eighteenth embodiment, the D/A conversion circuit 80 and the reference-voltage generation circuit 70 are configured by one semiconductor element 5*b*. Therefore, the oscillator 305 according to the eighteenth embodiment is advantageous for a reduction in manufacturing costs and a reduction in size.

1-19. Nineteenth Embodiment

Figure 61:
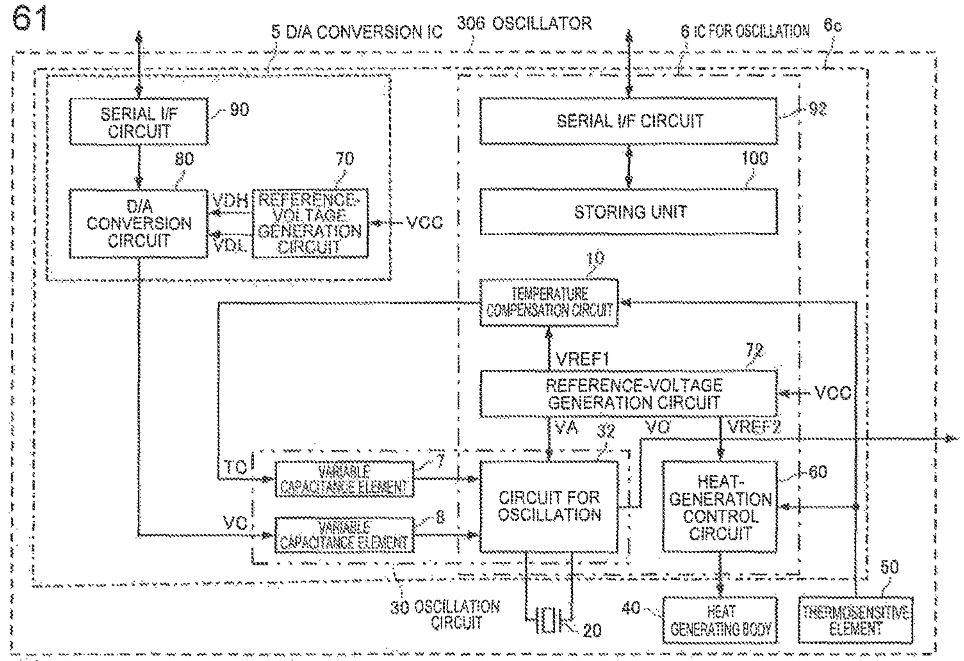
FIG. 61 is a functional block diagram of an oscillator according to a nineteenth embodiment.
Figure 62:
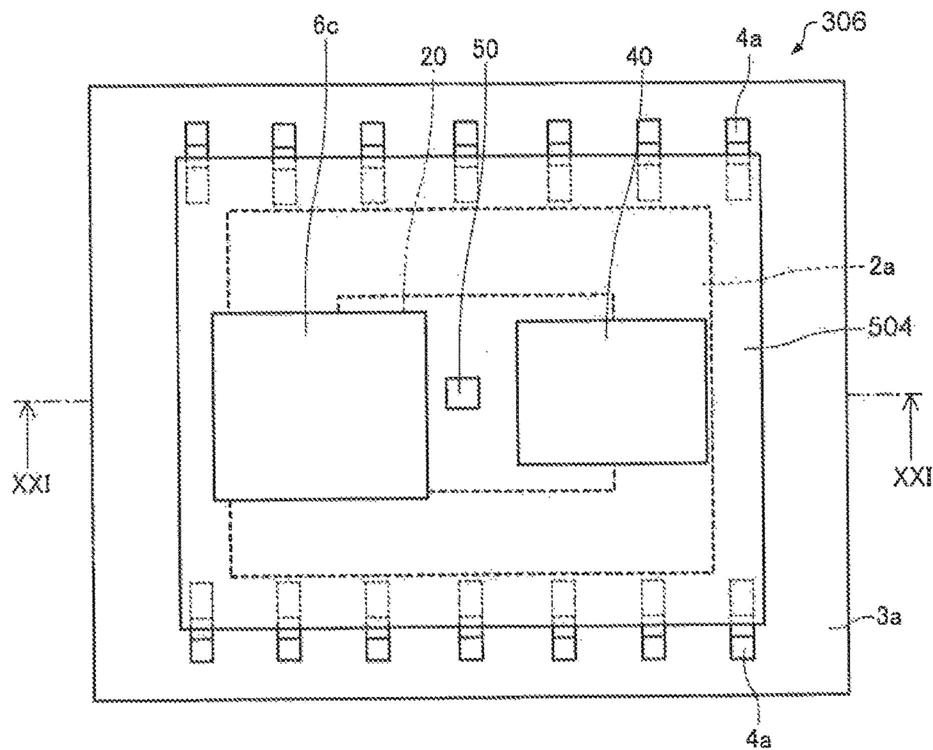
FIG. 62 is a plan view schematically showing the oscillator according to the nineteenth embodiment.
Figure 63:
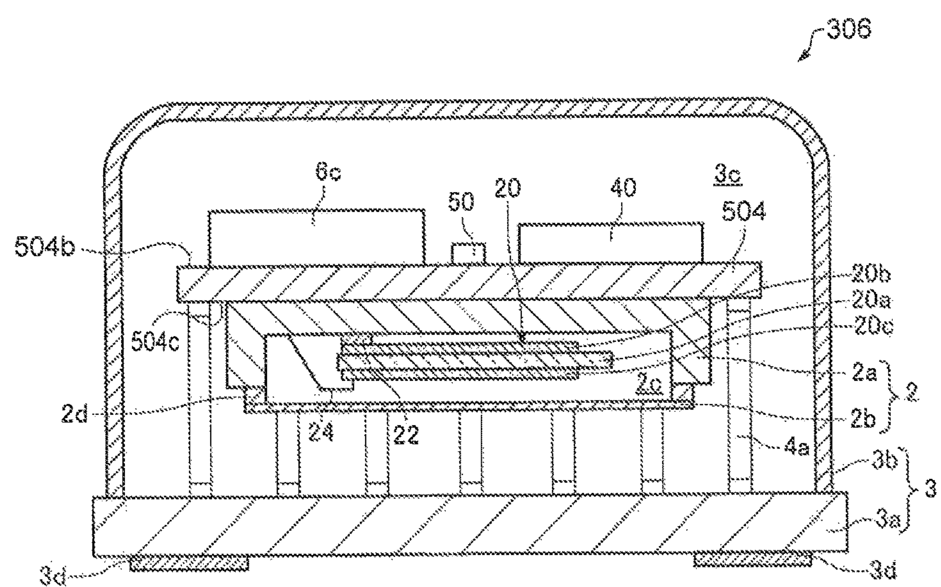
FIG. 63 is a sectional view schematically showing the oscillator according to the nineteenth embodiment.

FIG. 61 is an example of a functional block diagram of an oscillator according to a nineteenth embodiment. FIG. 62 is a plan view schematically showing the oscillator according to the nineteenth embodiment. FIG. 63 is a sectional view schematically showing the oscillator according to the nineteenth embodiment and is a XXI-XXI line sectional view of FIG. 62. In the following explanation, in the oscillator according to the nineteenth embodiment, members having functions same as the functions of the constituent members of the oscillators according to the fourteenth to eighteenth embodiments are denoted by the same reference numerals and signs. Explanation of the members is omitted.

In an oscillator 306 according to the nineteenth embodiment, as shown in FIG. 61, the D/A conversion IC 5, the IC for oscillation 6, and the electronic components 7, 8, and 9 are configured by one semiconductor element 6*c*. As shown in FIGS. 62 and 63, the semiconductor element 6*c* is mounted on the supporting substrate 504. The semiconductor element 6*c* is disposed on the principal plane 504*b* of the supporting substrate 504.

In the oscillator 306 according to the nineteenth embodiment, as in the oscillator 305 according to the eighteenth embodiment, it is possible to further improve frequency stability of the oscillator 306. Further, in the oscillator 306 according to the nineteenth embodiment, since the D/A conversion IC 5 and the IC for oscillation 6 are configured by one semiconductor element 6*c*, the oscillator 306 according to the nineteenth embodiment is advantageous for a reduction in manufacturing costs and a reduction in size.

1-20. Twentieth Embodiment

Figure 64:
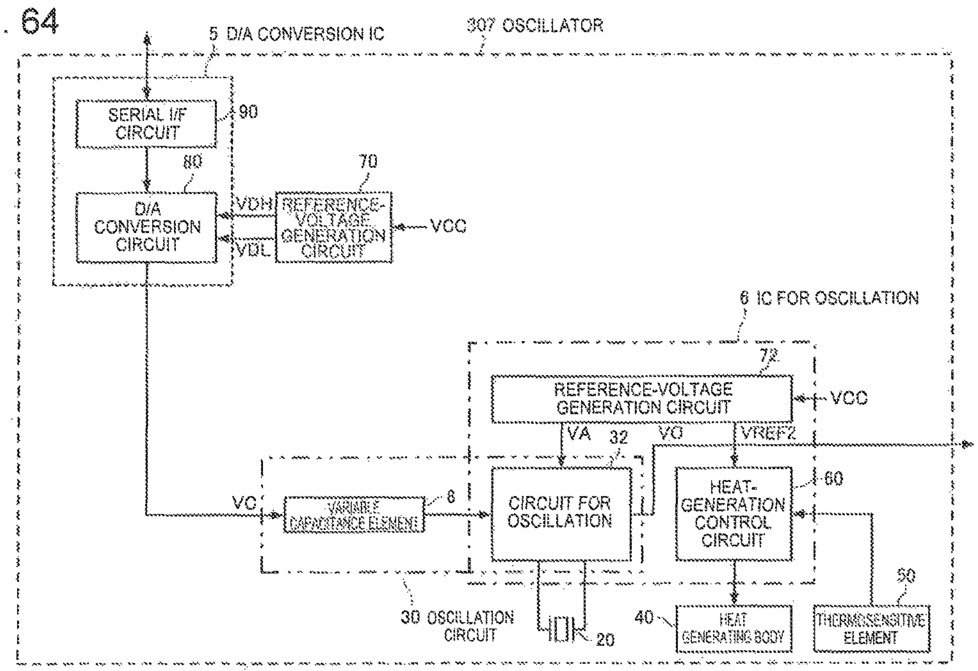
FIG. 64 is a functional block diagram of an oscillator according to a twentieth embodiment.

FIG. 64 is an example of a functional block diagram of an oscillator 307 according to a twentieth embodiment. Note that a plan view of the oscillator according to the twentieth embodiment is the same as FIG. 44 and a sectional view of the oscillator is the same as FIG. 45. Therefore, the plan view and the sectional view are omitted. In the oscillator according to the twentieth embodiment, members having functions same as the functions of the constituent members of the oscillators according to the fourteenth to nineteenth embodiments are denoted by the same reference numerals and signs. Explanation of the members is omitted.

An oscillator 307 according to the twentieth embodiment is different from the oscillator 301 according to the fourteenth embodiment shown in FIG. 43 in that, as shown in FIG. 64, the oscillator 307 does not include the temperature compensation circuit 10, the variable capacitance element 7, the thermosensitive element 13, the serial interface circuit 92, and the storing unit 100. That is, in the oscillator 307 according to this embodiment, correction of a frequency deviation caused by a temperature change of the vibrator element 20 and a temperature change of the ICs due to a change in an ambient temperature is not performed. High frequency stability is realized by controlling, with the heat-generation control circuit 60, the heating element 40 to keep the internal temperature of the first container 2 (the internal temperature of the thermostatic bath) at a desired temperature. Note that this form can also be applied to the oscillators 302 to 306 according to the fifteenth to nineteenth embodiments.

2. Electronic Apparatus

Figure 65:
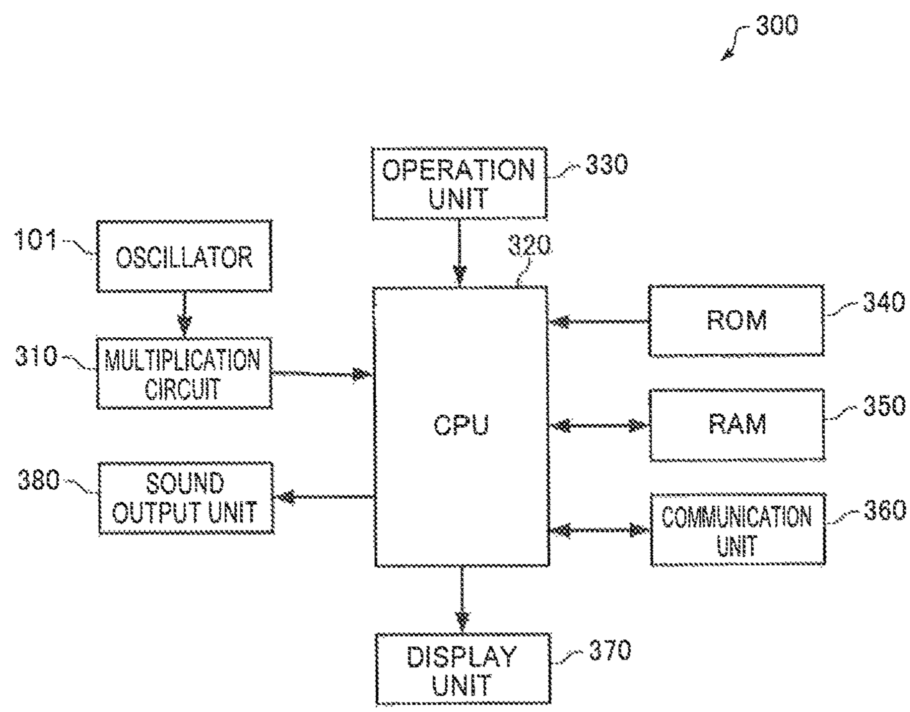
FIG. 65 is a functional block diagram showing an example of the configuration of an electronic apparatus according to an embodiment.

FIG. 65 is a functional block diagram of an electronic apparatus 300 according to this embodiment. Note that components same as the components explained above are denoted by the same reference numerals and signs and detailed explanation of the components is omitted.

An electronic apparatus 300 according to this embodiment is the electronic apparatus 300 including any one of the oscillators explained above (e.g. the oscillator 101). In an example shown in FIG. 65, the electronic apparatus 300 includes the oscillator 101, a multiplication circuit 310, a CPU (Central Processing Unit) 320, an operation unit 330, a ROM (Read Only Memory) 340, a RAM (Random Access Memory) 350, a communication unit 360, a display unit 370, and a sound output unit 380. Note that, in the electronic apparatus 300 according to this embodiment, a part of the components (the units) shown in FIG. 65 may be omitted or changed or other components may be added.

The multiplication circuit 310 supplies a clock pulse to not only the CPU 320 but also the units (the supply of the clock pulse is not shown in the figures). The clock pulse may be, for example, a signal obtained by extracting, with the multiplication circuit 310, a desired harmonic signal from an oscillation signal output from the oscillator 101 or may be, for example, a signal obtained by multiplying the oscillation signal output from the oscillator 101 with the multiplication circuit 310 including a PLL synthesizer (the clock pulse is not shown in the figures).

The CPU 320 performs, according to a computer program stored in the ROM 340 or the like, various kinds of calculation processing and control processing using the clock pulse output by the multiplication circuit 310. Specifically, the CPU 320 performs, for example, various kinds of processing corresponding to operation signals output from the operation unit 330, processing for controlling the communication section 360 in order to perform data communication with the outside, processing for transmitting a display signal for causing the display unit 370 to display various kinds of information, and processing for causing the sound output unit 380 to output various kinds of sound.

The operation unit 330 is an input device configured by operation keys, button switches, and the like. The operation unit 330 outputs an operation signal corresponding to operation by a user to the CPU 320.

The ROM 340 has stored therein computer programs, data, and the like for the CPU 320 to perform the various kinds of calculation processing and control processing.

The RAM 350 is used as a work region of the CPU 320. The RAM 350 temporarily stores, for example, computer programs and data read out from the ROM 340, data input from the operation unit 330, results of arithmetic operations executed by the CPU 320 according to various computer programs.

The communication unit 360 performs various kinds of control for establishing data communication between the CPU 320 and an external apparatus.

The display unit 370 is a display device configured by an LCD (Liquid Crystal Display), an electrophoretic display, and the like. The display unit 370 displays various kinds of information on the basis of the display signals input from the CPU 320.

The sound output unit 380 is a device that outputs sound such as a speaker.

With the electronic apparatus 300 according to this embodiment, since the electronic apparatus 300 includes the oscillator, an oscillation frequency of which is controlled according to digital data, capable of reducing fluctuation in an output voltage of the reference-voltage generation circuit due to a change in an ambient temperature and improving frequency stability, it is possible to realize the electronic apparatus 300 having higher reliability.

Various electronic apparatuses are conceivable as the electronic apparatus 300. Examples of the electronic apparatus 300 include personal computers (e.g., a mobile personal computer, a laptop personal computer, and a tablet personal computer), mobile terminals such as a cellular phone, a digital camera, an inkjet-type discharge apparatus (e.g., an inkjet printer), storage area network devices such as a router and a switch, a local area network device, a device for a mobile terminal base station, a television, a video camera, a video recorder, a car navigation apparatus, a pager, an electronic notebook (including an electronic notebook with a communication function), an electronic dictionary, an electronic calculator, an electronic game machine, a controller for a game, a word processor, a work station, a video phone, a security television monitor, an electronic binocular, a POS (point of sale) terminal, medical apparatuses (e.g., an electronic thermometer, a blood manometer, a blood sugar meter, an electrocardiogram apparatus, an ultrasonic diagnostic apparatus, and an electronic endoscope), a fish finder, various measuring apparatuses, meters (e.g., meters for a vehicle, an airplane, and a ship), a flight simulator, a head mounted display, motion trace, motion tracking, a motion controller, and PDR (pedestrian dead reckoning).

Figure 66:
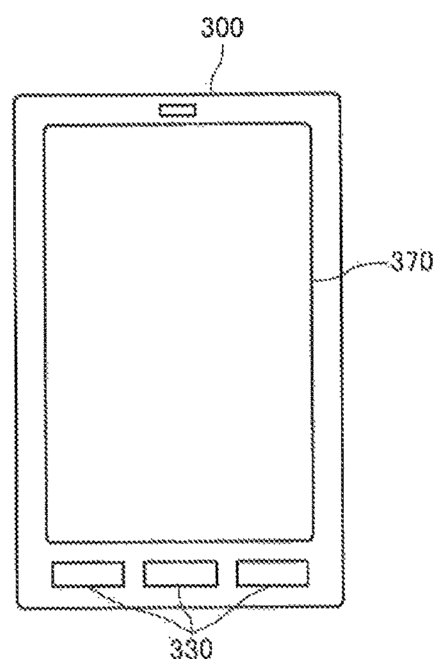
FIG. 66 is a diagram showing an example of the exterior of the electronic apparatus according to the embodiment.

FIG. 66 is a diagram showing an example of the exterior of a smart phone, which is an example of the electronic apparatus 300. The smart phone includes buttons as the operation unit 330 and includes an LCD as the display unit 370. The smart phone, which is an example of the electronic apparatus 300, includes an oscillator (e.g., the oscillator 101). Therefore, it is possible to realize the electronic apparatus 300 having higher reliability.

3. Moving Object

Figure 67:
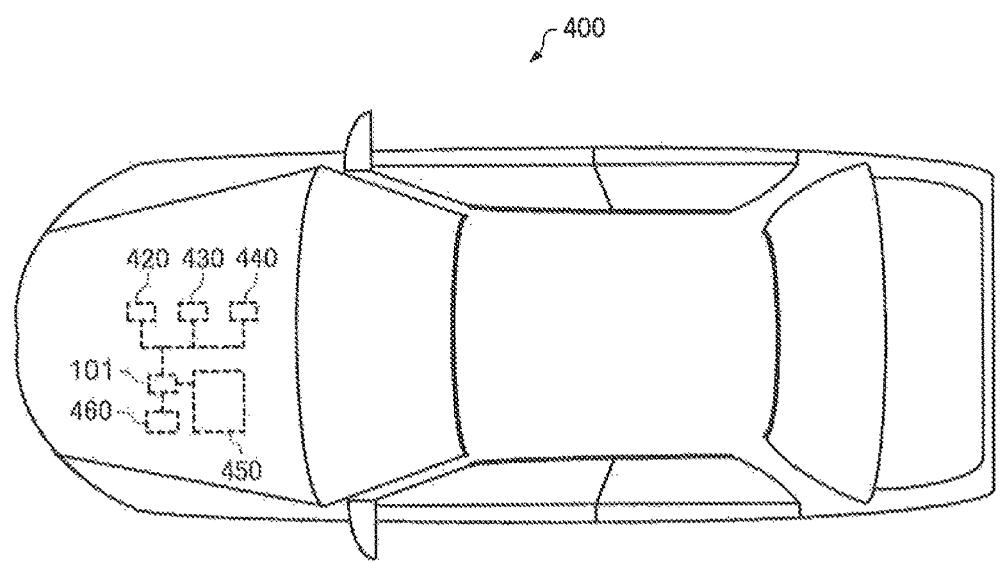
FIG. 67 is a diagram showing an example of a moving object according to an embodiment.

FIG. 67 is a diagram (a top view) showing an example of a moving object 400 according to this embodiment. Note that components same as the components in the embodiments are denoted by the same reference numerals and signs and detailed explanation of the components is omitted.

A moving object 400 according to this embodiment is the moving object 400 including any one of the oscillators (e.g., the oscillator 101). In an example shown in FIG. 67, the moving object 400 includes controllers 420, 430, and 440 for performing various kinds of control for an engine system, a brake system, and a key-less entry system, a battery 450, and a backup battery 460. Note that, in the moving object 400 according to this embodiment, a part of the components (the units) shown in FIG. 67 may be omitted or changed or other components may be added.

With the moving object 400 according to this embodiment, since the moving object 400 includes the oscillator, an oscillation frequency of which is controlled according to digital data, capable of reducing fluctuation in an output voltage of the reference-voltage generation circuit due to a change in an ambient temperature and improving frequency stability, it is possible to realize the moving object 400 having higher reliability.

As the moving object 400, various moving objects are conceivable. Examples of the moving object 400 include an automobile (including an electric vehicle), airplanes such as a jet airplane and a helicopter, a ship, a rocket, and an artificial satellite.

The invention is not limited to the embodiments and various modified implementations are possible without departing from the spirit of the invention.

Modification 1

Figure 68:
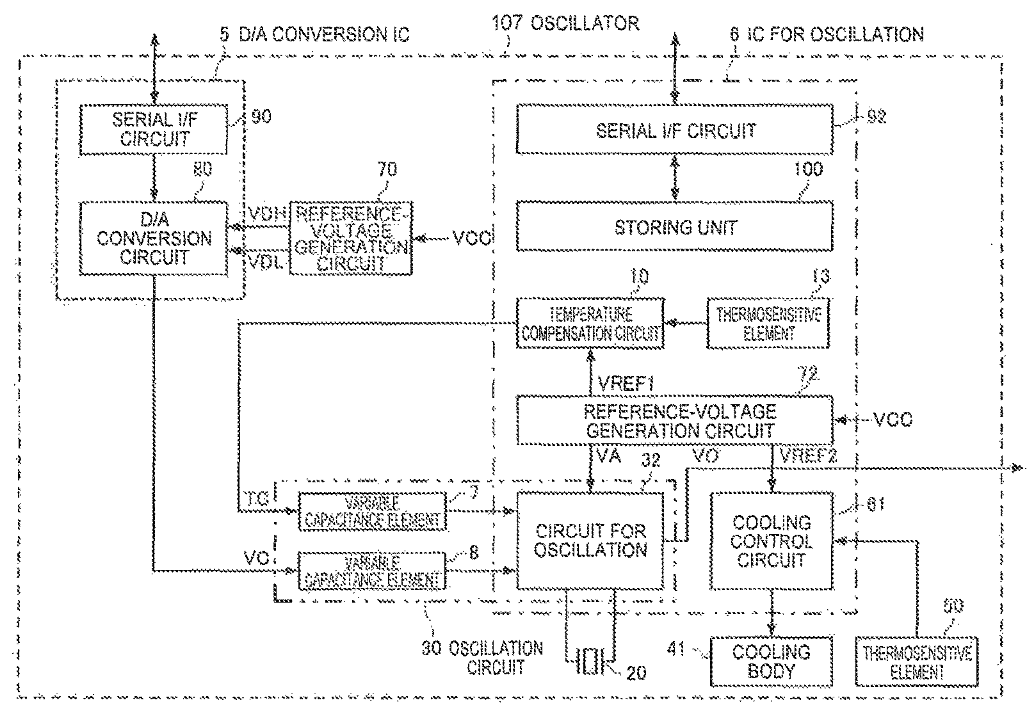
FIG. 68 is a functional block diagram of an oscillator according to a modification 1.
Figure 69:
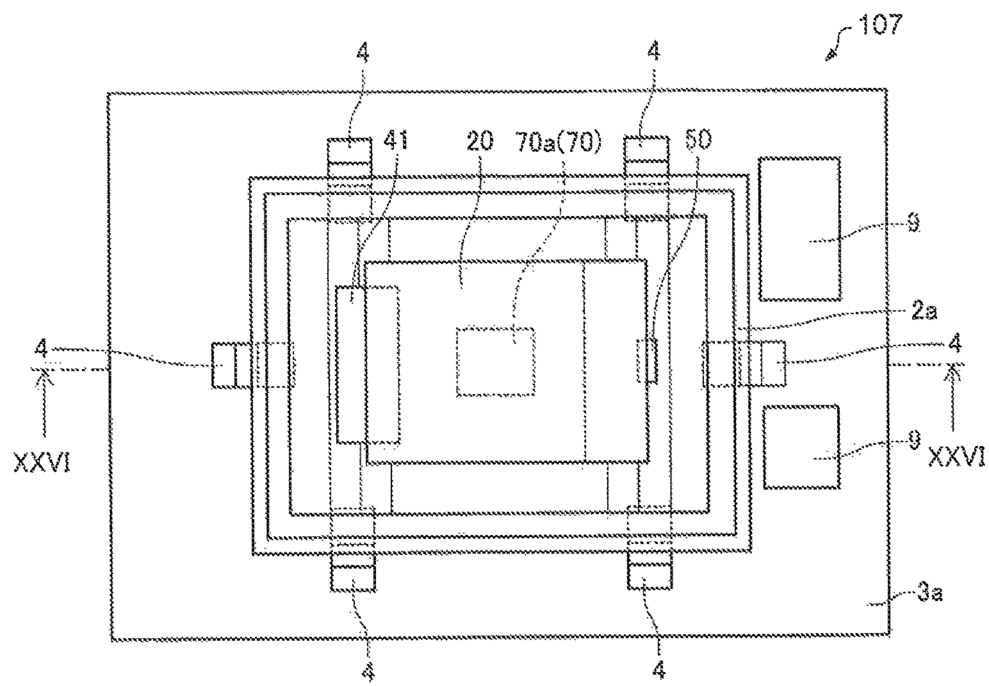
FIG. 69 is a plan view schematically showing the oscillator according to the modification 1.
Figure 70:
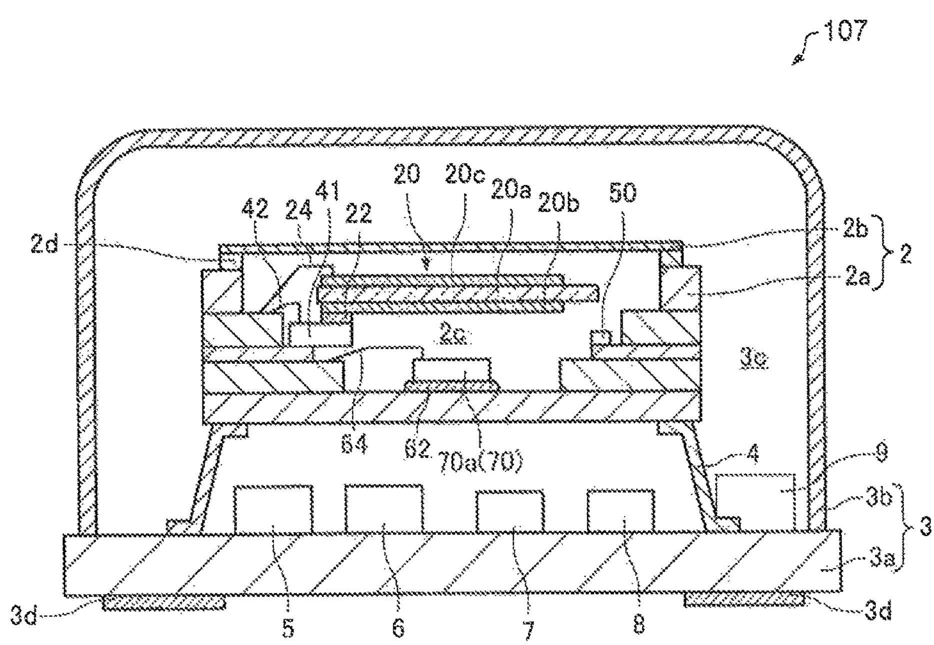
FIG. 70 is a sectional view schematically showing the oscillator according to the modification 1.

For example, in the oscillator 101 according to the first embodiment, for example, as shown in FIGS. 1 to 3, the heating element 40 is housed on the inside of the first container 2. The heating element 40 is controlled by the heat-generation control circuit 60 to keep the temperature on the inside of the first container 2 (the temperature of the vibrator element 20) constant. However, for example, as in an oscillator 107 shown in FIGS. 68 to 70, a cooling body 41 may be housed on the inside of the first container 2. The cooling body 41 may be controlled by a cooling control circuit 61 to keep the temperature on the inside of the first container 2 constant. The cooling body 41 is, for example, a Peltier element.

Note that, although not shown in the figures, both of the heating element 40 and the cooling body 41 may be housed on the inside of the first container 2. The heating element 40 and the cooling body 41 may be controlled by the control circuits 60 and 61 to keep the temperature on the inside of the first container 2 constant. The oscillator 107 in this modification is explained above using the oscillator 101 according to the first embodiment. However, this modification can also be applied to the oscillators 102 to 106 according to the second to sixth embodiments.

Modification 2

Figure 71:
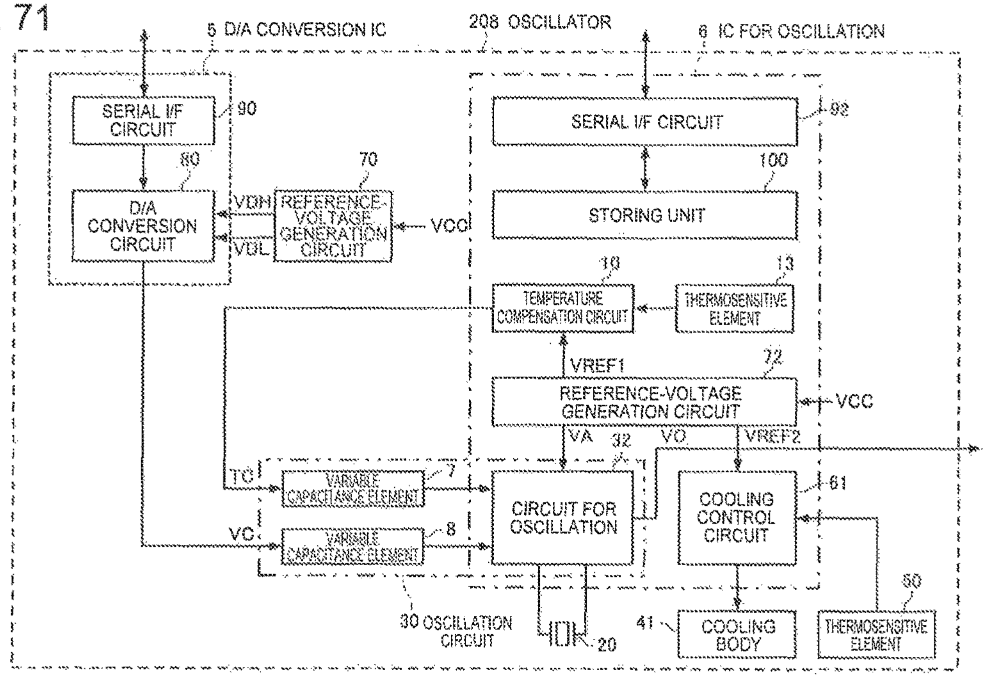
FIG. 71 is a functional block diagram of an oscillator according to a modification 2.
Figure 72:
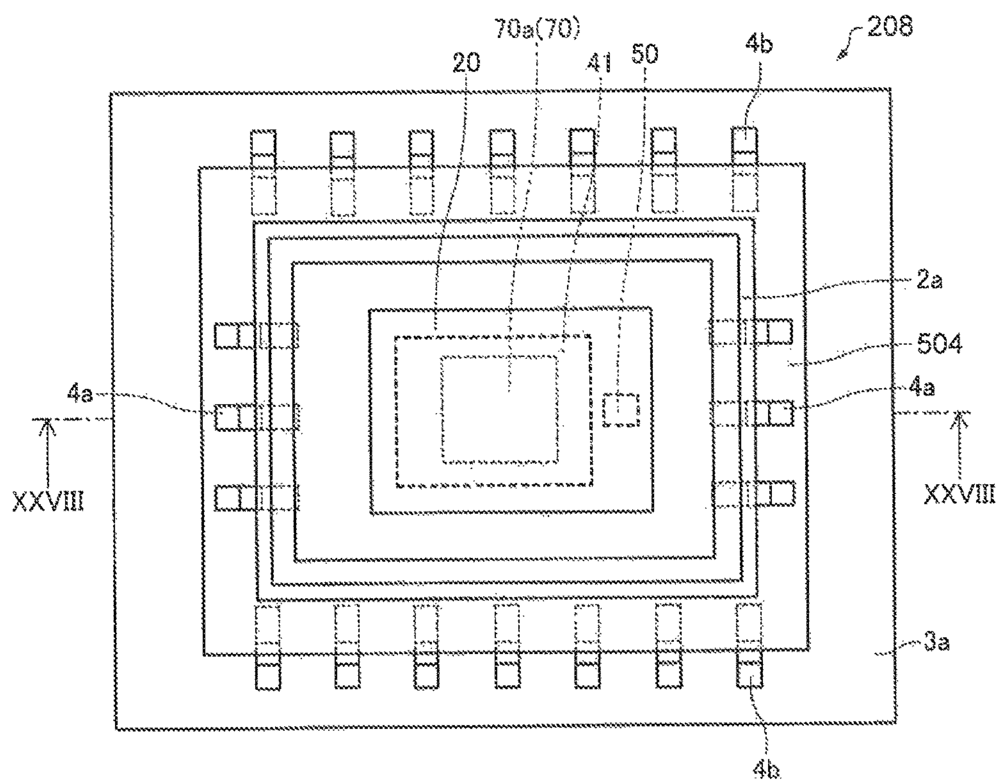
FIG. 72 is a plan view schematically showing the oscillator according to the modification 2.
Figure 73:
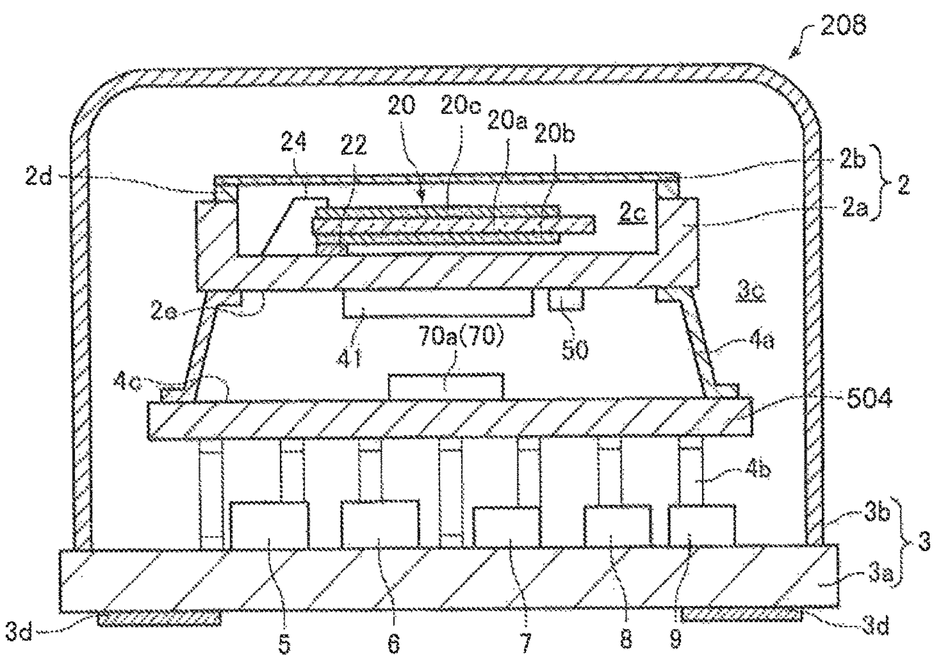
FIG. 73 is a sectional view schematically showing the oscillator according to the modification 2.

Similarly, in the oscillator 201 according to the seventh embodiment, for example as shown in FIGS. 21 to 23, the heating element 40 is disposed on the outer surface **2*e* of the first container 2. The heating element 40 is controlled by the heat-generation control circuit 60 to keep the temperature on the inside of the first container 2 (the temperature of the vibrator element 20) constant. However, for example, as in an oscillator 208 shown in FIGS. 71 to 73, the cooling body 41 may be disposed on the outer surface 2*e* of the first container 2. The cooling body 41 may be controlled by the cooling control circuit 61 to keep the temperature on the inside of the first container 2 constant. That is, the temperature on the inside of the first container 2 may be controlled to be constant by cooling the inside of the first container 2. The cooling body 41** is, for example, a Peltier element.

Note that, although not shown in the figures, both of the heating element 40 and the cooling body 41 may be disposed on the outer surface 2e of the first container 2. The heating element 40 and the cooling body 41 may be controlled by the control circuits 60 and 61 to keep the temperature on the inside of the first container 2 constant. The oscillator 208 in this modification is explained using the oscillator 201 according to the seventh embodiment. However, this modification can also be applied to the oscillators 202 to 207 according to the eighth to thirteenth embodiments.

Modification 3

Figure 74:
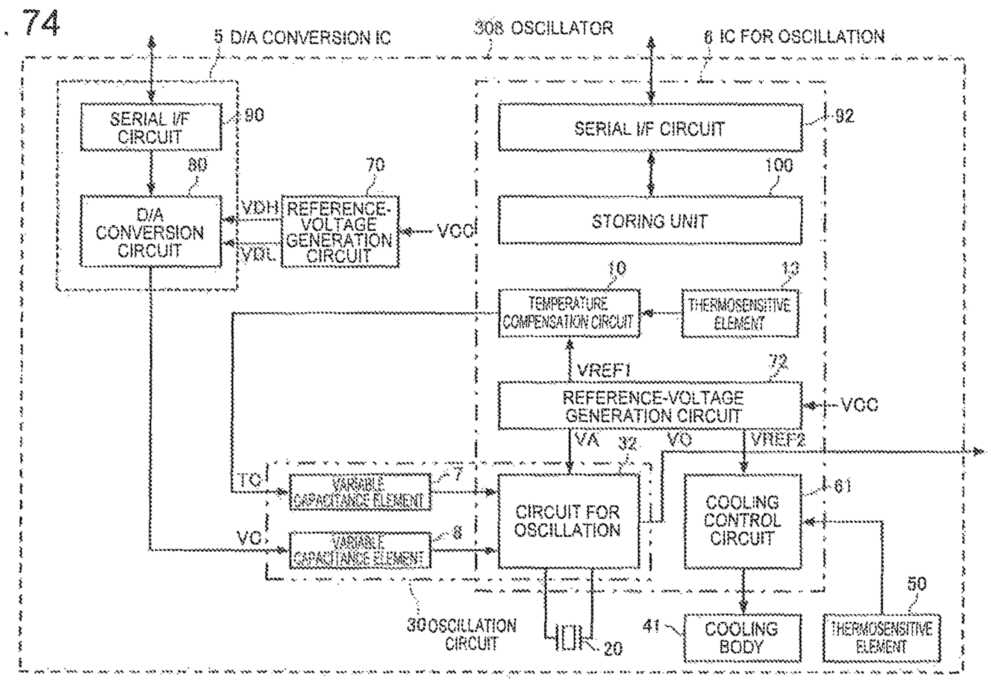
FIG. 74 is a functional block diagram of an oscillator according to a modification 3.
Figure 75:
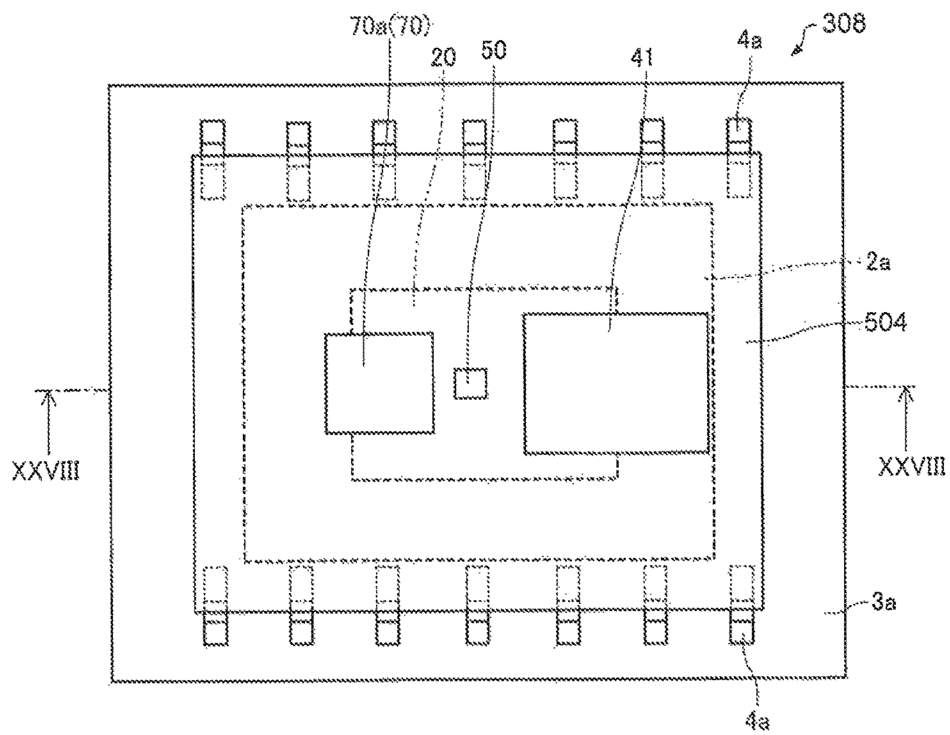
FIG. 75 is a plan view schematically showing the oscillator according to the modification 3.
Figure 76:
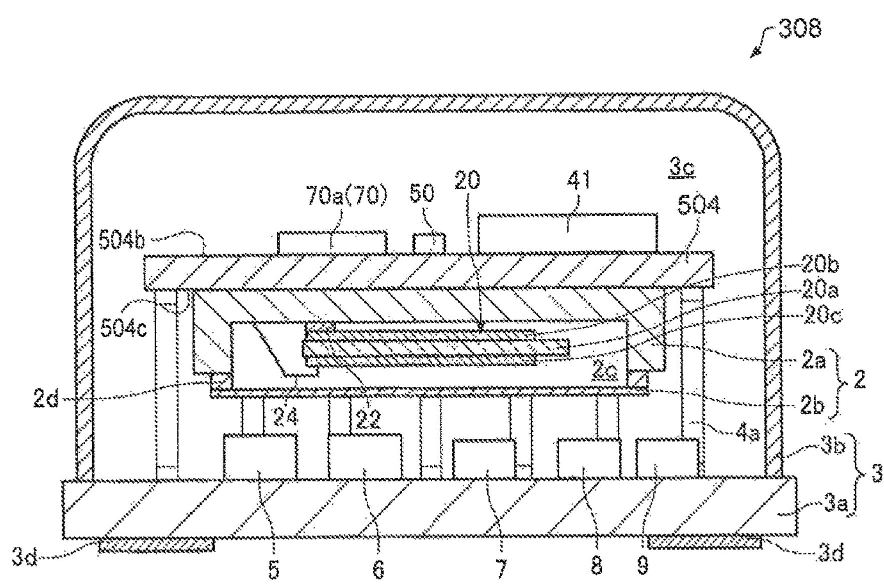
FIG. 76 is a sectional view schematically showing the oscillator according to the modification 3.

Similarly, in the oscillator 301 according to the fourteenth embodiment, for example, as shown in FIGS. 43 to 45, the heating element 40 is mounted on the supporting substrate 504. The heating element 40 is controlled by the heat-generation control circuit 60 to keep the temperature on the inside of the first container 2 (the temperature of the vibrator element 20) constant. However, for example, as shown in FIGS. 74 to 76, the cooling body 41 may be disposed on the supporting substrate 504. The cooling body 41 may be controlled by the cooling control circuit 61 to keep the temperature on the inside of the first container 2 constant. That is, the temperature on the inside of the first container 2 may be controlled to be constant by cooling the inside of the first container 2. The cooling body 41 is, for example, a Peltier element.

Note that, although not shown in the figures, both of the heating element 40 and the cooling body 41 may be mounted on the supporting substrate 504. The heating element 40 and the cooling body 41 may be controlled by the control circuits 60 and 61 to keep the temperature on the inside of the first container 2 constant. An oscillator 308 in this modification is explained using the oscillator 301 according to the fourteenth embodiment. However, this modification can also be applied to the oscillators 302 to 307 according to the fifteenth to twentieth embodiments.

The embodiments explained above are examples and are not limited to the examples. For example, it is also possible to combine the embodiments as appropriate.

The invention includes components substantially the same as the components explained in the embodiments (e.g., components having the same functions, methods, and results or components having the same purposes and effects). The invention includes components in which non-essential portions of the components explained in the embodiments are replaced. The invention includes components that can realize action and effects or achieve objects same as those of the components explained in the embodiments. The invention includes components in which publicly-known techniques are added to the components explained in the embodiments.

The entire disclosure of Japanese Patent Application No. 2015-066968, 2015-067451, and 2015-067452, filed Mar. 27, 2015 is expressly incorporated by reference herein.

What is claimed is:

1. An oscillator comprising:
a vibrator element;
a container in which the vibrator element is housed;
a base substrate on which the container is mounted via one or more supporting bodies;
at least one of a heating element and a cooling body configured to control temperature on an inside of the container;
an oscillation circuit electrically connected to the vibrator element;
a D/A conversion circuit configured to control a frequency output by the oscillation circuit;
a first reference-voltage generation circuit configured to supply voltage to the D/A conversion circuit; and
a second reference-voltage generation circuit configured to generate, on the basis of a power supply voltage supplied from outside of the oscillator, a power supply voltage of the oscillation circuit, wherein
temperature of the first reference-voltage generation circuit is controlled by the at least one of the heating element and the cooling body, and
the container is elevated and separated from the base substrate by being supported by the one or more supporting bodies.

2. The oscillator according to claim 1, wherein the first reference-voltage generation circuit is housed on the inside of the container.

3. The oscillator according to claim 1, wherein
the base substrate is a first substrate on which the container is mounted via a first supporting body,
the oscillator further comprises: a second substrate on which the first substrate is mounted via a second supporting body, and
the first reference-voltage generation circuit is mounted on the first substrate.

4. The oscillator according to claim 1, wherein
the base substrate is a first substrate on which the container is mounted via a first supporting body,
the oscillator further comprises: a second substrate on which the first substrate is mounted via a second supporting body,
the at least one of the heating element and the cooling body is disposed on the first substrate, and
the first reference-voltage generation circuit is mounted on the first substrate.

5. The oscillator according to claim 3, wherein the at least one of the heating element and the cooling body is disposed on an outer surface of the container opposed to the first substrate.

6. The oscillator according to claim 1, wherein
the at least one of the heating element and the cooling body is the heating element, and
the heating element is a heater.

7. The oscillator according to claim 1, wherein
the at least one of the heating element and the cooling body is the cooling body, and
the cooling body is a Peltier element.

8. The oscillator according to claim 2, wherein
the oscillation circuit includes:
a circuit for oscillation configured by a semiconductor element; and
an electronic component, and
the semiconductor element is housed on the inside of the container.

9. The oscillator according to claim 3, wherein
the oscillation circuit includes:
a circuit for oscillation configured by a semiconductor element; and
an electronic component, and
the semiconductor element is mounted on the first substrate.

10. The oscillator according to claim 4, wherein
the oscillation circuit includes:
a circuit for oscillation configured by a semiconductor element; and
an electronic component, and the semiconductor element is mounted on the first substrate.

11. The oscillator according to claim 1, wherein the oscillation circuit is configured by a semiconductor element, and the semiconductor element is housed on the inside of the container.

12. The oscillator according to claim 2, further comprising a thermosensitive element configured to detect the temperature on the inside of the container.

13. The oscillator according to claim 3, further comprising a thermosensitive element disposed on an outer surface of the container.

14. The oscillator according to claim 4, further comprising a thermosensitive element disposed on the first substrate.

15. The oscillator according to claim 2, wherein the D/A conversion circuit is housed on the inside of the container.

16. The oscillator according to claim 3, wherein the D/A conversion circuit is mounted on the first substrate.

17. The oscillator according to claim 4, wherein the D/A conversion circuit is mounted on the first substrate.

18. The oscillator according to claim 17, wherein the first reference-voltage generation circuit and the D/A conversion circuit are included in one semiconductor element.

19. An electronic apparatus comprising the oscillator according to claim 1.

20. A moving object comprising the oscillator according to claim 1.

* * * * *